US007573407B2

(12) United States Patent
Reznik

(10) Patent No.: US 7,573,407 B2
(45) Date of Patent: Aug. 11, 2009

(54) MEMORY EFFICIENT ADAPTIVE BLOCK CODING

(75) Inventor: Yuriy Reznik, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 49 days.

(21) Appl. No.: 11/840,406

(22) Filed: Aug. 17, 2007

(65) Prior Publication Data
US 2008/0111722 A1  May 15, 2008

Related U.S. Application Data

(60) Provisional application No. 60/867,081, filed on Nov. 22, 2006, provisional application No. 60/865,827, filed on Nov. 14, 2006.

(51) Int. Cl.
*H03M 7/40* (2006.01)
(52) U.S. Cl. .......................................... 341/67; 341/50
(58) Field of Classification Search .................. 341/67, 341/51, 50; 382/224, 231, 232, 233, 234, 382/235, 238, 239, 240, 245; 709/247
See application file for complete search history.

(56) References Cited

U.S. PATENT DOCUMENTS

| 5,696,507 | A |   | 12/1997 | Nam |   |
|---|---|---|---|---|---|
| 5,907,637 | A | * | 5/1999 | Murashita et al. | ........... 382/239 |
| 6,188,797 | B1 |   | 2/2001 | Moledina et al. |   |

OTHER PUBLICATIONS

International Search Report—PCT/US2007/084682—International Search Authonty, European Patent Office, May 20, 2008.

Hashemian, R Ed—Institute of Electrical and Electronics Engineers: "Condensed Huffman Coding, A New Efficient Decoding Technique" The 2002 45th Midvvest Symposium on Circuits and Systems. Conference Proceedings, Tulsa, OK, Aug. 4-7, 2002, Midwest Symposium on Circuits and Systems, New York, NY; IEEE, US, vol. vol. 1 of 3, Aug. 4, 2002, pp. 228-231, XP010635192, ISBN: 0-7803-7523-8.

Moffat, Alistair, et al.: "On the Implementation of Minimum Redundancy Prefix Codes" IEEE Transactions on Communications, IEEE Service Center, Piscataway, NJ, US, vol. 45, No. 10, Oct. 1997, XP011009043 ISSN: 0090-6778.

Moffat, A. & Liddell, M: "Decoding Prefix Codes" Software: Practice and Experience vol. 36, No. 15, Jun. 13, 2006, pp. 1687-1710, XP002476920.

Ryabko B, et al.: "Fast Codes for Large Alphabet Sources and its Application to Block Encoding" Proceedings 2003 IEEE International Symposium on Information Theory. ISIT 03, Yokohama, Japan, Jun. 29-Jul. 4, 2003 IEEE International Symposium on Imformati.

Ryabko B, et al.: "The Fast Algorithm for the Block Codes and its Application to Image Compression" Proceedings 2003 International Conferences on Image Processing. ICIP-2003, International Conference on Image Processing, new York, NY, IEEE, US, vol. VOL.

(Continued)

*Primary Examiner*—Rexford Barnie
*Assistant Examiner*—Joseph Lauture

(57) ABSTRACT

In general, this disclosure is directed to techniques for memory efficient and low complexity adaptive variable length coding (VLC) of data for a variety of applications, such as coding of digital video, image, audio, or speech data. In some aspects, the techniques may exploit properties of particular sets of codewords to support very compact data structures. In other aspects, the techniques may support low-complexity, adaptive encoding and decoding of binary sequences produced by memoryless sources.

82 Claims, 15 Drawing Sheets

OTHER PUBLICATIONS

Seong Hwan Cho, et al.: A Low Power variable Length Decoder for MPEG-2 Based on Nonuniform Fine-Grain Table Partitioning: IEEE Transactions on Very Large Scale Integrations (VLSI) Systems, IEEE Service Center, Piscataway, NJ, US, vol. 7, No. 2, Jun. 1999.

Wiegand, Thomas, et al., Joint Draft 6: Scalabale Video Coding,: JVT-S 201, Joint Video Team (JVT) of ISO/IEC MPEG and ITU-T VCEG, Apr. 2006, Geneva.

Wiegand, Thomas, et al., "Joint Draft 9 of SVC Amendment," JVT-V 201, Joint Video Team (JVT) of IS0/IEC MPEG and ITU-T VCEG, Jan. 2007, Marrakech.

\* cited by examiner

MEMORY EFFICIENT ADAPTIVE BLOCK CODING

This application claims the benefit of U.S. Provisional Application No. 60/865,827, filed Nov. 14, 2006, and U.S. Provisional Application No. 60/867,081, filed Nov. 22, 2006, the entire content of each of which is incorporated herein by reference.

This application relates to copending, commonly assigned U.S. patent application No. 11/840,362, filed Aug. 17, 2007, by Yuriy A. Reznik.

TECHNICAL FIELD

This disclosure relates to data compression and, more particularly, data compression using variable length codes (VLCs).

BACKGROUND

Data compression is widely used in a variety of applications to reduce consumption of data storage space, transmission bandwidth, or both. Example applications of data compression include digital video, image, speech, and audio coding. Digital video coding, for example, is used in wide range of devices, including digital televisions, digital direct broadcast systems, wireless communication devices, personal digital assistants (PDAs), laptop or desktop computers, digital cameras, digital recording devices, video gaming devices, cellular or satellite radio telephones, or the like. Digital video devices implement video compression techniques, such as MPEG-2, MPEG-4, or H.264/MPEG-4 Advanced Video Coding (AVC), to transmit and receive digital video more efficiently.

In general, video compression techniques perform spatial prediction, motion estimation and motion compensation to reduce or remove redundancy inherent in video data. In particular, intra-coding relies on spatial prediction to reduce or remove spatial redundancy in video within a given video frame. Inter-coding relies on temporal prediction to reduce or remove temporal redundancy in video within adjacent frames. For inter-coding, a video encoder performs motion estimation to track the movement of matching video blocks between two or more adjacent frames. Motion estimation generates motion vectors, which indicate the displacement of video blocks relative to corresponding video blocks in one or more reference frames. Motion compensation uses the motion vector to generate a prediction video block from a reference frame. After motion compensation, a residual video block is formed by subtracting the prediction video block from the original video block.

A video encoder applies transform, quantization and entropy coding processes to further reduce the bit rate of the residual block produced by the video coding process. Entropy encoding techniques are used in the final stages of a video encoder-decoder (CODEC), and in various other coding applications, prior to storage or transmission of the encoded data. Entropy encoding generally involves the application of arithmetic codes or variable length codes (VLCs) to further compress residual coefficients produced by the transform and quantization operations. Examples of entropy coding techniques include context-adaptive binary arithmetic coding (CABAC) and context-adaptive variable length coding (CAVLC), which may be used as alternative entropy coding modes in some encoders. A video decoder performs entropy decoding to decompress residual information for each of the blocks, and reconstructs the encoded video using motion information and the residual information

SUMMARY

In general, this disclosure is directed to techniques for memory efficient and low complexity adaptive variable length coding (VLC) of data for a variety of applications, such as coding of digital video, image, audio, or speech data. In a first general aspect, the techniques may exploit properties of particular sets of codewords to support very compact data structures. In a second general aspect, the techniques may support low-complexity, adaptive encoding and decoding of binary sequences produced by memoryless sources.

The disclosure provides, in a first aspect, a method comprising generating partial values of base codewords for levels of a coding tree specifying variable length codewords, generating a skip indicator instructing a decoder to skip a number of bits in a bitstream to be decoded before proceeding to a selected level of the coding tree, and storing the partial values and the skip indicator in a data structure in a memory.

In another aspect, the disclosure provides a tangible computer-readable medium comprising a data structure storing partial values of base codewords for levels of a coding tree specifying variable length codewords, and a skip indicator instructing a decoder to skip a number of bits in a bitstream to be decoded before proceeding to a selected level of the coding tree.

In an additional aspect, the disclosure provides a device comprising a processor configured to generate partial values of base codewords for levels of a coding tree specifying variable length codewords, and generate a skip indicator instructing a decoder to skip a number of bits in a bitstream to be decoded before proceeding to a selected level of the coding tree, and a memory that stores the partial values and the skip indicator in a data structure.

In another aspect, the disclosure provides a decoding device comprising a memory storing a data structure comprising partial values of base codewords for levels of a coding tree specifying variable length codewords, and a skip indicator instructing a decoder to skip a number of bits in a bitstream to be decoded before proceeding to a selected level of the coding tree, and a decoder that access the memory to decode one of the codewords from the bitstream based on the partial values and the skip indicator in the stored data structure.

In a further aspect, the disclosure provides a decoding method comprising accessing a data structure stored in memory, wherein the data structure comprises partial values of base codewords for levels of a coding tree specifying variable length codewords, and a skip indicator instructing a decoder to skip a number of bits in a bitstream to be decoded before proceeding to a selected level of the coding tree, and decoding one of the codewords from the bitstream based on the partial values and the skip indicator in the stored data structure.

In another aspect, the disclosure provides a tangible computer-readable medium comprising instructions to cause a processor to access a data structure stored in memory, wherein the data structure comprises partial values of base codewords for levels of a coding tree specifying variable length codewords, and a skip indicator instructing a decoder to skip a number of bits in a bitstream to be decoded before proceeding to a selected level of the coding tree, and decode one of the codewords from the bitstream based on the partial values and the skip indicator in the stored data structure.

In an additional aspect, the disclosure provides a method comprising performing variable length coding according to a code structure, wherein the code structure defines groups of codewords in a coding tree, each of the groups includes codewords representing values having same weights and the codewords in each of the groups are ordered lexicographically with respect to the values represented by the codewords, and first and second subgroups of codewords within each of the groups, wherein the first subgroup includes codewords having a first length and the second subgroup includes codewords having a second length different form the first length, and generating a result of the variable length coding for at least one of storage in memory, transmission to a device, or presentation to a user.

In an additional aspect, the disclosure provides a tangible computer-readable medium comprising instructions to cause a processor to perform variable length coding according to a code structure, wherein the code structure defines groups of codewords in a coding tree, each of the groups includes codewords representing values having same weights and the codewords in each of the groups are ordered lexicographically with respect to the values represented by the codewords, and first and second subgroups of codewords within each of the groups, wherein the first subgroup includes codewords having a first length and the second subgroup includes codewords having a second length different form the first length, and generate a result of the variable length coding for at least one of storage in memory, transmission to a device, or presentation to a user.

In an additional aspect, the disclosure provides a device comprising a processor configured to perform variable length coding according to a code structure, wherein the code structure defines groups of codewords in a coding tree, each of the groups includes codewords representing values having same weights and the codewords in each of the groups are ordered lexicographically with respect to the values represented by the codewords, and first and second subgroups of codewords within each of the groups, wherein the first subgroup includes codewords having a first length and the second subgroup includes codewords having a second length different form the first length, and generate a result of the variable length coding for at least one of storage in memory, transmission to a device, or presentation to a user.

In an additional aspect, the disclosure provides a method comprising, for a code structure defining groups of codewords in a coding tree specifying variable length codewords, wherein each of the groups includes codewords representing values having same weights and the codewords in each of the groups are ordered lexicographically with respect to the values represented by the codewords, first and second subgroups of codewords within each of the groups, wherein the first subgroup includes codewords having a first length and the second subgroup includes codewords having a second length different form the first length, performing variable length coding using base codewords for each of the subgroups, positions of codewords within each of the groups, a number of codewords within each of the first subgroups, and lengths of the codewords within each of the subgroups, and generating a result of the variable length coding for at least one of storage in memory, transmission to a device, or presentation to a user.

In an additional aspect, the disclosure provides a device comprising, for a code structure, means for defining groups of codewords in a coding tree specifying variable length codewords, wherein each of the groups includes codewords representing values having same weights and the codewords in each of the groups are ordered lexicographically with respect to the values represented by the codewords, and first and second subgroups of codewords within each of the groups, wherein the first subgroup includes codewords having a first length and the second subgroup includes codewords having a second length different form the first length, means for performing variable length coding using base codewords for each of the subgroups, positions of codewords within each of the groups, a number of codewords within each of the first subgroups, and lengths of the codewords within each of the subgroups, and means for generating a result of the variable length coding for at least one of storage in memory, transmission to a device, or presentation to a user.

In an additional aspect, the disclosure provides a tangible computer-readable medium comprising instructions to cause a processor to, for a code structure defining groups of codewords in a coding tree specifying variable length codewords, wherein each of the groups includes codewords representing values having same weights and the codewords in each of the groups are ordered lexicographically with respect to the values represented by the codewords, and first and second subgroups of codewords within each of the groups, wherein the first subgroup includes codewords having a first length and the second subgroup includes codewords having a second length different form the first length, perform variable length coding using base codewords for each of the subgroups, positions of codewords within each of the groups, a number of codewords within each of the first subgroups, and lengths of the codewords within each of the subgroups, and generate a result of the variable length coding for at least one of storage in memory, transmission to a device, or presentation to a user.

In an additional aspect, the disclosure provides a device comprising, for a code structure defining groups of codewords in a coding tree specifying variable length codewords, wherein each of the groups includes codewords representing values having same weights and the codewords in each of the groups are ordered lexicographically with respect to the values represented by the codewords, and first and second subgroups of codewords within each of the groups, wherein the first subgroup includes codewords having a first length and the second subgroup includes codewords having a second length different form the first length, a processor configured to perform variable length coding using base codewords for each of the subgroups, positions of codewords within each of the groups, a number of codewords within each of the first subgroups, and lengths of the codewords within each of the subgroups, and generate a result of the variable length coding for at least one of storage in memory, transmission to a device, or presentation to a user.

In another aspect, the disclosure provides a tangible computer-readable medium comprising a data structure for variable length coding using a variable length code structure that defines groups of codewords in a coding tree, each of the groups includes codewords representing values having same weights and the codewords in each of the groups are ordered lexicographically with respect to the values represented by the codewords, and first and second subgroups of codewords within each of the groups, wherein the first subgroup includes codewords having a first length and the second subgroup includes codewords having a second length different form the first length.

In a further aspect, the disclosure provides an integrated circuit device comprising a processor configured to perform variable length coding according to a code structure, wherein the code structure defines groups of codewords in a coding tree, each of the groups includes codewords representing values having same weights and the codewords in each of the groups are ordered lexicographically with respect to the values represented by the codewords, and first and second subgroups of codewords within each of the groups, wherein the first subgroup includes codewords having a first length and the second subgroup includes codewords having a second length different form the first length, and wherein the processor is configured to generate a result of the variable length coding for at least one of storage in memory, transmission to a device, or presentation to a user.

In another aspect, the disclosure provides a wireless communication device handset comprising a processor configured to perform variable length coding according to a code structure, wherein the code structure defines groups of codewords in a coding tree, each of the groups includes codewords representing values having same weights and the codewords in each of the groups are ordered lexicographically with respect to the values represented by the codewords, and first and second subgroups of codewords within each of the groups, wherein the first subgroup includes codewords having a first length and the second subgroup includes codewords having a second length different form the first length, and wherein the processor is configured to generate a result of the variable length coding for at least one of storage in memory, transmission to a device, or presentation to a user.

In a further aspect, the disclosure provides an integrated circuit device comprising a memory storing a data structure comprising partial values of base codewords for levels of a coding tree specifying variable length codewords, and a skip indicator instructing a decoder to skip a number of bits in a bitstream to be decoded before proceeding to a selected level of the coding tree, and a decoder that accesses the memory to decode one of the codewords from the bitstream based on the partial values and the skip indicator in the stored data structure.

In another aspect, the disclosure provides a wireless communication device handset comprising a memory storing a data structure comprising partial values of base codewords for levels of a coding tree specifying variable length codewords, and a skip indicator instructing a decoder to skip a number of bits in a bitstream to be decoded before proceeding to a selected level of the coding tree, a decoder that accesses the memory to decode one of the codewords from the bitstream based on the partial values and the skip indicator in the stored data structure, a receiver to receive the codewords from an encoder by wireless communication, and an output device that presents output to a user based at least in part on the decoded codewords.

The techniques described in this disclosure may be implemented in a hardware, software, firmware, or any combination thereof. If implemented in software, the software may be executed in one or more processors, such as a microprocessor, application specific integrated circuit (ASIC), field programmable gate array (FPGA), or digital signal processor (DSP), or other equivalent integrated or discrete logic circuitry. The software that executes the techniques may be initially stored in a computer-readable medium and loaded and executed by a processor. Accordingly, this disclosure also contemplates computer program products comprising a computer-readable medium that comprises instructions to cause a processor to perform any of a variety of techniques as described in this disclosure.

The details of one or more aspects of the disclosure are set forth in the accompanying drawings and the description below. Other features, objects, and advantages of the techniques described in this disclosure will be apparent from the description and drawings, and from the claims.

DETAILED DESCRIPTION

Figure 1:
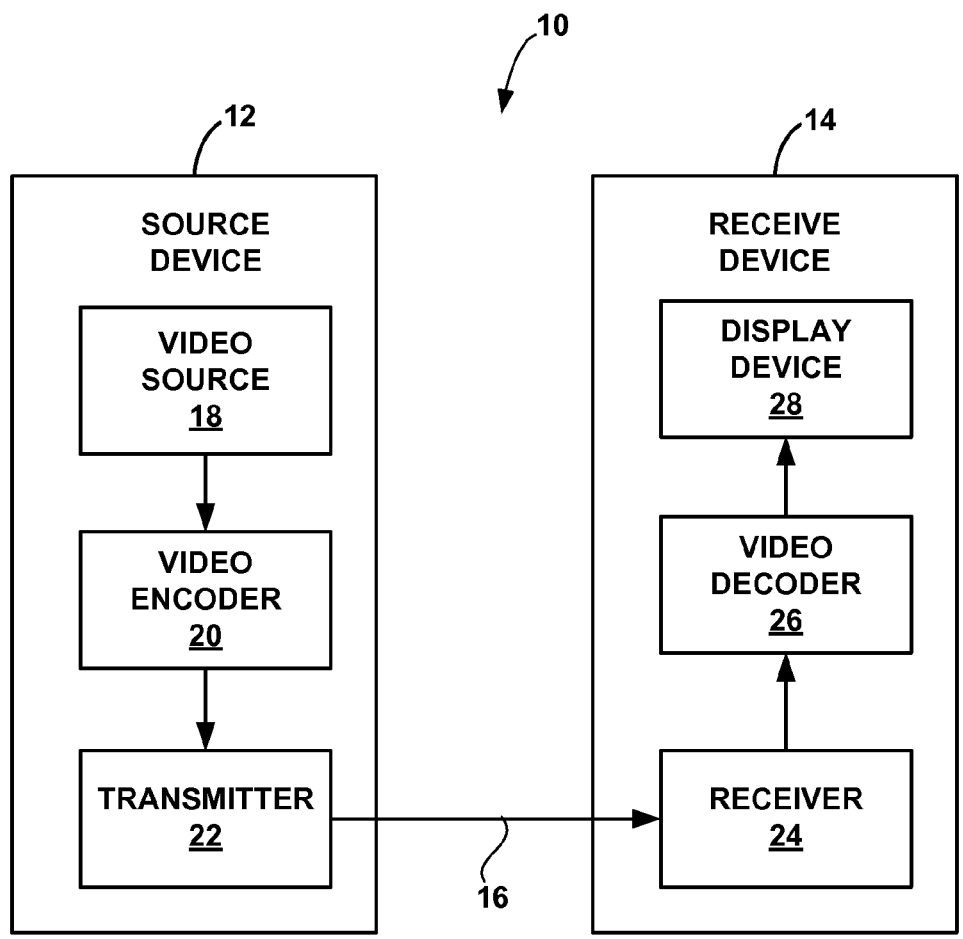
FIG. 1 is a block diagram illustrating a video encoding and decoding system.

In general, this disclosure is directed to techniques for memory efficient and low complexity, adaptive variable length coding (VLC) of data for a variety of applications, such as coding of digital video, image, audio, or speech data. In some aspects, the techniques may exploit properties of particular sets of codewords to support very compact data structures. In other aspects, the techniques may support low-complexity, adaptive encoding and decoding of binary sequences produced by memoryless sources. Although the techniques described in this disclosure may be applicable to a wide variety of practical applications, including general data compression and coding, the disclosure will refer to digital video coding and decoding for purposes of example and illustration.

In accordance with a first general aspect of this disclosure, to support compact data structures, the disclosed techniques need not rely on any particular code construction scheme. For example, Huffman, Shannon, Shannon-Fano, Gilbert-Moore or other code construction schemes may be used. For this first general aspect, however, it is assumed that such a code is constructed for a source with monotonically increasing probabilities of symbols from an input alphabet of symbols. More specifically, it is assumed that codewords have monotonically decreasing lengths, or at least non-increasing lengths, and that codewords of the same length have the same lexicographic order as the symbols in the input alphabet that they represent.

The desired lexicographic order may be achieved by reordering of the input alphabet. For such codewords, base codeword values may be computed for each level of a coding tree. The base codeword values represent the lexicographically smallest canonical codewords at each level of the coding tree.

Base codeword values and indices of their respective symbols may be stored in a reordered array. The indices may be stored as offset values for each populated level in the tree. A decoding process may involve comparison of a bitstream buffer with left-justified base codeword values, followed by simple direct computation of an index of a decoded symbol.

The above properties can be used to uniquely describe such a code with a data structure that can be further compressed to produce a very compact data structure that facilitates incremental decoding of variable length codes. For example, the left-justified base codeword values ordinarily will have large quantities of leading zeros from right to left. The numbers of leading zeros are monotonicially decreasing as the process moves into deeper layers in an applicable coding tree. Hence, when bits are sequentially decoded starting with the very first layer and moving downward, some of the leading zero bits can be skipped without affecting accuracy of the decoding process.

The leading zeros may be removed in fixed increments, e.g., 8-bit increments, which is convenient for bitstream buffer management on conventional 8-bit/byte computers. An additional table of one or more skip indicators can be provided to manage this process. As an example, a skip indicator directs a decoder to scroll ahead in a bitstream buffer by a fixed increment so that different base codeword values can be distinguished when leading zeros are dropped. With removal of leading zeros, the width of the resulting array of modified base codeword values can be substantially reduced, thereby conserving memory utilization.

Hence, in a first general aspect, the disclosure contemplates a method comprising generating partial values of base codewords for levels of a coding tree specifying variable length codewords, generating a skip indicator instructing a decoder to skip a number of bits in a bitstream to be decoded before proceeding to a selected level of the coding tree, and storing the partial values and the skip indicator in a data structure in a memory. The data structure may be any of a wide variety of data structures, such as tables, linked lists, binary trees, radix trees, flat files or the like, and may be stored in any of a variety of different memory devices, such as the many forms of random access memory (RAM), read only memory (ROM), or both. The data structure may be stored in such memory within an encoder or a decoder. For example, a decoder may access the data structure, or portions of the contents of the data structure, from memory associated with the decoder to perform variable length decoding of codewords in a memory efficient manner.

In accordance with this first general aspect, the disclosure further contemplates a processor configured to generate partial values of base codewords for levels of a coding tree specifying variable length codewords, and generate a skip indicator instructing a decoder to skip a number of bits in a bitstream to be decoded before proceeding to a selected level of the coding tree, as well as a memory that stores the partial values and the skip indicator in a data structure. Such information may be stored in a single data structure or multiple data structures. Accordingly, reference to a data structure may include one or more data structures storing the information contemplated in this disclosure. A processor configured to access a data structure to perform variable length coding may be implemented within a source device or receive device, or within a separate device that generates data structures defining code structures for use by an encoder and/or decoder in performing variable length coding.

According to this technique for achieving compact data structures, consistent with a first general aspect of this disclosure, each valid codeword length may correspond to a level with an external node in a code tree. As discussed above, the data structure may include partial values of base codewords and one or more skip indicators. More particularly, in some embodiments, the data structure may contain, for each valid codeword length, the following information: (a) a partial value of the lexicographically smallest (or largest) codeword at the current level of the code tree, (b) the number of bits in the partial value, (c) a value of the symbol corresponding to the lexicographically smallest (or largest) codeword, and (d) an indicator instructing the decoder to skip a certain number of bits before proceeding to the next level of the code tree. Accordingly, the data structure may further include values for symbols represented by the base codewords and lengths of partial values of the base codewords, i.e., the number of bits in each partial value of a base codeword. Encoding and decoding techniques may use this data structure to identify the level corresponding to a codeword to be produced or decoded, and then directly compute the value of the codeword or decoded symbol. Accordingly, the data structure may be stored in the memory of a video encoder or decoder, image encoder or decoder, audio encoder or decoder, or speech encoder or decoder, some of which may be constructed as combined CODECs.

Examples of existing techniques for encoding or decoding of variable length codes are described in A. Moffat and A. Turpin, On the Implementation of Minimum-Redundancy Prefix Codes, IEEE Trans. Communications, 45 (10) (1997) 1200-1207, J. B. Connell, A Huffman-Shannon-Fano Code, Proc. IEEE, July 1973, 1046-1047, and A. Brodnik and S. Carlsson, Sublinear Decoding of Huffman Codes Almost in Place, DIMACS Workshop on Codes and Trees: Algorithmic and information Theoretic Approaches, October 1998, Rutgers University, DIMACS Center, NJ. Compared to these existing techniques, the disclosed techniques for achieving compact data structures may offer certain advantages.

As a first example, a data structure produced by the disclosed technique may use a much smaller amount of memory due to the fact that only partial values of lexicographically smallest codewords are stored and used, e.g., by a video decoder. As another example, the disclosed technique may use incremental access to bitstream data, allowing a bitstream buffer to be presented by a reasonably short register, and updated at any convenient intervals, e.g., via a skip indication, further lowering complexity of the implementation.

For example, in some implementations, a 32-bit register may be enough even for very long codes. In addition, updates may be made at 8-bit intervals. Overall, the disclosed technique may significantly reduce the complexity of representation and encoding/decoding of variable length codes, which can enable designers of compression algorithms to utilize much larger, and hence more efficient, codebooks.

In accordance with a second general aspect of this disclosure, to support low-complexity, adaptive encoding and decoding of binary sequences produced by memoryless sources, the disclosed techniques may implement universal block codes constructed for a set of contexts identified by the numbers of non-zero bits in previous bits in a sequence. This second general aspect may be provided or practiced independently or in conjunction with the first general aspect described above with respect to generation of very compact data structures. The techniques for low-complexity adaptive encoding and decoding, in accordance with this second general aspect, may rely on a disclosed formula for asymptotic redundancy of such codes, which refines the estimate described in R. E. Krichevsky and V. K. Trofimov, The Performance of Universal Encoding, IEEE Trans. Information Theory, 27 (1981) 199-207.

The techniques in accordance with this second general aspect may use an array of Huffman codes designed for several estimated densities and indexed by the numbers of non-zero bits in previous blocks (contexts) in a sequence. By using even modestly sized blocks of bits n=8 ... 16 (and using a corresponding 1.5 ... 5 k bytes of memory), such techniques may achieve compression performance comparable or superior to other existing algorithms such as the Q-coder algorithm described in W. B. Pennebaker, J. L. Mitchell, G. G. Langdon, Jr., R. B. Arps, An overview of the basic principles of the Q-Coder adaptive binary arithmetic coder, IBM J. Res. Dev., 32 (6) (1988) 717, which is used in the JBIG image coding standard, or the CABAC algorithm described in D. Marpe, H. Schwartz, and T. Wiegand, Context-Based Adaptive Binary Arithmetic Coding in the H.264/AVC video compression standard, IEEE Trans. on CSVT, 13(7):620 636, July 2003, which is used in the ITU-T H.264/MPEG AVC standards for video compression.

Low complexity, adaptive encoding and decoding, in accordance with this second general aspect of the disclosure, may be based on the realization that, in a memoryless model, the probability of a block of bits, or its estimate, depends only on its weight (the number of non-zero bits), and not an actual pattern of its bits. Hence, a set of all possible blocks of some fixed length can be split into different groups containing blocks of the same weight (and consequently, the same probability). It may be assumed that each group stores blocks in a lexicographic order, either naturally or by reordering.

It is a known property of minimum-redundancy codes (such as Huffman or Shannon codes) that each group of equiprobable blocks may include at most two sub-groups, where blocks in each such sub-group are encoded by codewords of the same length. Without restriction on generality, it can be further assumed that the length of codewords in the first sub-group is shorter than the length of codewords in the second sub-group. Because blocks (or words) within a group follow lexicographic order, it can be simply split between a subgroup with larger codeword length and a subgroup with smaller codeword length. An index value indicates the position of the block within a group. The lexicographically smallest block (or word) in each subgroup is assigned a base codeword. Given a base codeword, the remaining codewords in each subgroup can be readily computed.

Hence, in accordance with this second general aspect of the disclosure, variable length coding may be performed, e.g., by an encoder or decoder using a code structure that defines groups of input blocks or words and their respective output codewords in a coding tree, wherein each of the groups includes codewords representing blocks (or words) having the same weights, and first and second subgroups of codewords within each of the groups, wherein the first subgroup includes codewords having a first length and the second subgroup includes codewords having a second length different form the first length. The blocks in each of the groups are ordered lexicographically and then split in subgroups, such that lexicographic order is retained in each of the subgroups. Furthermore, the codewords corresponding to each block within a subgroup are assigned such that they also follow same lexicographic order and facilitate encoding and decoding by direct computation.

Based on this arrangement of blocks and their groups and subgroups, codewords can be directly computed using a simplified process. For example, upon obtaining a weight and index value for a block, if the index value is less than the maximum number of blocks in the first sub-group, then a first subgroup is selected for locating the codeword. Otherwise, the second subgroup is selected for locating the codeword. Then, upon retrieving the base codeword for the selected subgroup, the codeword is readily computed by summing the base codeword value with a value determined based on the index value of the block within the selected subgroup. For purposes of this second general aspect of the disclosure, the terms blocks or words may be used interchangeably to generally refer to input quantities to be coded according to a coding scheme. A block or word may include a sequence of symbols, which may be formed from an input alphabet, such as a binary alphabet {0,1}. Codewords generally refer to output quantities assigned to blocks (or words) as a result of the coding scheme.

These and other aspects of the techniques described in this disclosure will be described in greater detail below. The techniques may be used together or independently, and may be implemented in any of a variety of encoding and decoding systems and devices, including systems and devices configured for encoding or decoding of digital video, image, audio or speech data. For purposes of example and illustration, the disclosure will describe application of such techniques to digital video coding and decoding, without limitation as to the general practical application of data compression and coding, or other specific applications to different types of data.

FIG. 1 is a block diagram illustrating a video encoding and decoding system 10. As shown in FIG. 1, system 10 includes a source device 12 that transmits encoded video to a receive device 14 via a communication channel 16. Source device 12 may include a video source 18, video encoder 20 and a transmitter 22. Receive device 14 may include a receiver 24, video decoder 26 and video display device 28. System 10 may be configured to apply techniques for memory efficient and low complexity, adaptive variable length coding (VLC) of digital video data. In particular, the memory efficient and low complexity, adaptive VLC techniques may be used for entropy coding of residual block coefficients produced by a predictive video coding process. The techniques may be applied to video coding schemes that code the positions of nonzero transform coefficients using runs of zeros, or to other video coding schemes.

In the example of FIG. 1, communication channel 16 may comprise any wireless or wired communication medium, such as a radio frequency (RF) spectrum or one or more physical transmission lines, or any combination of wireless and wired media. Channel 16 may form part of a packet-based network, such as a local area network, wide-area network, or a global network such as the Internet. Communication channel 16 generally represents any suitable communication medium, or collection of different communication media, for transmitting video data from source device 12 to receive device 14.

Source device 12 generates video for transmission to destination device 14. In some cases, however, devices 12, 14 may operate in a substantially symmetrical manner. For example, each of devices 12, 14 may include video encoding and decoding components. Hence, system 10 may support one-way or two-way video transmission between video devices 12, 14, e.g., for video streaming, video broadcasting, or video telephony. For other data compression and coding applications, devices 12, 14 could be configured to send and receive, or exchange, other types of data, such as image, speech or audio data, or combinations of two or more of video, image, speech and audio data. Accordingly, discussion of video applications is provided for purposes of illustration and should not be considered limiting of the various aspects of the disclosure as broadly described herein.

Video source 18 may include a video capture device, such as one or more video cameras, a video archive containing previously captured video, or a live video feed from a video content provider. As a further alternative, video source 18 may generate computer graphics-based data as the source video, or a combination of live video and computer-generated video. In some cases, if video source 18 is a camera, source device 12 and receive device 14 may form so-called camera phones or video phones. Hence, in some aspects, source device 12, receive device 14 or both may form a wireless communication device handset, such as a mobile telephone. In each case, the captured, pre-captured or computer-generated video may be encoded by video encoder 20 for transmission from video source device 12 to video decoder 26 of video receive device 14 via transmitter 22, channel 16 and receiver 24. Display device 28 may include any of a variety of display devices such as a liquid crystal display (LCD), plasma display or organic light emitting diode (OLED) display.

Video encoder 20 and video decoder 26 may be configured to support scalable video coding for spatial, temporal and/or signal-to-noise ratio (SNR) scalability. In some aspects, video encoder 20 and video decoder 22 may be configured to support fine granularity SNR scalability (FGS) coding for SVC. Encoder 20 and decoder 26 may support various degrees of scalability by supporting encoding, transmission and decoding of a base layer and one or more scalable enhancement layers. For scalable video coding, a base layer carries video data with a minimum level of quality. One or more enhancement layers carry additional bitstream to support higher spatial, temporal and/or SNR levels.

Video encoder 20 and video decoder 26 may operate according to a video compression standard, such as MPEG-2, MPEG-4, ITU-T H.263, or ITU-T H.264/MPEG-4 Advanced Video Coding (AVC). Although not shown in FIG. 1, in some aspects, video encoder 20 and video decoder 26 may be integrated with an audio encoder and decoder, respectively, and include appropriate MUX-DEMUX units, or other hardware and software, to handle encoding of both audio and video in a common data stream or separate data streams. If applicable, MUX-DEMUX units may conform to the ITU H.223 multiplexer protocol, or other protocols such as the user datagram protocol (UDP).

The H.264/MPEG-4 (AVC) standard was formulated by the ITU-T Video Coding Experts Group (VCEG) together with the ISO/IEC Moving Picture Experts Group (MPEG) as the product of a collective partnership known as the Joint Video Team (JVT). The H.264 standard is described in ITU-T Recommendation H.264, Advanced video coding for generic audiovisual services, by the ITU-T Study Group, and dated March 2005, which may be referred to herein as the H.264 standard or H.264 specification, or the H.264/AVC standard or specification.

The Joint Video Team (JVT) continues to work on a scalable video coding (SVC) extension to H.264/MPEG-4 AVC. The specification of the evolving SVC extension is in the form of a Joint Draft (JD). The Joint Scalable Video Model (JSVM) created by the JVT implements tools for use in scalable video, which may be used within system 10 for various coding tasks described in this disclosure. Detailed information concerning Fine Granularity SNR Scalability (FGS) coding can be found in the Joint Draft documents, e.g., in Joint Draft 6 (SVC JD6), Thomas Wiegand, Gary Sullivan, Julien Reichel, Heiko Schwarz, and Mathias Wien, "Joint Draft 6: Scalable Video Coding," JVT-S 201, April 2006, Geneva, and in Joint Draft 9 (SVC JD9), Thomas Wiegand, Gary Sullivan, Julien Reichel, Heiko Schwarz, and Mathias Wien, "Joint Draft 9 of SVC Amendment," JVT-V 201, January 2007, Marrakech, Morocco.

In some aspects, for video broadcasting, the techniques described in this disclosure may be applied to Enhanced H.264 video coding for delivering real-time video services in terrestrial mobile multimedia multicast (TM3) systems using the Forward Link Only (FLO) Air Interface Specification, "Forward Link Only Air Interface Specification for Terrestrial Mobile Multimedia Multicast," to be published as Technical Standard TIA-1099 (the "FLO Specification"), e.g., via a wireless video broadcast server or wireless communication device handset. The FLO Specification includes examples defining bitstream syntax and semantics and decoding processes suitable for the FLO Air Interface. Alternatively, video may be broadcasted according to other standards such as DVB-H (digital video broadcast-handheld), ISDB-T (integrated services digital broadcast-terrestrial), or DMB (digital media broadcast). Hence, source device 12 may be a mobile wireless terminal, a video streaming server, or a video broadcast server. However, techniques described in this disclosure are not limited to any particular type of broadcast, multicast, or point-to-point system. In the case of broadcast, source device 12 may broadcast several channels of video data to multiple receive device, each of which may be similar to receive device 14 of FIG. 1.

Video encoder 20 and video decoder 26 each may be implemented as one or more microprocessors, digital signal processors (DSPs), application specific integrated circuits (ASICs), field programmable gate arrays (FPGAs), discrete logic, software, hardware, firmware or any combinations thereof. Each of video encoder 20 and video decoder 26 may be included in one or more encoders or decoders, either of which may be integrated as part of a combined encoder/decoder (CODEC) in a respective mobile device, subscriber device, broadcast device, server, or the like. In addition, source device 12 and receive device 14 each may include appropriate modulation, demodulation, frequency conversion, filtering, and amplifier components for transmission and reception of encoded video, as applicable, including radio frequency (RF) wireless components and antennas sufficient to support wireless communication. For ease of illustration, however, such components are not shown in FIG. 1.

A video sequence includes a series of video frames. Video encoder 20 operates on blocks of pixels within individual video frames in order to encode the video data. The video blocks may have fixed or varying sizes, and may differ in size according to a specified coding standard. Each video frame includes a series of slices. Each slice may include a series of macroblocks, which may be arranged into sub-blocks. As an example, the ITU-T H.264 standard supports intra prediction in various block sizes, such as 16 by 16, 8 by 8, 4 by 4 for luma components, and 8×8 for chroma components, as well as inter prediction in various block sizes, such as 16 by 16, 16 by 8, 8 by 16, 8 by 8, 8 by 4, 4 by 8 and 4 by 4 for luma components and corresponding scaled sizes for chroma components.

Smaller video blocks can provide better resolution, and may be used for locations of a video frame that include higher levels of detail. In general, macroblocks (MBs) and the various sub-blocks may be considered to be video blocks. In addition, a slice may be considered to be a series of video blocks, such as MBs and/or sub-blocks. Each slice may be an independently decodable unit. After prediction, a transform may be performed on the 8×8 residual block or 4×4 residual block, and an additional transform may be applied to the DC coefficients of the 4×4 blocks for chroma components or luma component if the intra__16×16 prediction mode is used.

Video encoder 20 and/or video decoder 26 of system 10 of FIG. 1 may be configured to employ techniques for memory efficient and low complexity adaptive variable length coding (VLC) as described in this disclosure. In particular, video encoder 20 and/or video decoder 26 may include an entropy encoder and entropy decoder, respectively, that apply at least some of such techniques to reduce memory utilization, processing overhead, processing complexity, bandwidth consumption, data storage space, and/or power consumption.

Figure 2:
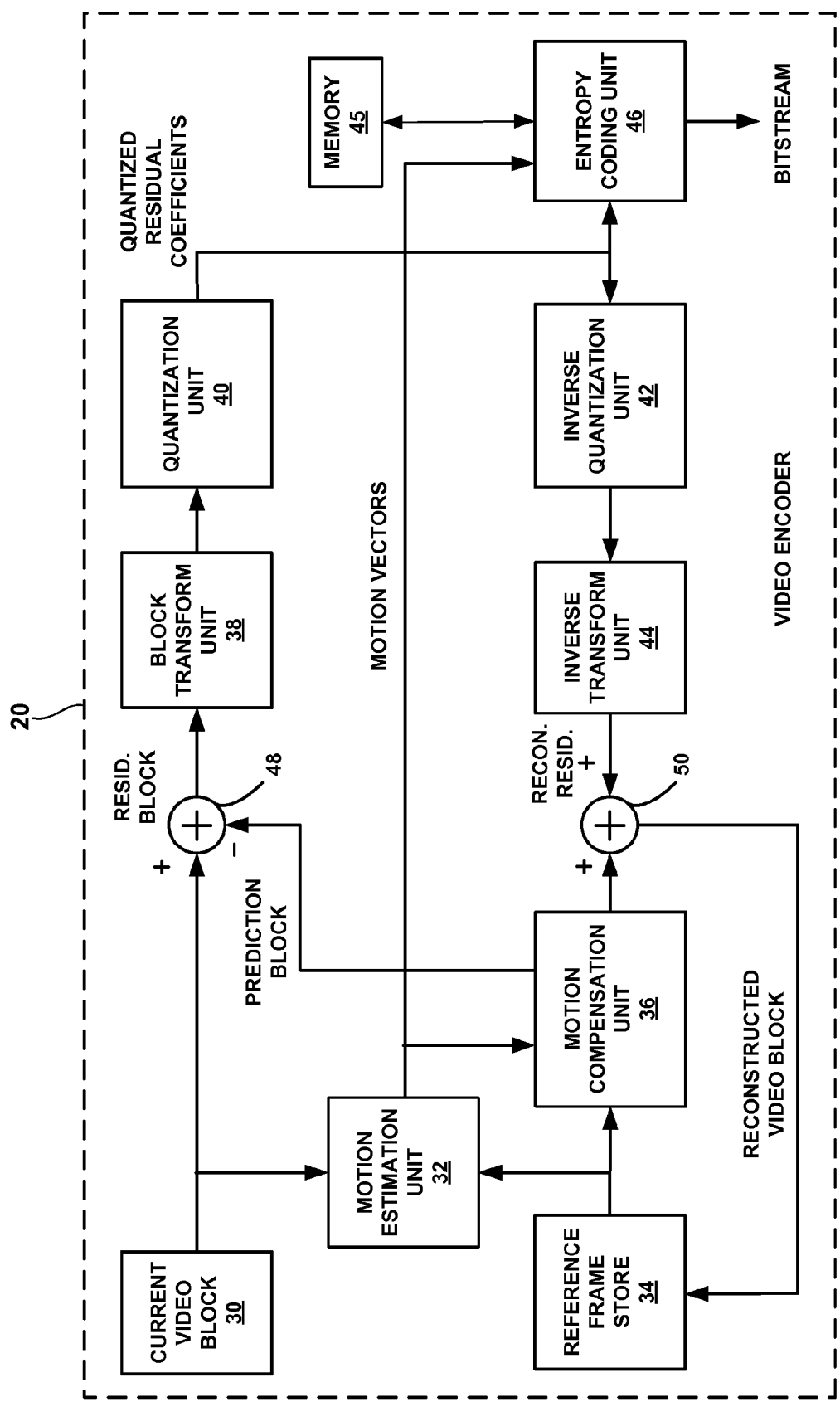
FIG. 2 is a block diagram illustrating an example of a video encoder.

FIG. 2 is a block diagram illustrating an example of a video encoder 20 as shown in FIG. 1. Video encoder 20 may be formed at least in part as one or more integrated circuit devices, which may be referred to collectively as an integrated circuit device. In some aspects, video encoder 20 may form part of a wireless communication device handset or broadcast server. Video encoder 20 may perform intra- and inter-coding of blocks within video frames. Intra-coding relies on spatial prediction to reduce or remove spatial redundancy in video within a given video frame. Inter-coding relies on temporal prediction to reduce or remove temporal redundancy in video within adjacent frames of a video sequence. For inter-coding, video encoder 20 performs motion estimation to track the movement of matching video blocks between adjacent frames.

As shown in FIG. 2, video encoder 20 receives a current video block 30 within a video frame to be encoded. In the example of FIG. 2, video encoder 20 includes motion estimation unit 32, reference frame store 34, motion compensation unit 36, block transform unit 38, quantization unit 40, inverse quantization unit 42, inverse transform unit 44 and entropy coding unit 46. Entropy coding unit 46 may access one or more data structures stored in a memory 45 to obtain data useful in coding. An in-loop deblocking filter (not shown) may be applied to filter blocks to remove blocking artifacts. Video encoder 20 also includes summer 48 and summer 50. FIG. 2 illustrates the temporal prediction components of video encoder 20 for inter-coding of video blocks. Although not shown in FIG. 2 for ease of illustration, video encoder 20 also may include spatial prediction components for intra-coding of some video blocks.

Motion estimation unit 32 compares video block 30 to blocks in one or more adjacent video frames to generate one or more motion vectors. The adjacent frame or frames may be retrieved from reference frame store 34, which may comprise any type of memory or data storage device to store video blocks reconstructed from previously encoded blocks. Motion estimation may be performed for blocks of variable sizes, e.g., 16×16, 16×8, 8×16, 8×8 or smaller block sizes. Motion estimation unit 32 identifies one or more blocks in adjacent frames that most closely matches the current video block 30, e.g., based on a rate distortion model, and determines displacement between the blocks in adjacent frames and the current video block. On this basis, motion estimation unit 32 produces one or more motion vectors (MV) that indicate the magnitude and trajectory of the displacement between current video block 30 and one or more matching blocks from the reference frames used to code current video block 30.

Motion vectors may have half- or quarter-pixel precision, or even finer precision, allowing video encoder 20 to track motion with higher precision than integer pixel locations and obtain a better prediction block. When motion vectors with fractional pixel values are used, interpolation operations are carried out in motion compensation unit 36. Motion estimation unit 32 identifies the best block partitions and motion vector or motion vectors for a video block using certain criteria, such as a rate-distortion model. For example, there may be more than motion vector in the case of bi-directional prediction. Using the resulting block partitions and motion vectors, motion compensation unit 36 forms a prediction video block.

Video encoder 20 forms a residual video block by subtracting the prediction video block produced by motion compensation unit 36 from the original, current video block 30 at summer 48. Block transform unit 38 applies a transform, such as the 4×4 or 8×8 integer transform used in H.264/AVC, to the residual block, producing residual transform block coefficients. Quantization unit 40 quantizes the residual transform block coefficients to further reduce bit rate. Entropy coding unit 46 entropy codes the quantized coefficients to even further reduce bit rate.

Entropy coding unit 46 operates as a variable length coding (VLC) unit to apply VLC coding to the quantized block coefficients. In particular, entropy coding unit 46 may be configured to perform VLC coding of digital video block coefficients using memory efficient and low complexity, adaptive VLC techniques as described in this disclosure. Hence, the various encoding processes described in this disclosure may be implemented within entropy coding unit 46 to perform coding of video data. Alternatively, such an entropy coding unit 46 may perform the processes described in this disclosure to code any of a variety of data, including but not limited to video, image, speech and audio data. In general, video decoder 26 performs inverse operations, including VLC decoding, to decode and reconstruct the encoded video, as will be described, e.g., with reference to FIG. 3.

Inverse quantization unit 42 and inverse transform unit 44 apply inverse quantization and inverse transformation, respectively, to reconstruct the residual block. Summer 50 adds the reconstructed residual block to the motion compensated prediction block produced by motion compensation unit 36 to produce a reconstructed video block for storage in reference frame store 34. The reconstructed video block is used by motion estimation unit 32 and motion compensation unit 36 to encode a block in a subsequent video frame.

Figure 3:
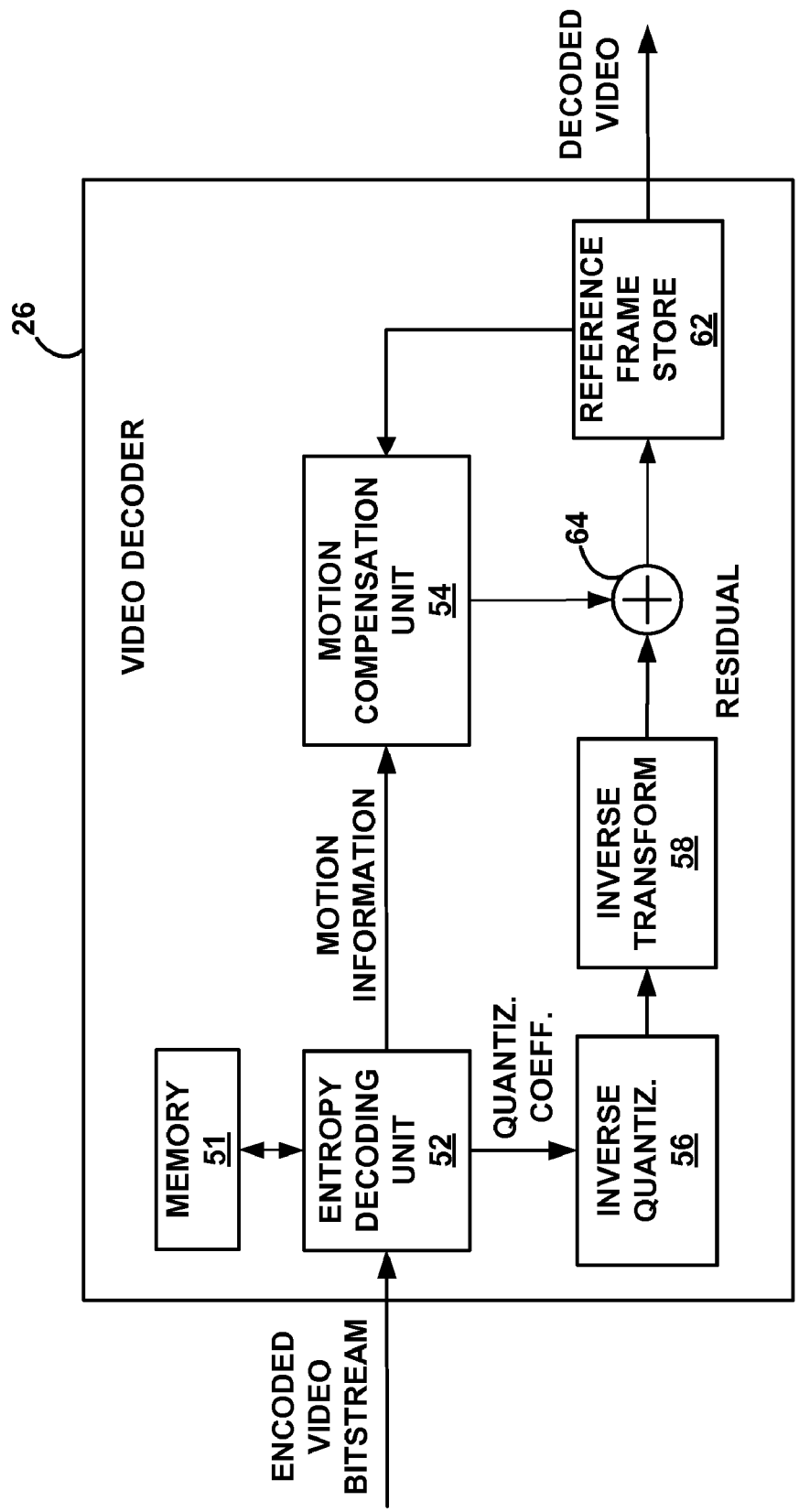
FIG. 3 is a block diagram illustrating an example of a video decoder.

FIG. 3 is a block diagram illustrating an example of a video decoder 26. Video decoder 26 may be formed at least in part as one or more integrated circuit devices, which may be referred to collectively as an integrated circuit device. In some aspects, video decoder 26 may form part of a wireless communication device handset. Video decoder 26 may perform intra- and inter-decoding of blocks within video frames. As shown in FIG. 3, video decoder 26 receives an encoded video bitstream that has been encoded by video encoder 20. In the example of FIG. 3, video decoder 26 includes entropy decoding unit 52, motion compensation unit 54, inverse quantization unit 56, inverse transform unit 58, and reference frame store 62. Video decoder 26 also may include an in-loop deblocking filter (not shown) that filters the output of summer 64. Video decoder 26 also includes summer 64. FIG. 3 illustrates the temporal prediction components of video decoder 26 for inter-decoding of video blocks. Although not shown in FIG. 3, video decoder 26 also may include spatial prediction components for intra-decoding of some video blocks.

Entropy decoding unit 52 receives the encoded video bitstream and decodes from the bitstream quantized residual coefficients, macroblock coding mode and motion information, which may include motion vectors and block partitions. Hence, entropy decoding unit 52 functions as a VLC decoding unit. For example, in order to decode quantized residual coefficients from the encoded bitstream, like entropy encoding unit 46 of FIG. 2, entropy decoding unit 52 of FIG. 3 may perform memory efficient and low complexity, adaptive VLC decoding of digital video block coefficients as described in this disclosure. However, entropy decoding unit 52 may perform VLC decoding in an inverse manner relative to entropy encoding unit 46 of FIG. 2 in order to retrieve quantized block coefficients from the encoded bitstream. Hence, the various decoding processes described in this disclosure may be implemented within entropy decoding unit 52 to perform decoding of video data. Alternatively, such an entropy decoding unit 52 may perform the processes described in this disclosure to decode any of a variety of data, including but not limited to video, image, speech and audio data. In either case, the result of the variable length coding performed by entropy decoding unit 52 may be output to a user, stored in memory and/or transmitted to another device or processing unit.

Motion compensation unit 54 receives the motion vectors and block partitions and one or more reconstructed reference frames from reference frame store 62 to produce a prediction video block. Inverse quantization unit 56 inverse quantizes, i.e., de-quantizes, the quantized block coefficients. Inverse transform unit 58 applies an inverse transform, e.g., an inverse DCT or an inverse 4×4 or 8×8 integer transform, to the coefficients to produce residual blocks. The prediction video blocks are then summed by summer 64 with the residual blocks to form decoded blocks. A deblocking filter (not shown) may be applied to filter the decoded blocks to remove blocking artifacts. The filtered blocks are then placed in reference frame store 62, which provides reference frame for decoding of subsequent video frames and also produces decoded video to drive display device 28 (FIG. 1).

Memory Efficient Coding of Variable Length Codes

In accordance with a first general aspect of the disclosure, an example of a memory efficient technique for variable length coding to support compact data structures will now be described in greater detail. The technique need not rely on any particular code construction scheme, such as Huffman, Shannon, Shannon-Fano, Gilbert-Moore, or other codes. The technique assumes, however, that a code is constructed for a source with monotonically increasing probabilities of symbols. More specifically, it is assumed that codewords have monotonically decreasing (or at least non-increasing) lengths, and that codewords of the same length have the same lexicographic order as symbols in input alphabet that they represent.

This technique, as applied to video coding or other applications, uses the above properties to uniquely describe such a code with a very compact data structure. As previously described, the data structure may contain, for each valid codeword length, i.e. level with external nodes in a code tree, the following information:

a. a partial value of the lexicographically smallest (or largest) codeword at the current level in a code tree, b. a number of bits in the partial value, c. a value of a symbol corresponding to the lexicographically smallest (or largest) codeword, and d. an indicator that instructs a decoder to skip a certain number of bits before proceeding to the next level of the code tree.

Encoding and decoding processes may use this structure to identify a level of the code tree corresponding to a codeword to be produced (or decoded), and then directly compute the value of the codeword (or decoded symbol).

This technique may permit the use of a much smaller amount of memory for coding and decoding due to the fact that only partial values of lexicographically smallest codewords are stored. The data structure may be any of a wide variety of data structures, such as tables, linked lists, binary trees, radix trees, flat files or the like, and may be stored in any of a variety of different memory devices, such as the many forms of random access memory (RAM), read only memory (ROM), or both. The data structure may be stored in such memory within an encoder or a decoder, e.g., within memory 45 or memory 51 shown in FIGS. 2 and 3, respectively. Again, at least some of the levels of the coding tree include codewords arranged in a lexicographic order with respect to the order of the symbol values represented by the codewords. Accordingly, each of the base codewords is a lexicographically smallest codeword at a corresponding level in the coding tree. In addition, this technique permits the use of incremental access to bitstream data, allowing a bitstream buffer to be presented by a reasonably short register. For example, a 32-bit register could be sufficient, even for very long codes. The register may be updated at convenient intervals (e.g., 8 bits), further lowering complexity of the implementation. Overall, in various aspects, the technique may be capable of significantly reducing the complexity of representation and encoding/decoding of variable length codes, which can enable designers of compression algorithms to utilize larger, more efficient, codebooks.

A general discussion of variable length codes is now provided to aid in illustration of the techniques described in this disclosure. Variable length codes represent a fundamental tool in data compression. In general, variable length codes are used to represent sequences of symbols with some known and typically highly unbalanced, distribution. Such sequences may be represented by binary sequences, or codes, of much shorter overall length. Reduction in length is accomplished by replacing more frequently occurring symbols with shorter codes, and less frequent symbols with longer codes.

Examples of variable-length codes used in data compression are Huffman codes, e.g., as described in D. A. Huffman. A method for the construction of minimum-redundancy codes. Proc. IRE, vol. 40, pp. 1098-1101. September 1952, Shannon codes, e.g., as described in C. E. Shannon, A mathematical theory of communication, Bell Syst. Tech J. Vol. 27. pp. 379-423, July 1948, Shannon-Fano codes, e.g., as described in R M. Fano, The transmission of information, Res. Lab. Electronics, Massachusetts Inst. of Technology, Cambridge, Mass. Tech. Rep. No. 65, 1949, and Gilbert-Moore codes, e.g., as described in E. N. Gilbert and E. F. Moore, Variable-Length Binary Encodings, Bell Syst. Tech. J., Vol. 7, pp. 932-967, 1959 (also sometimes referred to as Shannon-Fano-Elias codes).

Figure 4:
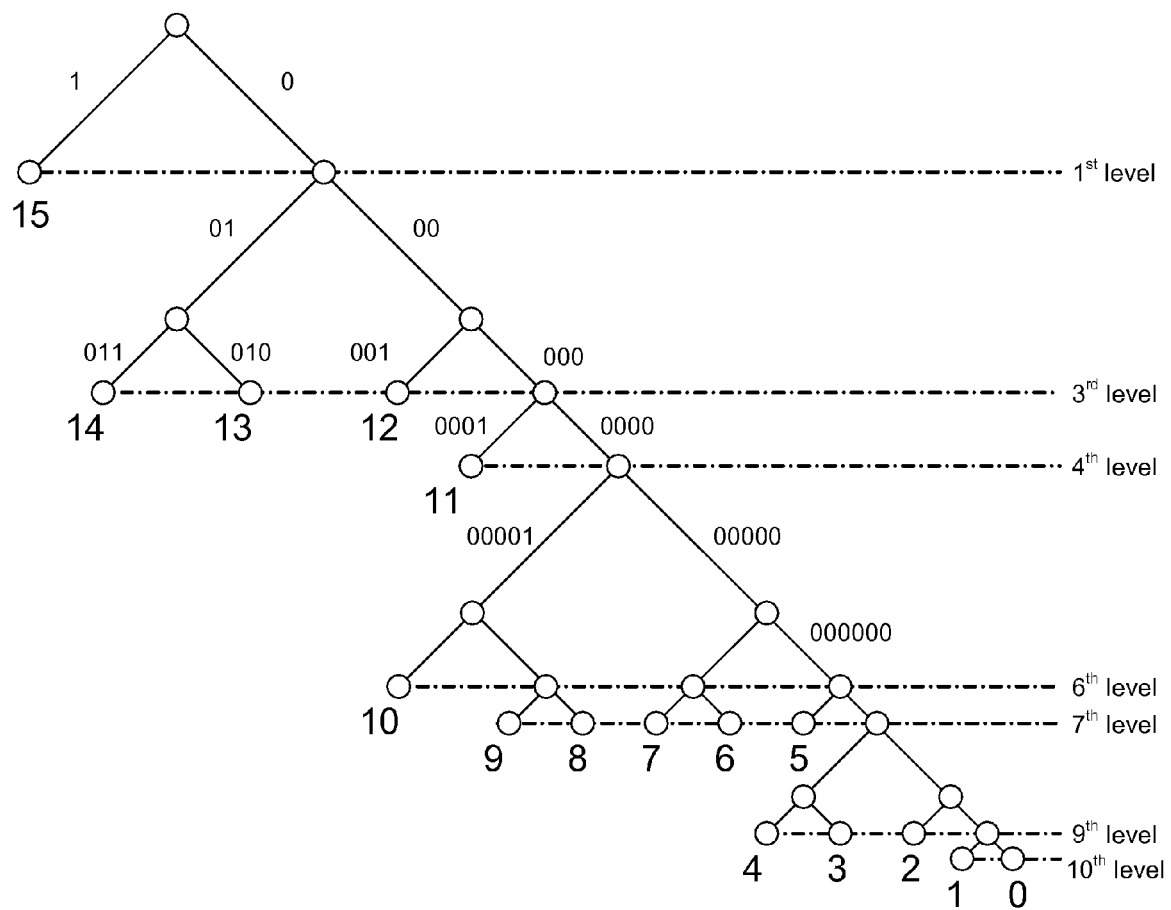
FIG. 4 is a diagram illustrating an example of a binary coding tree.

The codes described above belong to a class of prefix-free codes, e.g., as described in T. Cover and J. Thomas, Elements of Information Theory, Wiley, 1991. FIG. 4 is a diagram illustrating an example of a binary coding tree. The codes described above can be conveniently represented by a binary tree such as that shown in FIG. 4. Hence, an encoder may encode symbol values consistent with the coding tree. The values according to the tree may represent any of a variety of data, such as video data, image data, speech data or audio data. Each internal node in such a tree corresponds to a binary digit, whose 0-value forces a move to the right, and whose 1-value forces a move to the left child node in a tree. The top-most node is called a root node, which is the node from which encoding/decoding starts.

Each external node in a tree is where the encoding/decoding process restarts, producing either a codeword, i.e., as a sequence of bits from root to current node, or a decoded value of a symbol associated with a current codeword. In the example coding tree of FIG. 4, there are sixteen codewords corresponding to symbols indexed 0 through 15. In this example, the shortest codeword has a length of 1 bit, and the longest codewords have lengths of 10 bits each. The number of levels containing external nodes (codewords) in this tree is 7, i.e., at the $1^{st}$, $3^{rd}$, $4^{th}$, $6^{th}$, $7^{th}$, $9^{th}$ and $10^{th}$ levels.

With further reference to FIG. 4, let n denote the number of external nodes in the coding tree (and correspondingly the number of codewords in the code), let L denote the length of the longest codeword, and let K denote the number of levels populated with external nodes in the coding tree. The following discussion uses P. Bachmann's O-notation. For example, the expression y(n)=O(x(n)) indicates existence of some constant M>0, such that |y( )|<=M|x(n)| for all sufficiently large n.

To support the coding process, an encoder or decoder, such as entropy encoding unit 46 or entropy decoding unit 52, generally needs to store a binary tree in computer memory, such as memory 45 or memory 51. In addition, the encoding and decoding processes should involve a bit-by-bit (i.e., node-by node) traversing of the coding tree stored in memory. Hence, such an implementation should involve O(n) storage cost, and can take up to O(L) steps. Nevertheless, in some special cases, when coding trees have some particular structure, there may be more effective ways of storing such code structures and performing encoding or decoding operations.

For example, considering the code presented in the example coding tree of FIG. 4, it can be observed that the codewords are non-decreasing in length, and that all codewords on the same level of the coding tree have adjacent values. For example, codewords on the $4^{th}$ level of the tree in FIG. 4 are longer than codewords on the $3^{rd}$ level of the tree, i.e., 0001 vs. 011, 010, 001 and 000. In addition, codewords in the $3^{rd}$ level have adjacent values of 011, 010, 011, 000. Hence, instead of storing all of codes, it may be sufficient to store only the smallest or largest codeword for each level of the coding tree, i.e., as a base codeword form which adjacent codewords can be computed.

The above observation is key to understanding techniques for decoding of variable-length codes based on their conversion to so-called canonical form, e.g., as described in A. Moffat and A. Turpin, On the Implementation of Minimum-Redundancy Prefix Codes, IEEE Trans. Communications, 45 (10) (1997) 1200-1207. In simple terms, a canonical code has a non-decreasing distribution of lengths and maintains lexicographic order with respect to indices assigned to its nodes. It is fairly simple to show that any given source can be reordered such that the resulting code has the above properties.

For example, the code illustrated in the coding tree of FIG. 4 represents a reordered code for a source with a non-monotonic distribution, as indicated in TABLE 1 below. Specifically, TABLE 1 is an example of a canonical variable length code that has been reordered.

TABLE 1

Example of canonical variable-length code.

| Symbol | Probability | Index of symbol after reordering | Code-length | Code |
|---|---|---|---|---|
| 0 | 0.6561 | 15 | 1 | 1 |
| 1 | 0.0729 | 12 | 3 | 011 |
| 2 | 0.0729 | 13 | 3 | 010 |
| 3 | 0.0081 | 5 | 7 | 0000101 |
| 4 | 0.0729 | 14 | 3 | 001 |
| 5 | 0.0081 | 6 | 7 | 0000100 |
| 6 | 0.0081 | 10 | 6 | 000011 |
| 7 | 0.0009 | 1 | 10 | 0000000001 |
| 8 | 0.0729 | 11 | 4 | 0001 |
| 9 | 0.0081 | 7 | 7 | 0000011 |
| 10 | 0.0081 | 8 | 7 | 0000010 |

TABLE 1-continued

Example of canonical variable-length code.

| Symbol | Probability | Index of symbol after reordering | Code-length | Code |
|---|---|---|---|---|
| 11 | 0.0009 | 2 | 9 | 000000011 |
| 12 | 0.0081 | 9 | 7 | 0000001 |
| 13 | 0.0009 | 3 | 9 | 000000010 |
| 14 | 0.0009 | 4 | 9 | 000000001 |
| 15 | 0.0001 | 0 | 10 | 0000000000 |

In TABLE 1 above, symbol 0 has the highest probability, followed by 1 and 2. However, symbol 3 has a lower probability than 4, and 4 and 8 have the same probability as 1 and 2. After reordering, all symbol probabilities are monotonically increasing (non-decreasing), and result in the canonic code shown represented in the coding tree of FIG. 4. The so-called Moffat-Turpin algorithm, as described in A. Moffat and A. Turpin, On the Implementation of Minimum-Redundancy Prefix Codes, IEEE Trans. Communications, 45 (10) (1997) 1200-1207, provides a technique for decoding canonical codes. The techniques described in this disclosure may provide improvements over the Moffat-Turpin algorithm. Other algorithms, such as those described in J. B. Connell, A Huffman-Shannon-Fano Code, Proc. IEEE, July 1973, 1046-1047, and in A. Brodnik and S. Carlsson, Sublinear Decoding of Huffman Codes Almost in Place, DIMACS Workshop on Codes and Trees: Algorithmic and information Theoretic Approaches, October 1998, Rutgers University, DIMACS Center, NJ, are similar to the Moffat-Turpin algorithm, and also may be improved by using the disclosed techniques in a similar fashion.

The Moffat-Turpin algorithm for decoding of variable length codes is described below. Assuming that an input alphabet A contains n letters: $A=\{\alpha_0, \ldots \alpha_{n-1}\}$, reordering $i: A \rightarrow \{0, \ldots, n-1\}$ is applied such that resulting probabilities satisfy: $p_0 \leq p_1 \leq \ldots \leq p_{n-1}$. Then, a Huffman or other minimum redundancy construction algorithm can be applied, which assigns lengths of codewords $l_i$ for each index $1 \leq i \leq L$, where L is the length of the longest codeword. As a result, "population numbers" are produced as $m_l$, i.e., the number of codewords of length l.

Using these parameters, so-called "base" values are computed for each level in the tree as follows:

$$\text{base}[l] = \left\lceil \frac{\sum_{k=l+1}^{L} m_k 2^{L-k}}{2^{L-l}} \right\rceil = \left[\sum_{k=l+1}^{L} m_k 2^{l-k}\right], (1 \leq l \leq L)$$

These base codeword values represent the lexicographically smallest canonical codewords at each level of the tree. Given a base codeword value of base[l], one can now compute the value of the $j+1^{st}$ codeword among $m_l$ codewords of length l:

base[l]+j.

For decoder operation, it is more convenient to store a left-justified version of the base codeword value as follows:

lj_base[l]=base[l]$2^{W-l}$, where W is the length of the bit-buffer or register used to keep most recent loaded bits from the bitstream. It is assumed that W>=L.

Finally, in addition to base codeword values, the Moffat-Turpin decoder also stores indices of respective symbols in the reordered array. These indices are stored as offset[l] values for each populated level in the tree. The complete example structure maintained by the Moffat-Turpin algorithm for the code represented by the tree of FIG. 4 is presented in TABLE 2 below.

TABLE 2

Moffat-Turpin decoder structure for code in FIG. 4

| i | Lj_base [i] (W = 16) | Level [i] | offset [i] |
|---|---|---|---|
| 0 | 1000000000000000 | 1 | 15 |
| 1 | 0010000000000000 | 3 | 12 |
| 2 | 0001000000000000 | 4 | 11 |
| 3 | 0000110000000000 | 6 | 10 |
| 4 | 0000001000000000 | 7 | 5 |
| 5 | 0000000010000000 | 9 | 2 |
| 6 | 0000000000000000 | 10 | 0 |

Example pseudo-code for implementation of the Moffat-Turpin decoding algorithm using the structure of TABLE 2 is presented below in TABLE 3.

TABLE 3

Moffat-Turpin decoder algorithm

| Line | Instruction | Comment |
|---|---|---|
| 1 | V = bitstream_buffer; | get last W bits from bitstream |
| 2 | For (i = 0; i<K; i++) { | |
| 3 | if (lj_base[i] <= V) | search for level |
| 4 | break; | containing current codeword |
| 5 | } | |
| 6 | l = level[i]; | get length |
| 7 | scroll_bitstream(l); | scroll bitstream by l bits |
| 8 | symbol = offset[i] + ((V−base[i]) >> (W−l)); | decode symbol |

From TABLE 3 above, it can be seen that the entire decoding process involves up to K (W-bit) comparisons of the current bitstream buffer with left-justified base codeword values, followed by simple direct computation of an index of a decoded symbol. It can also be seen that the lj_base[ ] array utilized by such a structure requires O(K*W) bits of memory, which might be a problem if codewords are long, since W must be used such that W>=l.

In the example of TABLE 3, a decoder receives W bits from the bitstream and as V, and compares V to base codewords (lj_base[i]) for successive levels i of the coding tree. When a base codeword is found that is less then or equal to V, the search for the level of the codeword terminates. Then, the decoder determines the length associated with the level i, scrolls the bitstream by l bits, and decodes the symbol. In particular, the decoded symbol is determined by the sum of the offset value for level i and the difference between codeword V from the bitstream and the base codeword for level i, shifted to the right by W-l bits .

In a general setting, when Moffat-Turpin decoding is followed, the inverse mapping lookup $i^{-1}: \{0, \ldots, n-1\} \rightarrow A$. In this case, the last operation becomes the most memory-expensive one, as it requires O(n) space. In many practical cases, however, such as situations involving run-lengths or outputs of transforms or predictors, the sources that need to be encoded are already ordered. Consequently, the memory used by the lj_base[ ] array in the Moffat-Turpin structure becomes the main factor in the overall storage cost.

In accordance with a first general aspect, the techniques described in this disclosure provide refinements that permit further compression of the data structures used in the Moffat-Turpin algorithm, or other algorithms, and support incremental decoding of variable length codes. The refinements will now be discussed in greater detail. With reference to TABLE 2, it is evident that lj_base[l] values have large quantities of leading bits from right to left. Consequently, the partial values of the base codewords represent removal of a fixed number of leading bits from the base codewords. In most cases, the leading bits that are removed will be zeros. Such numbers of zeros are monotonically increasing as the coding tree extends to deeper layers. Hence, if bits are sequentially decoded starting with the very first layer of the coding tree and moving downward, it is possible to skip some of the leading zero bits without affecting correctness of the decoding. By skipping at least some of the leading zeros, the techniques described in this disclosure permit very compressed data structures and incremental decoding of variable length codes.

When leading bits are removed, however, it is possible that some legitimate codes at lower levels of the coding tree may extend into the range of leading bits that are removed. Accordingly, to avoid losing such codes, a table of skip indicators is provided. The skip indicator instructs a decoder to skip a number of bits in a bitstream to be decoded before proceeding to a selected level of the coding tree. In particular, the skip indicator may instruct the decoder to skip a fixed number of bits, e.g., 8 bits, in the codeword bitstream before proceeding to the selected level of the coding tree. In this manner, the partial value of the base codeword at the selected level of the tree is based on a shift of the base codeword by the fixed number of bits. Without the shift, the base codeword at the selected level of the tree would extend at least partially into the removed number of leading bits.

TABLE 4 below illustrates an example implementation of a coding process in which leading zeros are removed, in accordance with an aspect of this disclosure, to further compress the data structure used to represent and process codewords. In example of TABLE 4, leading zeros are removed in increments of 8, which is convenient for bitstream buffer management on conventional 8-bit/byte computers. To manage removal of leading zeros, an additional table of indicators (skip_8[i]) is provided, as described above. Hence, TABLE 4 generally conforms to TABLE 2, but removes leading zeros from each of the codewords and adds the skip indicator column.

TABLE 4

Modified Moffat-Turpin decoder structure

| i | r_lj_base [i] (W = 8) | skip_8 [i] | r_level [i] | offset [i] |
|---|---|---|---|---|
| 0 | 10000000 | 0 | 1 | 15 |
| 1 | 00100000 | 0 | 3 | 12 |
| 2 | 00010000 | 0 | 4 | 11 |
| 3 | 00001100 | 0 | 6 | 10 |
| 4 | 00000010 | 1 | 7 | 5 |
| 5 | 10000000 | 0 | 9 − 8 = 1 | 2 |
| 6 | 00000000 | 0 | 10 − 8 = 2 | 0 |

In the example of TABLE 4, the value r_lj_base(i) represents the base codeword value at each index position, the value r_level[i] indicates the level within the coding tree for the index position and the length of the codewords at that level, the value offset[i] indicates the number of leading zeros from right to left for the base codeword value, and the value skip_8[i] indicates whether a decoder should skip 8 bits for the next base codeword value, with 1 designating a skip and 0 designating no skip. This skip operation periodically refreshes the bit buffer at selected intervals to permit the decoder to identify codewords that would otherwise be lost when leading zeros are removed. For example, if the right-most eight leading zeros of a left-justified codeword are removed, codeword that extend into the right-most eight bits would be partially or completely lost. Accordingly, skipping the left-most eight bits in response to the skip indication would move the codeword into the range of bits that are not removed, thereby preserving the codeword for use in decoding.

Hence, the skip indicator signals when the decoder should skip ahead by the specified skip increment for the next level of the code, e.g., 8 in the example of TABLE 4. As an illustration, in TABLE 2, the base codeword values at index positions 5 and 6 (tree levels 9 and 10) are 0000000010000000 and 0000000000000000, respectively. When the right-most eight leading zeros (left justified) are removed from these base codeword values, it is necessary for the decoder to skip ahead eight bits so that the actual base codeword value (0000000010000000) is not lost when removing eight leading zeros. Instead, the actual base codeword value (0000000010000000) is converted to a different base codeword value (10000000) by skipping the first eight bits (00000000) and then removing the right-most eight leading zeros.

Due to removal of the leading zeros, the width of the modified lj_base[i] array is much smaller. In the code of TABLE 4, as an example, the width W of the modified lj_base [i] array is W=8, instead of W=16 in the case of TABLE 2. An example of an implementation of an algorithm that uses such an extra skip table to periodically refresh the bit-buffer is shown below in TABLE 5. An algorithm constructed as shown in TABLE 5 may be configured to support very long codewords or very compact base codeword value (lj_base) tables.

TABLE 5

Modified Moffat-Turpin decoder algorithm

| Line | Instruction | Comment |
| --- | --- | --- |
| 1 | V = bitstream_buffer; | get last W bits from bitstream |
| 2 | for (i = 0; i<K; i++) { | |
| 3 |    if (lj_base[i] <= V) | search for level |
| 4 |       break; | containing current codeword |
| 5 |    if (skip_B[i]) | shall we skip next B bits? |
| 6 |       V = scroll_bitstream(B); | Scroll bitstream by B bits |
| 7 | } | |
| 8 | l = level[i]; | get residual length |
| 9 | scroll_bitstream(l); | Scroll bitstream by l bits |
| 10 | symbol = offset[i] + ((V−base[i]) >> (W−l)); | decode symbol |

As shown in TABLE 5, the decoder obtains the last W bits from the bitstream, represented by value V=bitstream_buffer. The decoder then searches the levels i of the coding tree for a base codeword value lj_base[i] that is less than or equal to the codeword V from the bitstream buffer. If the current level i of the tree corresponds to a skip level (skip_B[i]), e.g., as indicated in TABLE 5, then the decoder scrolls the bitstream to the right by B bits, e.g., 8 bits in some implementations, so that the codeword at the next level searched by the decoder can be retained rather than lost by the removal of the B right-most leading zeros.

Upon determining the residual length l=level[i] for the codewords at the current level of the tree, e.g., as indicated in TABLE 5, the decoder scrolls the bitstream by the length l.

Then, the decoder directly computes the symbol index based on the sum of the offset for the current level i and the difference between the bitstream buffer contents V and the base codeword for the current level i, shifted to the right by W-l bits.

The decoder decodes a codeword from the codeword bitstream using the stored data structure specifying the partial values of the base codewords, the skip indicator, the values represented by the base codeword, and the lengths (i.e., number of bits) of the partial values of the base codewords. In general, a processor associated with a decoder, such as entropy decoding unit 52, searches the levels of the coding tree for a selected one of the partial values of the base codewords that is less than or equal to the codeword from the codeword bitstream. The processor skips a number of bits in the codeword bitstream before proceeding to a selected level of the coding tree in response to the skip indicator, and computes one of a plurality of values corresponding to the codeword based on a difference between the selected one of the partial values of the base codewords that is less than or equal to the codeword and the codeword and an index of the selected one of the partial values of the base codewords that is less than or equal to the codeword. The processor generates the result of the decoding for storage in memory, transmission to a different device or processing unit, or presentation to a user. For example, the decoded results may be used to drive display device 28 to present video or imagery and/or an audio output device to present audio or speech output.

In the example of TABLE 5, the decoder performs incremental updates of the bitstream buffer via the skip operation to retain codewords that otherwise would be lost when leading zeros are removed. In addition, base codeword values that the decoder compares at each level of the code can be much shorter. The potential amount of the reduction in base codeword value length will now be discussed. In order to analyze the dynamic range of such quantities in the modified algorithm described in this disclosure, the difference between 2 adjacent levels is considered as follows:

$$\text{lj\_base}[l] - \text{lj\_base}[l+i] = \left[\sum_{k=l+1}^{L} m_k 2^{l-k}\right] 2^{W-l} - \left[\sum_{k=l+i+1}^{L} m_k 2^{l+i-k}\right] 2^{W-l+i}$$

$$\leq 2^{W-l} + \sum_{k=l+1}^{L} m_k 2^{W-k} - \sum_{k=l+i+1}^{L} m_k 2^{W-k}$$

$$= 2^{W-l} + \sum_{k=l+1}^{l+i+1} m_k 2^{W-k}$$

If i is the index of the next non-empty level, then:

$$\text{lj\_base}[l] - \text{lj\_base}[l+i] = 2^{W-l} + m_{l+i} 2^{W-(l+i)}.$$

Here, the main quantity of interest is: $m_{l+i} 2^{-i}$, which influences this difference. In a simplest case, when i=1, it is clear that this difference simply depends on the number of external nodes, and hence, W can be chosen such that:

$$W \geq \max_l \log_2(m_l),$$

which in most practical cases is a significantly smaller quantity than L. This difference should be particularly large for highly unbalanced distributions.

For example, if the input symbols are blocks of m bits with Bernoulli probabilities $p^m(1-p)^{m-k}$, then the most populated level should contain approximately $\binom{m}{pm} \approx 2^{H(p)m}$ codewords, which means that approximately H(p)m bits should be used to differentiate between codewords, where H(p) is the entropy function, e.g., as described in T. Cover and J. Thomas, Elements of Information Theory, Wiley, 1991.

On the other hand, the longest codeword in this case will have approximately $$L \approx -\log\left(\min_k \{p^m(1-p)^{m-k}\}\right) = -\log(p_{\min})m = H_{-\infty}(p)m \text{ bits,}$$

where it is well-known that for asymmetric distributions:

$H_{-\infty}(p) > H(p)$ where $H_{-\infty}(p)$ is a special case of Renyi entropy, e.g., as described in W. Szpankowski, Average Case Analysis of Algorithms on Sequences. (New York, John Wiley & Sons, 2001). This difference can be arbitrarily large with p→0 or p→1.

Based on the above discussion, it follows that the proposed technique should be effective in handling large, asymmetric code structures. Such structures are traditionally difficult to work with using traditional/existing techniques, and in many cases engineers resort to using various simplifications that affect compression performance of codes to make them more practical.

For example, very popular Golomb codes, e.g., as described in S. Golomb, "Run-length coding," IEEE Trans. Inform. Theory, vol. IT-12, pp. 399-401, July 1966, and R. Gallager and D. van Voorhis, "Optimal source codes for geometrically distributed integer alphabets," IEEE Trans. Inform. Theory, vol. IT-21, pp. 228-230, March 1975, represent variable-length codes with a particularly simple structure, but they are optimal only for a class of geometric distributions and only for countably-many values of parameters of such distributions. Engineers tend to use them even for significantly divergent distributions, motivated mainly by complexity considerations. Such solutions can become both suboptimal and very difficult to extend or modify because of implicit performance constraints of such codes.

Another solution associated with design of Lynch-Davisson codes, as described in T. J. Lynch, Sequence time coding for data compression, Proc. IEEE (Lett.), 54 (1966) 1490-1491, and L. D. Davisson, Comments on Sequence time coding for data compression, Proc. IEEE (Lett.), 54 (1966) 2010-2011, is to split codes in two parts where only a first one is subject to variable-length encoding, and the remaining one is transmitted as an extension using a fixed number of bits. Unfortunately, there is a loss of efficiency in such a split, sometimes as large as 1.5-2 bits per symbols.

A more elaborate version of the codebook-splitting technique has been developed under the name of alphabet grouping, e.g., as described in Boris Ryabko, Jaakko Astola, Karen Egiazarian, Fast Codes for Large Alphabets, Communications in Information and Systems, v. 3, n. 2, pp. 139-152, and Boris Ryabko, Jorma Rissanen, Fast Adaptive Arithmetic Code for Large Alphabet Sources with Asymmetrical Distributions, IEEE Communications Letters, v. 7, no. 1, 2003, pp. 33-35. However, this approach also comes at the expense of some loss in compression efficiency.

Unlike the above-mentioned techniques, the techniques described in this disclosure may be configured to fully preserve the structure and optimality of the code, and therefore may be a useful tool for a wide variety of practical applications in data compression and encoding, such as in encoding and decoding of digital video, image, audio or speech data.

Binary Adaptive Block Coding

An example of a low complexity technique for adaptive variable length coding of binary sequences produced by memoryless sources, in accordance with a second general aspect of this disclosure, will now be described in greater detail. This disclosed technique may implement universal block codes constructed for a set of contexts identified by the numbers of non-zero bits in previous bits in a sequence. This second general aspect of the disclosure may be practiced or provided independently or in conjunction with the first general aspect described above with respect to generation of very compact data structures. The data structure may be any of a wide variety of data structures, such as tables, linked lists, binary trees, radix trees, flat files or the like, and may be stored in any of a variety of different memory devices, such as the many forms of random access memory (RAM), read only memory (ROM), or both. The data structure may be stored in such memory within an encoder or a decoder. In accordance with this second general aspect, a technique for low-complexity adaptive encoding and decoding may rely at least in part on a formula for asymptotic redundancy of such codes, which refines the estimate described in R. E. Krichevsky and V. K. Trofimov, The Performance of Universal Encoding, IEEE Trans. Information Theory, 27 (1981) 199-207.

Data compression algorithms convert input sequences of bits with some unknown distribution into a decodable bitstream. Data compression is used, for example, in the design of image or video codecs, scalable (bit-slice based) encoding of spectrum in audio codecs, and other applications. In most of such cases, the bits to be encoded are taken from values produced by various signal processing tools, such as transforms, prediction filters, and the like, which means that they are already well de-correlated, and that assumption of memorylessness of such a source is justified.

Most commonly used implementations of such binary adaptive algorithms are typically based on arithmetic codes, with some approximations and short-cuts applied to reduce their complexity. Two well known examples of such algorithms are the Q-coder algorithm described in W. B. Pennebaker, J. L. Mitchell, G. G. Langdon, Jr., R. B. Arps, An overview of the basic principles of the Q-Coder adaptive binary arithmetic coder, IBM J. Res. Dev., 32 (6) (1988) 717, which is used in the JBIG image coding standard, or the CABAC algorithm described in D. Marpe, H. Schwartz, and T. Wiegand, Context-Based Adaptive Binary Arithmetic Coding in the H.264/AVC video compression standard, IEEE Trans. on CSVT, 13(7):620 636, July 2003, which is used in the ITU-T H.264/MPEG AVC standards for video compression.

In accordance with this second general aspect of the disclosure, an alternative implementation uses an array of Huffman codes designed for several estimated densities and indexed by the numbers of non-zero bits in previous blocks (contexts) in a sequence. In terms of both efficiency and implementation, such a technique can achieve desirable compression performance using even modestly sized blocks of bits, e.g., n=8 . . . 16, and using corresponding amounts of memory, e.g., 1.5 kbytes . . . 5 kbytes.

This technique may be considered in the context of a memoryless source producing symbols from a binary alphabet {0,1} with probabilities p, and q=1−p correspondingly. If w is a word of length n produced by this source, then its probability is:

$$Pr(w) = p^k q^{n-k}, \quad (1)$$

where k denotes the number of 1's in this word. The value k may also be referred to as the weight of w.

A block code φ is an injective mapping between words w of length |w|=n and binary sequences (or codewords) φ (w):

$$\phi: \{0,1\}^n \to \{0,1\}^*,$$

where the codewords φ (w) represent a uniquely decodable set, e.g., as described in T. M. Cover and J. M. Thomas, Elements of Information Theory, (John Wiley & Sons, New York, 1991).

Typically, when the source (i.e., its probability p) is known, such a code is de-signed to minimize its average length or, in relative terms, its average redundancy:

$$R_\phi(n, p) = \frac{1}{n} \sum_{|w|=n} Pr(w)|\phi(w)| - H(p).$$

In the above equation, H(p)=−p log p−q log q denotes the entropy of the source.

Classical examples of codes and algorithms suggested for solving this problem include Huffman, Shannon, Shannon-Fano, and Gilbert-Moore codes, and their variants. Performance of such codes is well studied, and many useful practical implementation techniques for such codes have also been reported.

When the source is not known, the best option available is to design a universal code φ* that minimize the worst case redundancy for a class of sources, e.g., as described in B. M. Fiting of, Optimal Coding in the Case of Unknown and Changing Message Statistics, *Probl. Inform. Transm.*, 2, (2) (1965) 3{11 (in Russian) 1-7 (English Transl.), L. D. Davisson, Universal Noiseless Coding, *IEEE Trans. Inform. Theory*, 19 (6) (1973), 783-795, and R. E. Krichevsky and V. K. Trofimov, The Performance of Universal Encoding, *IEEE Trans. Information Theory*, 27 (1981) 199-207, and as indicated below:

$$R_{\phi^*}(n) = \inf_\phi \sup_p R_\phi(n, p).$$

An example of such a code can be constructed using the following estimates of word probabilities:

$$P_{KT}(w) = \frac{\Gamma(k+1/2)\Gamma(n-k+1/2)}{\pi \Gamma(n+1)},$$

where Γ(x) is a Γ-function, k is the weight of word w, and n is its length. The above formula is described in R. E. Krichevsky and V. K. Trofimov, The Performance of Universal Encoding, IEEE Trans. Information Theory, 27 (1981) 199-207, and ensures uniform (in ρ) convergence to true probabilities as n approaches infinity (n→∞).

In a situation in which the exact value of a parameter of the source is not known, it is possible to access a sequence of symbols u produced by this source in the past. Such a sequence may be referred to as a sample, and can be assumed to be |u|=t bits long. The task here is to design a set of codes φ*$_u$, indexed by different values of this sample, such that their resulting worst case average redundancy is minimal, as indicated below:

$$R_{\phi_u^*}(n, t) = \inf_{\{\phi_u\}} \sup_p \sum_{|u|=t} Pr(u) R_{\phi_u}(n, p).$$

Such codes are called sample-based or adaptive universal block codes. In this disclosure, particular implementations of adaptive block codes are described utilizing the following estimates of probabilities of words w given a sample u:

$$P_{KT}(w|u) = \frac{P_{KT}(uw)}{P_{KT}(u)} \quad (1)$$

$$= \frac{\Gamma(k+s+1/2)\Gamma(n+t-k-s+1/2)}{\Gamma(s+1/2)\Gamma(t-s+1/2)} \frac{\Gamma(t+1)}{\Gamma(n+1)},$$

where s is the weight of a sample u, and t is its length.

The concept and analysis of sample-based codes utilizing the estimator function (1) immediately above is described by R. E. Krichevsky in R. E. Krichevsky, Universal Data Compression and Retrieval. (Kluwer, Norwell, Mass., 1993). The average redundancy rate of an adaptive block code is asymptotically:

$$R_{\phi_u^*}(n, t) \sim \frac{1}{2n} \log \frac{n+t}{t}, \quad (2)$$

where n is a block size, and t is the size of samples.

From equation (2) above, it is evident that, by using samples of length t=O(n), it is possible to lower the redundancy rate of such codes to O(1/n), which matches the order of redundancy rate of block codes for known sources. However, in order to be able to understand the full potential of such codes, one needs to know a more exact expression for their redundancy, including terms affected by the choice of actual code-construction algorithm, such as Huffman, Shannon, or the like.

In accordance with this second general aspect, this disclosure offers the following refinement of Krichevsky's theorem 2. In particular, theorem 1 below refines the average redundancy rate theorem for an adaptive blocks code φ*$_u$ as follows:

Theorem 1: The average redundancy rate of an adaptive block code φ*$_u$ has the following asymptotic behavior (n, t→∞):

$$R_{\phi_u^*}(n, t, p) = \sum_{|u|=t} Pr(u) R_{\phi_u^*}(n, p) \quad (3A)$$

$$= \frac{1}{n} \left\{ \begin{array}{c} \frac{1}{2} \log \frac{t+n}{t} + \Delta_{\phi_u^*}(n, t, p) + \\ \frac{1-4pq}{24pq} \frac{n}{t(t+n)} - \\ \frac{1-3pq}{24p^2q^2} \frac{(n+2t)n}{t^2(t+n)^2} + O\left(\frac{1}{t^3} + \frac{1}{n^3}\right) \end{array} \right\},$$

wherein n is a block size, and t is a sample size, p, q=1−p are probabilities of symbols of the input source, and where:

$$\Delta_{\phi_u^*}(n, t, p) = \sum_{|u|=t} \sum_{|w|=n} Pr(u)Pr(w)[|\phi_u(w)| + \log P_{KT}(w|u)]$$

is the average redundancy of code $\phi^*_u$ with respect to the estimated distribution in equation (1) above.

Figure 5:
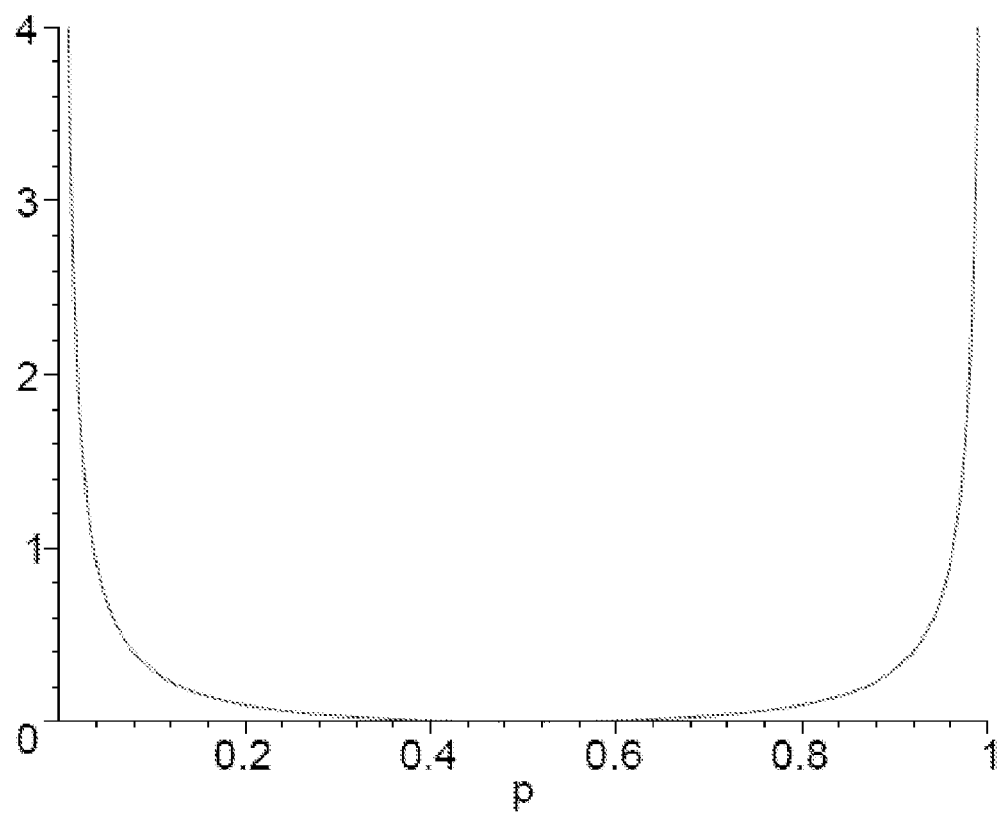
FIG. 5 is a graph illustrating the redundancy rate of an adaptive block code with an asymptotic behavior.

The exact behavior of $\Delta_{\phi_u^*}(n,t,p)$ is algorithm-specific. However, for a large class of minimum-redundancy techniques, which includes conventional Huffman and Shannon codes, this term is bounded in magnitude as follows:

$$|\Delta(n,t,S)| \leq 1,$$

and exhibits oscillating behavior, which may or may not be convergent to some constant depending on the value of the parameter p. Also, for short values of t and n, the redundancy of such codes can be affected by the next following term:

$$\frac{1-4pq}{24pq} \frac{n}{t(t+n)}$$

which is a function of the parameter of the source p. FIG. 5 is a graph illustrating the redundancy rate of an adaptive block code with an asymptotic behavior, and plots this quantity. For short blocks/samples, performance of such codes becomes sensitive to the asymmetry of the source. Proof of this theorem may be found, for example, in Asymptotic average redundancy of adaptive block codes, Y. A. Reznik, W. Szpankowski, Proceedings of IEEE International Symposium on Information Theory (ISIT), 2003.

Examples of efficient algorithms for implementing the codes described above will now be described. In a memoryless model, the probability of a word w (or its estimate) depends only on its weight k, but not an actual pattern of its bits. Hence, considering a set of all possible n-bit words, we can split the set it into n+1 groups:

$$\{0,1\}^n = W_{n,0} \cup W_{n,1} \cup \ldots \cup W_{n,k} \cup \ldots \cup W_{n,n},$$

containing words of the same weight (k=0, . . . n), and the same probability. The sizes of such groups are $|W_{n,k}|=\binom{n}{k}$. For further convenience, it is assumed that each group $W_{n,k}$ stores words in a lexicographic order. The value $I_{n,k}(w)$ denotes the index (position) of a word w in a group $W_{n,k}$. TABLE 6 below is an example of a code constructed for 4-bit blocks with Bernoulli probabilities: $p^k q^{n-k}$, p=0.9.

TABLE 6

Example of code constructed for 4-bit blocks with Bernoulli probabilities: $p^k q^{n-k}$, p = 0.9

| Block w | k | $I_{n,k}(w)$ | Pr(w) | Length | Code φ(w) | Sub-group |
|---|---|---|---|---|---|---|
| 0000 | 0 | 0 | 0.6561 | 1 | 1 | 0 |
| 0001 | 1 | 0 | 0.0729 | 3 | 001 | 1 |
| 0010 | 1 | 1 | 0.0729 | 3 | 010 | 1 |
| 0011 | 2 | 0 | 0.0081 | 6 | 000011 | 3 |
| 0100 | 1 | 2 | 0.0729 | 3 | 011 | 1 |
| 0101 | 2 | 1 | 0.0081 | 7 | 0000001 | 4 |
| 0110 | 2 | 2 | 0.0081 | 7 | 0000010 | 4 |
| 0111 | 3 | 0 | 0.0009 | 9 | 000000001 | 5 |
| 1000 | 1 | 3 | 0.0729 | 4 | 0001 | 2 |
| 1001 | 2 | 3 | 0.0081 | 7 | 0000011 | 4 |

TABLE 6-continued

Example of code constructed for 4-bit blocks with Bernoulli probabilities: $p^k q^{n-k}$, p = 0.9

| Block w | k | $I_{n,k}(w)$ | Pr(w) | Length | Code φ(w) | Sub-group |
|---|---|---|---|---|---|---|
| 1010 | 2 | 4 | 0.0081 | 7 | 0000100 | 4 |
| 1011 | 3 | 1 | 0.0009 | 9 | 000000010 | 5 |
| 1100 | 2 | 5 | 0.0081 | 7 | 0000101 | 4 |
| 1101 | 3 | 2 | 0.0009 | 9 | 000000011 | 5 |
| 1110 | 3 | 3 | 0.0009 | 10 | 0000000001 | 6 |
| 1111 | 4 | 0 | 0.0001 | 10 | 0000000000 | 7 |

The example code in TABLE 6 will be used to describe the structure of a proposed mapping between words in group $W_{n,k}$ and their codewords, in accordance with certain aspects of this disclosure. The code was constructed using a modification of Huffman's algorithm, in which additional steps were taken to ensure that codewords located at the same level have the same lexicographic order as input blocks that they represent. It is well-known that such a reordering is possible without any loss of compression efficiency. Examples of prior algorithms that have used this reordering concept include Huffman-Shannon-Fano codes and canonic codes described by Moffat and Turpin.

Figure 6:
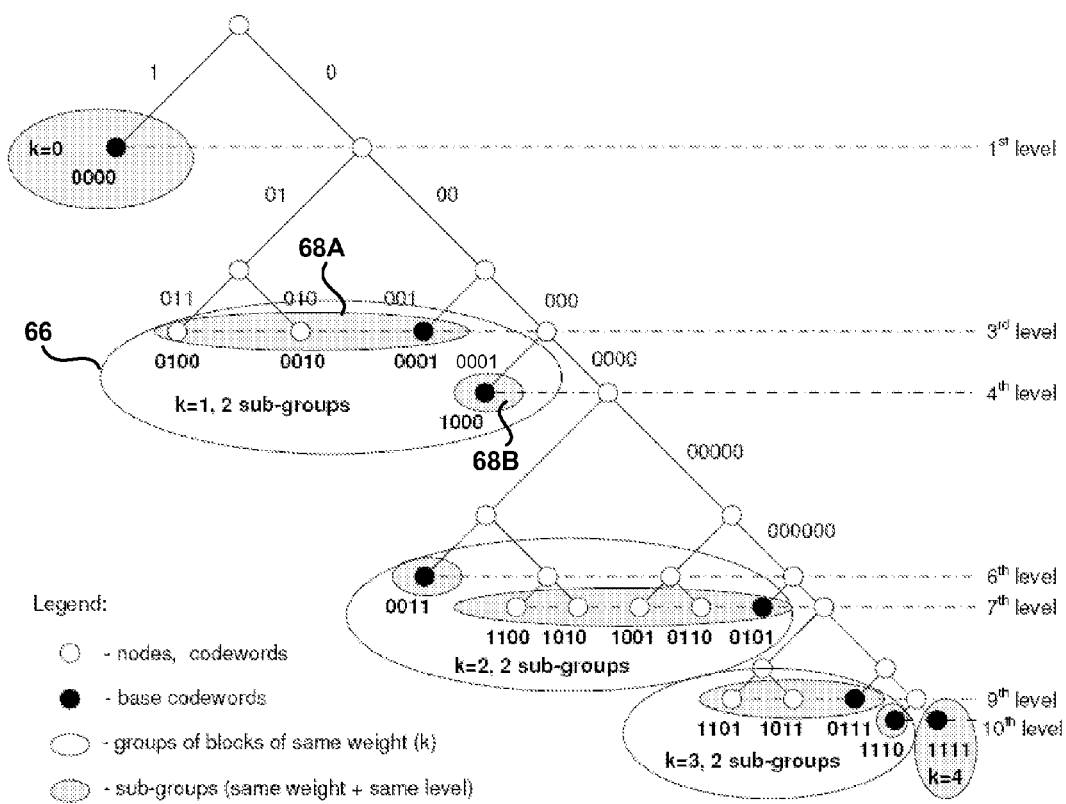
FIG. 6 is a diagram of a binary tree illustrating block groups, subgroups and base codewords.

FIG. 6 is a diagram illustrating a coding tree that depicts the structure of the example block code of TABLE 6. As expected, each group $W_{n,k}$ consists of at most two sub-groups containing codewords of the same length. In general, the code structure represented by the coding tree of FIG. 6 and the block codes of TABLE 6 defines groups of codewords, and first and second subgroups of codewords within each of the groups. Each of the groups includes codewords representing values having same weights. The first subgroup includes codewords having a first length and the second subgroup includes codewords having a second length different form the first length. The codewords in each of the groups are ordered lexicographically with respect to the values represented by the codewords to facilitate encoding and decoding by direct computation.

An example of a group is designated by reference numeral 66 in FIG. 6. Examples of first and second sub-groups are designated by reference numerals 68A, 68B, respectively in FIG. 6. Similar groups and sub-groups are provide for each weight within the coding tree. A group contains blocks having the same weight k. A sub-group contains blocks having the same weight and same level in the coding tree. This follows from the fact that all words in a group $W_{n,k}$ have the same probability and so-called sibling property of Huffman codes. This observation also holds true for Shannon codes, generalized Shannon codes, and possibly other algorithms. As mentioned above, a group $W_{n,k}$ includes at most two sub-groups containing codewords of the same length, and can be represented as:

$$W_{n,k} = W_{n,k,l} \cup W_{n,k,l+1},$$

where l is the shortest code length that can be assigned to blocks from group $W_{n,k}$. Moreover, because words within group $W_{n,k}$ follow lexicographic order, then the split between $W_{n,k,l}$ and $W_{n,k,l+1}$ is simply:

$$W_{n,k,l} = \{w \in W_{n,k} : I_{n,k}(w) < n_k\},$$

$$W_{n,k,l+1} = \{w \in W_{n,k} : I_{n,k}(w) \geq n_k\},$$

where $n_k$ denotes the size of a subgroup with shorter codewords. Hence, if a first subgroup has three codewords with a length of 3 and a second subgroup in the same group has one codeword with a length of 4, then $n_k$ (the size of the subgroup with the shorter codewords, i.e., the first subgroup) is equal to 3. This example corresponds to the subgroups in the group associated with levels 3 and 4 of the coding tree of FIG. 6, where subgroup 68A has codewords 001, 010 and 011 with lengths of three each, and subgroup 68B has codeword 0001 with a length of four.

The lexicographically smallest codewords in each subgroup may be referred to as base codewords, e.g., as described above with respect to a first aspect of this disclosure, and may be represented as:

$$B_{n,k,l} = \phi(w_0),$$

$$B_{n,k,l+1} = \phi(w_{n_k}),$$

where $w_i$ is the i-th block in group $W_{n,k}$. Note that, as explained above, the remaining codewords in both subgroups can be computed as follows:

$$\phi(w_i) = \begin{bmatrix} B_{n,k,\ell} + i, & \text{if } i < n_k, \\ B_{n,k,\ell+1} + i - n_k, & \text{if } i \geq n_k. \end{bmatrix}$$

As an illustration, it is assumed that there is a first subgroup 68A with three codewords of length 3 and a second subgroup 68B with one codeword of length 4, e.g., as in the example of levels 3 and 4 of the coding three of FIG. 6. In this case, if the position of a given block is i=2, then i<$n_k$ ($n_k$ being equal to 3), and the resulting codeword is the applicable base codeword+i. In this example, the base codeword for the subgroup is 001, and the resulting codeword is 001+2=011. For levels 3 and 4 of the coding tree of FIG. 6, if the position of the applicable codeword was i>=$n_k$, then the codeword would be in the second subgroup and would be equal to the base codeword of 0000+i-$n_k$, which is equal to 0000+4-3=0001.

Base codewords are only defined by non-empty subgroups, and the number of such subgroups S in a tree constructed for n-bit blocks is within:

$$n+1 \leq S \leq 2n.$$

In addition, multiple subgroups can reside on the same level and the number of such collocated sub-groups cannot be greater than n+1. At the $10^{th}$ level of the tree in FIG. 6, for example, there are two sub-groups corresponding to codewords 1110 and 1111. However, these sub-groups do not belong to the same group. This is a significant difference from other algorithms, which assign unique base codewords for each level but then require O(n$2^n$)-large reordering table to work with such codes. In the present case, the entire structure is O($n^2$) bits large.

In general, this code structure defines groups W and subgroups S. Each of the groups includes codewords representing values having same weights. The codewords in each of the groups are ordered lexicographically with respect to the values represented by the codewords. In addition, the first subgroup in each group includes codewords having a first length and the second subgroup includes codewords having a second length different form the first length. The code structure may be represented by a data structure that can be accessed by an encoder to perform variable length coding. The disclosure contemplates use of such a code structure in variable length encoding or decoding, as well as a computer-readable medium comprising a data structure that defines such a code structure.

Given the discussion above, a simple algorithm for direct computation of block codes will now be described. It is assumed that parameters $n_k$ (0≤k≤n) are available, and that a level 1 and base codeword $B_{n,k,l}$ can be obtained for each non-empty sub-group. Then, the process of encoding a block w can be accomplished essentially by a set of the following steps:

1. Given a block w, obtain its weight k and index $I_{n,k}(w)$.
2. If $I_{n,k}(w) < n_k$, select the first subgroup $W_{n,k,l}$; otherwise, select the second subgroup $W_{n,k,l+1}$.
3. Then, retrieve the base codeword ($B_{n,k,l}$ or $B_{n,k,l-1}$) for the selected subgroup ($W_{n,k,l}$ or $W_{n,k,l+1}$), and compute the pertinent code according to the following equation:

$$\phi(w_i) = \begin{bmatrix} B_{n,k,\ell} + i, & \text{if } i < n_k, \\ B_{n,k,\ell+1} + i - n_k, & \text{if } i \geq n_k. \end{bmatrix} \quad (13)$$

According to the above equation, if the position i=$I_{n,k}(w)$ of the block w in the selected subgroup ($W_{n,k,l}$ or $W_{n,k,l+1}$) is less than the number $n_k$ of blocks in the subgroup, then the codeword is $B_{n,k,l}$+i. Alternatively, if the position i of the block w in the selected subgroup ($W_{n,k,l}$ or $W_{n,k,l+1}$) is greater than or equal to the number $n_k$ of blocks in the subgroup, then the codeword is $B_{n,k,l+1}$+i-$n_k$.

As described previously, as an illustration, for levels 3 and 4 of the coding tree of FIG. 6, the above process yields a codeword of 011 when the position of a given block code is i=2<$n_k$, and a codeword of 0001 when the position of a given block code is i=3>=$n_k$. In this example, $n_k$ is 3, i.e., the number of codewords in the first subgroup 68A for the weight k=1. The order of position i proceeds lexicographically starting with the base codeword, e.g., from 0 to 3 in the case of weight k=1 in the example of FIG. 6. In particular, position 0 corresponds to the base codeword 001, position 1 corresponds to codeword 010 position 2 corresponds to codeword 011, all in the first subgroup 68A (i<$n_k$) and position 3 corresponds to codeword 0001 in subgroup 68B (i>=$n_k$).

This process can be readily accomplished by ensuring that codewords located at the same level are reordered so that they have the same lexicographic order as input blocks that they represent. For example, the codewords described above follow the lexicographic order of the input blocks 0001, 0010, 0100, and 1000. Then, the lexicographically smallest codewords in each subgroup, e.g., 001 in subgroup 68A or 0001 in subgroup 68B, can be used as base codewords for purposes of the codeword computation described above. C language program code representing an example implementation of a process for direct construction of block codes as described above is set forth in TABLE 7 below.

TABLE 7

Process for direction construction of block codes

```
/* encoder structure; */
typedef struct {
   unsigned short  nk[N+1];     /* # of elements in first (n,k)
                                   subgroup */
   unsigned char   sg[N+1][2];  /* (k,j) -> subgroup index mapping */
   unsigned char   len[S];      /* subgroup -> code length mapping */
   unsigned int    base[S];     /* subgroup -> base codeword
                                   mapping */
} ENC;
/* block encoder; */
unsigned block_enc (unsigned w, ENC *enc, BITSTREAM *bs)
{
   unsigned i, j, k, len, code;
```

TABLE 7-continued

Process for direction construction of block codes

```
k = weight(w);              /* split w into (k,index) */
i = index(n,k,w);
if (i >= enc->nk[k]) {      /* find subgroup containing w */
    i -= enc->nk[k];
    j = enc->sg[k][1];      /* adjust index */
} else
    j = enc->sg[k][0];
code = enc->base[j] + i;    /* generate code */
len = enc->len[j];
put_bits(code, len, bs);    /* write code to bitstream */
return k;
}
```

In the above C-language code, the value k indicates the weight of a block w, the value i indicates the position ($I_{n,k}(w)$) of the block within a group with weight k, and $n_k[k]$ indicates the number of codewords in the first subgroup of the group with weight k. If i is greater than or equal to nk[k] then i is decremented to adjust the index, and the subgroup is set to the second subgroup (1) for the applicable weight k. This second subgroup is identified by j=sg[k][1]. If i is less than nk[k], i is not decremented and the subgroup is set to the first subgroup (0) for the applicable weight k. This first subgroup is identified by j=sg[k][0].

Then, the codeword is generated as a sum of the base codeword for the applicable subgroup j (base[j]) and the value of i. For the example of FIG. 6, if the value of i is 2, then the code would be the sum of the base codeword 001 for subgroup 68A and the value of i (2), which is equal to 001+010=011. With reference to equation (13) above, depending on the subgroup, the base codeword is either $B_{n,k,l}$ or $B_{n,k,l+1}$, and the value of i is either i or i−nk[k]. Hence, the above code generally corresponds to the result provided by equation (13). Upon computing the codeword (code), the length (len) of the codeword is specified as len[j], which is the code length for the appropriate subgroup, where the second subgroup has a code length that is one greater than the first subgroup. Then, the encoding process writes the codes to the bitstream via the operation put_bits(code, len, bs), which writes the value of code and len to bitstream bs. The bitstream is transmitted for decoding by another device. The process returns the weight k for calculation of the next codeword.

The encoding process outlined above may involve selecting one of the groups based on the weight of the value to be encoded, selecting one of the subgroups based on the lexicographic position of the value to be encoded relative to the number of codewords in the first subgroup of the selected group, selecting one of the codewords in the selected subgroup based on the base codeword for the selected subgroup and the lexicographic position of the value to be encoded, and encoding the value to be encoded with the selected codeword. The base codewords for each of the subgroups, positions of codewords within each of the groups, number of codewords within each of the first subgroups, and lengths of the codewords within each of the subgroups may be stored in a data structure that can be accessed by an encoder to support variable length coding.

From a memory standpoint, a process as shown in TABLE 7 needs only S base codewords (O(n)-bit long), n+1 values nk (O(n)-bit long), S code lengths (O(log n)-bit long), and 2(n+1) subgroup indices (O(log n)-bit long). Additional memory reduction is possible by storing incremental values of base codewords as discussed elsewhere in this disclosure. Given that S=O(n), the entire data structure needs only O(n²) bits. In a particular implementation shown in TABLE 7, assuming, e.g., that n=20 and S=32, the size of this data structure becomes less than 244 bytes. This is far less than the 220 words that would be needed to present this code in the form of a direct table. For reasonably short blocks, e.g., n<=12 . . . 16, computation of weights and indices (functions weight(.) and index(. , .) in the process of TABLE 7) can be a matter of a single lookup. In this case, the entire encoding process may need at most one comparison, two additions and four lookups.

For larger blocks, the following well known combinatorial formula can be used:

$$I_{n,k}(w) = \sum_{j=1}^{n} w_j \binom{n-j}{\sum_{k=j}^{n} w_k},$$

where $w_j$ represent individual bits of the word w, and it is assumed that $\binom{n}{k}=0$ for all k>n. In order to implement this formula, one could either pre-compute all binomial coefficients up to level n in Pascal's triangle, or compute them dynamically, using the following simple identities:

$$\binom{n-k}{k-1} = \frac{k}{n}\binom{n}{k}, \text{ and } \binom{n-k}{k} = \frac{n-k}{n}\binom{n}{k}.$$

The implementation based on pre-computed coefficients requires $$\frac{n(n+1)}{2} = O(n^2)$$

words (O(n3) bits) of memory, and O(n) additions. Dynamic computation of coefficients will require O(n) additions, multiplications and divisions. However, the entire process may require only a few registers and no static memory. Additional discussion of complexity of index computation can be found in T. Tjalkens, Implementation cost of the Huffman-Shannon-Fano code, in Proc. Data Compression Conference (DCC'05) (Snowbird, Utah, Mar. 29-31, 2005) 123-132.

An example of the design of a decoder implementing the above techniques will now be described. Like an encoding process as described above, a decoding process may make use of parameters $n_k$, base codewords and associated lengths. For convenience, the following discussion will rely on left-justified versions of base codeword values:

$$B_{n,k,l}^{lj} = B_{n,k,l} 2^{T-l},$$

where T is the length of a machine word (T>max l). Then, an exemplary decoding process can be described as follows:
1. Find top-most subgroup with $B_{n,k,l}^{lj}$ being less than T bits in bitstream;
2. Decode index of a block $I_{n,k}(w)$ based on equation (13) above; and
3. Produce reconstructed block using it weight k and index.

C language code representing an example implementation of a decoding process as described above is provided in TABLE 8 below.

TABLE 8

Decoding of block codes

```
/* decoder structure: */
typedef struct {
    unsigned short  nk[N+1];      /* # of elements in first (n,k)
                                     subgroup */
    struct {unsigned char k:7,j:1;} kj[S]; /* subgroup -> (k,j) mapping */
    unsigned char   len[S];       /* subgroup -> code length mapping */
    unsigned int    lj_base[S];   /* subgroup -> left-justified
                                     codewords */
} DEC;
/* block decoder: */
unsigned block_dec (unsigned *w, DEC *dec, BITSTREAM *bs)
{
    unsigned i, j, k, len, val;
    val = bitstream_buffer(bs);
    for (j=0; dec->lj_base[j]>val; j++) ; /* find a subgroup */
    len = dec->len[j];
    scroll_bitstream(len, bs);    /* skip decoded bits */
    i = (val - dec->lj_base[j]) >> (32-len);
    k = dec->kj[j].k;             /* get weight */
    j = dec->kj[j].j;             /* get sub-group index */
    if (j)                         /* reconstruct index */
        i += dec->nk[k];
    *w = word(n,k,i);             /* generate i-th word in (n,k) group */
    return k;
}
```

The example decoding process shown in TABLE 8 makes use of left-justified base codewords lj_base[S]. In operation, the decoding process receives the contents val of the bitstream buffer and identifies a subgroup within the coding tree having a base codeword corresponding to the bitstream buffer contents val. For example, the process continues to traverse downward through the subgroups at different levels in the coding tree so long as the base codewords are greater than the received codeword val. When a subgroup with a base codeword that is less than or equal to val is reached, however, that subgroup is selected. Upon finding the appropriate subgroup, the process determines the code length for the subgroup and then scrolls the bitstream by that length to skip the decoded bits, and isolate the codeword. The decoding process determines the index position i of the codeword within the subgroup by subtracting the base codeword value from the bitstream buffer contents.

If the codeword is 011 and the base codeword is 010, for example, then the result of this difference is 2, indicating that the codeword is in position 2 among possible positions 0, 1, and 2 in the subgroup. For the example of a 32-bit wide register, this difference may be shifted to right by 32 minus the code length len. The decoding process then retrieves the pertinent weight k and sub-group index j, and reconstructs the index i. The process then generates the i-th word in the selected group as the code word, and returns the weight k. The expression kj[j].k returns the weight of the subgroup, and the expression kj[j].j returns the index of the subgroup as either a 0 or a 1, indicating either the first subgroup (0) or the second subgroup (1) for the given weight. If the second subgroup is selected such that j=1, then the index i is adjusted by adding the value of nk[k]. Otherwise, the index i is not adjusted if the first subgroup is selected. The function word( ) returns the ith word in the n,k group as the decoded word value, e.g., using equation (13) above.

In general, an encoder may perform variable length coding according the code structure described above, wherein the code structure defines groups and subgroups. Again, each of the groups includes codewords representing values having same weights. The codewords in each of the groups are ordered lexicographically with respect to the values represented by the codewords. In addition, the first subgroup in each group includes codewords having a first length and the second subgroup includes codewords having a second length different form the first length.

The code structure may be represented by a data structure that can be accessed by an encoder or decoder to perform variable length coding. As described above, the data structure may specify base codewords for each of the subgroups, positions of codewords within each of the groups, a number of codewords within each of the first subgroups, and lengths of the codewords within each of the subgroups. This data structure may be stored in a memory associated with one of a video encoder, an image encoder, an audio encoder, a speech encoder, a video decoder, an image decoder, and audio decoder, or a speech decoder, and accessed as need to support coding operations.

As described above, a decoder such as entropy decoding unit 52 may select, in a top-down (from top to bottom) search of the coding tree, selecting a first one of the subgroups with a base codeword that is less than or equal to the codeword to be decoded. Then, the decoder may determine the position of the codeword to be decoded within the selected subgroup, i.e., the subgroup index, based on a difference between the codeword to be decoded and the base codeword for the selected subgroup. The decoder determines the weight of the value represented by the codeword to be decoded based on the group in which the selected subgroup resides, and determines the position, i.e., group index, of the codeword within the group in which the selected subgroup resides based on whether the selected subgroup is the first subgroup or the second subgroup for the group. The decoder then selects one of the values based on the weight of the value represented by the codeword to be decoded and the position of the codeword within the group in which the selected subgroup resides, and decoding the codeword to be decoded with the selected value. The value may correspond, for example, to one of the block codes in TABLE 6.

The code structure and data structure contemplated in accordance with this aspect of the disclosure may support efficiency in terms of computational overhead, memory utilization, and processing time. The example decoding process of TABLE 8, for example, requires between 1 and S comparisons and lookups to find a subgroup, one or two additions, one shift operation, one extra comparison, and three extra lookups. The number of steps needed for finding a subgroup can be further reduced by placing base codewords in a binary search tree or using an extra lookup table, but in both cases at the expense of extra memory.

At the end of the decoding process, as described above, the weight k and index $I_{n,k}(w)$ for a codeword are converted into actual values (e.g., by function word( ) in TABLE 8). If blocks are reasonably short, this can be accomplished by a simple lookup. Otherwise, the word can be synthesized by using an enumeration formula, e.g., as described in D. A. Huffman, A method for the construction of minimum-redundancy codes. Proc. IRE, 40 (September 1952) 1098-1101. From a complexity perspective, this process is similar to index computation in the encoder.

Using the above-described encoding and decoding processes, a system for adaptive encoding and decoding of blocks of data can be defined. For this example, it is assumed that input blocks can be encoded under the following conditions:

1. There is no context, i.e., a universal code is implemented;
2. The context is given by one previously observed block, i.e., t=n; and
3. The context is given by two previously observed blocks, i.e., t=2n.

Instead of using actual blocks as contexts, it is sufficient (due to the memoryless nature of the source) to use their weights. This means that, for t-bit samples, there is provided an array of t+1 code structures indexed by their weights s. To further save space, symmetry of KT-distributions with respect to s and k can be used. In particular, the process may replace s=t−s and flip bits (i.e., force k=n−k) every time when s>t/2. In this manner, it is only necessary to define t/2+1 tables. In this example, the overall amount of memory needed by the adaptive code becomes 1+n/2+1+n+1=1.5n+3 tables. Specific memory estimates for block sizes n=8 . . . 20, are shown in TABLE 9 below.

TABLE 9

Memory usage estimates [in bytes] for different block sizes

| n | max t | max S | Size of a single table | Tables for all contexts |
|---|---|---|---|---|
| 8 | 16 | 14 | 102 | 1530 |
| 12 | 24 | 19 | 140 | 2940 |
| 16 | 32 | 25 | 184 | 4968 |
| 20 | 40 | 20 | 216 | 7128 |

The above tables were generates using KT-estimated densities, and using a modified Huffman code construction algorithm in accordance with this disclosure. Set forth below is an example of computer code for a program implementing an adaptive block coder as described in this disclosure.

```
/* bitstream.h: */
typedef struct _BITSTREAM BITSTREAM;
void bitstream_open(BITSTREAM *p, unsigned char *pbs, unsigned bit_offset, int read);
void bitstream_close(BITSTREAM *p, unsigned char **p_pbs, unsigned *p_bit_offset, int write);
void put_bits(unsigned bits, int len, BITSTREAM *p);
unsigned bitstream_buffer(BITSTREAM *p);
void scroll_bitstream(int len, BITSTREAM *p);
/* blade.h: */
/* encoder functions: */
void blade_enc_init(void);
unsigned blade_enc_0(unsigned block, BITSTREAM *bs);
unsigned blade_enc_1(unsigned block, unsigned cx, BITSTREAM *bs);
unsigned blade_enc_2(unsigned block, unsigned cx1, unsigned cx2, BITSTREAM *bs);
/* decoder functions: */
void blade_dec_init(void);
unsigned blade_dec_0(unsigned *block, BITSTREAM *bs);
unsigned blade_dec_1(unsigned *block, unsigned cx, BITSTREAM *bs);
unsigned blade_dec_2(unsigned *block, unsigned cx1, unsigned cx2, BITSTREAM *bs);
/* blade_12.c: implements 12-bit BLADE encoder/decoder */
#define N    12     /* block size */
#define SGS 19      /* max # of subgroups */
/* encoder structure: */
typedef struct {
    unsigned short  nk [N+1];     /* # of elements in first (n,k) subgroup */
    unsigned char   len [SGS];    /* subgroup -> code length mapping */
    unsigned char   sg [N+1][2];  /* (k,j) -> subgroup index mapping */
    unsigned int    base [SGS];   /* subgroup -> base codeword mapping */
} BLADE_ENC;
/* w -> (k,index) mapping: */
static struct {unsigned short k:4, i:12;} w_ki[1<<N];
/*
 * BLADE encoder:
 * Returns:
 * #   of bits set in encoded pattern
 */
unsigned blade_enc (unsigned w, BLADE_ENC *enc, BITSTREAM *bs)
{
    unsigned i, j, k, len, code;
    k = w_ki[w].k;              /* split w into (k,index) */
    i = w_ki[w].i;
    if (i >= enc->nk[k]) {      /* find subgroup containing w */
        i -= enc->nk[k];        /* adjust index */
        j = enc->sg[k][i];
    } else
        j = enc->sg[k][0];
    code = enc->base[j] + i;    /* generate code */
    len = enc->len[j];
    put_bits(code, len, bs);
    return k;
}
/* decoder structure: */
typedef struct {
    unsigned int    sgs;          /* number of subgroups */
    unsigned short  nk [N+1];     /* # of elements in first (n,k) subgroup */
    unsigned char   len [SGS];    /* subgroup -> code length mapping */
```

```
    struct {unsigned char k:7,j:1;} kj [SGS]; /* subgroup -> (k,j) mapping */
    unsigned int    lj_base [SGS];  /* subgroup -> left-justified codewords */
} BLADE_DEC;
/* (k,index) -> w mapping:*/
static unsigned short *ki_w[N+1], _w[1<<N];
/*
 * BLADE decoder:
 * Returns:
 * #   of bits set in encoded pattern
 */
unsigned blade_dec (unsigned *w, BLADE_DEC *dec, BITSTREAM *bs)
{
    unsigned i, j, k, len, val;
    val = bitstream_buffer(bs);
    for (j=0; j<dec->sgs; j++)      /* find subgroup */
        if (dec->lj_base[j] <= val)
            break;
    len = dec->len[j];
    scroll_bitstream(len, bs);      /* skip decoded bits */
    i = (val - dec->lj_base[j]) >> (32-len);
    k = dec->kj[j].k;
    j = dec->kj[j].j;
    if (j)                          /* convert to (n,k)-group's index */
        i += dec->nk[k];
    *w = ki_w[k][i];                /* produce reconstructed block */
    return k;
}
/***********************************************
 * Pre-computed BLADE decoder tables:
 */
static BLADE_DEC dec_t [1+(N/2+1)+(N+1)] = {
    { /* no context/ universal code: */ 15,
    {1,12,66,92,495,792,924,792,495,122,66,12,1}, {3,3,7,7,10,10,11,11,12,12,13,13,14,14,14},
    {{0,0},{12,0},{1,0},{11,0},{2,0},{10,0},{3,0},{9,0},{3,1},{9,1},{4,0},{8,0},{5,0},{6,0},{7,0}},
    {0xE0000000,0xC0000000,0xA8000000,0x90000000,0x7F800000,0x6F000000,0x63800000,0x54400000,
    0x4C400000,0x46200000,0x36A80000,0x27300000,0x1AD00000,0x0C600000,0x00000000} },
    { /* (12,0): */ 17,
    {1,8,66,64,495,792,924,792,334,220,66,11,1}, {1,5,6,9,12,13,15,17,19,20,21,22,22,23,23,24,24},
    {{0,0},{1,0},{1,1},{2,0},{3,0},{3,1},{4,0},{5,0},{6,0},{7,0},{8,0},{8,1},{9,0},{10,0},{11,0},{11,1},{12,0}},
    {0x80000000,0x40000000,0x30000000,0x0F000000,0x0B000000,0x06200000,0x02420000,0x00B60000,
    0x00428000,0x00110000,0x00069000,0x00040000,0x00009C00,0x00001800,0x00000200,0x00000100,0x00000000} },
    { /* (12,1): */ 16,
    {1,12,17,220,495,792,924,340,495,220,66,10,1}, {2,5,8,9,11,13,15,16,17,18,18,19,19,19,19,20},
    {{0,0},{1,0},{2,0},{2,1},{3,0},{4,0},{5,0},{6,0},{7,0},{7,1},{8,0},{9,0},{10,0},{11,0},{12,0},{11,1}},
    {0xC0000000,0x60000000,0x4F000000,0x36300000,0x1B000000,0x0B980000,0x05590000,0x01BC0000,
    0x00112000,0x00A10000,0x00254000,0x0009C000,0x00018000,0x00004000,0x00002000,0x00000000} },
    { /* (12,2): */ 15,
    {1,12,66,211,495,792,924,792,486,220,66,12,1}, {3,6,8,10,11,12,14,15,16,16,17,17,17,17,17},
    {{0,0},{1,0},{2,0},{3,0},{3,1},{4,0},{5,0},{6,0},{7,0},{8,0},{8,1},{9,0},{10,0},{11,0},{12,0}},
    {0xE0000000,0xB0000000,0x6E000000,0x39400000,0x38200000,0x19300000,0x00D00000,0x05980000,
    0x02800000,0x009A0000,0x00958000,0x00278000,0x00068000,0x00006000,0x00000000} },
    { /* (12,3): */ 16,
    {1,12,30,220,495,792,924,792,19,220,6,12,1}, {4,6,6,9,10,12,13,14,14,14,14,14,14,15,15,15},
    {{0,0},{1,0},{2,0},{2,1},{3,0},{4,0},{5,0},{6,0},{7,0},{8,0},{10,0},{11,0},{12,0},{8,1},{10,1},{9,0}},
    {0xF0000000,0xC0000000,0xA2000000,0x90000000,0x59000000,0x3A100000,0x21500000,0x12E00000,
    0x06800000,0x06340000,0x061C0000,0x05E00000,0x05E80000,0x02300000,0x01B80000,0x00000000} },
    { /* (12,4): */ 16,
    {1,12,66,220,495,303,924,792,495,219,66,4,1}, {5,7,9,10,12,12,12,12,13,13,13,13,13,13,14,14},
    {{0,0},{1,0},{2,0},{3,0},{4,0},{5,0},{11,0},{12,0},{6,1},{11,1},{6,0},{7,0},{9,0},{10,0},{9,1},{8,0}},
    {0xF8000000,0xE0000000,0xBF000000,0x88000000,0x69100000,0x56200000,0x55E00000,0x56D00000,
    0x46890000,0x46480000,0x29680000,0x10A80000,0x09D00000,0x07C00000,0x07BC0000,0x00000000} },
    { /* (12,5): */ 15,
    {1,12,66,220,495,792,509,792,350,220,66,12,1}, {6,8,10,10,11,11,12,12,12,12,12,12,13,13,13},
    {{0,0},{1,0},{2,0},{12,0},{3,0},{11,0},{4,0},{5,0},{6,0},{8,0},{9,0},{10,0},{6,1},{8,1},{7,0}},
    {0xF0000000,0xF0000000,0xDF800000,0xDF400000,0xC3C00000,0xC2400000,0xA3500000,0x71D00000,
    0x63000000,0x3C200000,0x2E600000,0x2A400000,0x1D480000,0x18C00000,0x00000000} },
    { /* (12,6): */ 15,
    {1,12,86,47,495,792,924,792,495,85,66,12,1}, {8,8,9,9,11,11,11,11,12,12,12,12,12,12,13},
    {{0,0},{12,0},{1,0},{11,0},{2,0},{3,0},{9,0},{10,0},{3,1},{9,1},{4,0},{5,0},{7,0},{8,0},{6,0}},
    {0xFF000000,0xFE000000,0xF8000000,0xF3000000,0xE0000000,0xE3E00000,0xD9400000,0xD1000000,
    0xC6300000,0xBDC00000,0x9ED00000,0x6D500000,0x3BD00000,0x1CE00000,0x00000000} },
    { /* (24,0): */ 19,
    {1,12,25,220,487,791,924,787,494,220,66,11,1}, {1,5,9,10,13,16,17,18,20,22,24,25,26,27,28,30,31,33,32},
    {{0,0},{1,0},{2,0},{2,1},{3,0},{4,0},{4,1},{5,0},{5,1},{6,0},{7,0},{7,1},{8,0},{8,1},{9,0},{10,0},{11,0},{11,1},{12,0}},
    {0x80000000,0x30000000,0x13600000,0x09400000,0x03600000,0x00790000,0x00750000,0x00122000,0x00121000,
    0x0003A000,0x00008D00,0x00008A80,0x00000F00,0x000000EE0,0x00000120,0x00000018,0x00000002,0x00000001,0x00000000} },
    { /* (24,1): */ 17,
    {1,7,66,220,495,326,924,792,495,4,66,11,1}, {1,5,6,9,12,15,17,18,20,22,23,24,25,26,27,28,28},
    {{0,0},{1,0},{1,1},{2,0},{3,0},{4,0},{5,0},{5,1},{6,0},{7,0},{8,0},{9,0},{9,1},{10,0},{11,0},{11,1},{12,0}},
```

```
{0x80000000,0x45000000,0x34000000,0x13000000,0x05400000,0x01620000,0x00BF0000,0x004A8000,
0x0010C000,0x00046000,0x00008200,0x00007E00,0x00001200,0x00000180,0x00000020,0x00000010,0x00000000} },
  { /* (24,2): */ 17,
  {1,12,47,220,495,792,924,1,495,220,58,11,1}, {2,5,8,9,11,14,16,18,19,20,21,22,23,24,25,25},
  {{0,0},{1,0},{2,0},{2,1},{3,0},{4,0},{5,0},{6,0},{7,0},{7,1},{8,0},{9,0},{10,0},{10,1},{11,0},{11,1},{1
  {0x00000000,0x6000000,0x31000000,0x27600000,0x00000000,0x04440000,0x01200000,0x00450000,
0x0044E000,0x00137000,0x0003F800,0x00008600,0x00001400,0x00000000,0x00000100,0x00000080,0x00000000} },
  { /* (24,3): */ 17,
  {1,6,66,1,495,4,924,792,495,220,66,7,1}, {2,5,6,8,10,11,13,14,15,16,18,19,20,21,21,22,22},
  {{0,0},{1,0},{1,1},{2,0},{3,0},{3,1},{4,0},{5,0},{5,1},{6,0},{7,0},{8,0},{9,0},{10,0},{11,0},{11,1},{12
  {0x00000000,0x90000000,0x78000000,0x36000000,0x35000000,0x1A600000,0x0AE60000,0x0AD80000,
0x04E00000,0x01140000,0x004E0000,0x00102000,0x00026000,0x00005000,0x00001800,0x00000400,0x00000000} },
  { /* (24,4): */ 15,
  {1,12,66,220,495,10,924,792,495,220,66,7,1}, {3,6,8,10,12,13,14,15,16,17,18,19,19,20,20},
  {{0,0},{1,0},{2,0},{3,0},{4,0},{5,0},{5,1},{6,0},{7,0},{8,0},{9,0},{10,0},{11,0},{11,1},{12,0}},
  {0xE0000000,0xB0000000,0x6E000000,0x37000000,0x18100000,0x17000000,0x0B880000,0x04500000,
0x01380000,0x00408000,0x00098000,0x00014000,0x00006000,0x00001000,0x00000000} },
  { /* (24,5): */ 16,
  {1,12,66,220,495,792,451,792,2,220,66,11,1}, {4,6,8,10,12,13,14,15,16,16,17,17,18,18,19,19},
  {{0,0},{1,0},{2,0},{3,0},{4,0},{5,0},{6,0},{6,1},{7,0},{8,0},{8,1},{9,0},{10,0},{11,0},{11,1},{12,0}},
  {0xF0000000,0xC0000000,0x7E000000,0x47000000,0x28100000,0x0F500000,0x08440000,0x04920000,
0x017A0000,0x01780000,0x00818000,0x00138000,0x00030000,0x00004000,0x00002000,0X00000000} },
  { /* (24,6) */ 17,
  {1,8,65,220,2,792,924,792,495,220,59,12,1}, {4,6,7,8,9,10,11,12,13,14,15,16,16,16,17,17,17},
  {{0,0},{1,0},{1,1},{2,0},{2,1},{3,0},{4,0},{4,1},{5,0},{6,0},{7,0},{8,0},{9,0},{10,0},{10,1},{11,0},{12
  {0xF0000000,0xD0000000,0xC8000000,0x87000000,0x86800000,0x04F800000,0x4F400000,0x30700000,
0x17B00000,0x09400000,0x03100000,0x01210000,0x00450000,0x000A0000,0x00068000,0X00068000,0x00000000} },
  { /* (24,7): */ 15,
  {1,12,66,220,495,62,924,792,495,220,66,8,1}, {5,7,9,10,11,12,13,14,15,15,15,15,15,15,16},
  {{0,0},{1,0},{2,0},{3,0},{4,0},{5,0},{5,1},{6,0},{7,0},{8,0},{9,0},{10,0},{11,0},{12,0},{11,1}},
  {0xF8000000,0xE0000000,0xBF000000,0x88000000,0x4A200000,0x46400000,0x2F700000,0x12900000,
0x06300000,0x02520000,0x009A0000,0x00160000,0x00060000,0x00040000,0x00000000} },
  { /* (24,8): */ 15,
  {1,12,66,220,287,792,924,792,495,220,62,12,1}, {6,8,9,10,11,12,12,13,14,14,14,14,14,14,15},
  {{0,0},{1,0},{2,0},{3,0},{4,0},{4,1},{5,0},{6,0},{7,0},{8,0},{9,0},{10,0},{11,0},{12,0},{10,1}},
  {0xF6000000,0xF0000000,0xCF000000,0x98000000,0x74200000,0x67200000,0x35A00000,0x18C00000,
0x00600000,0x04A40000,0x01340000,0x003C0000,0x000C0000,0x00080000,0x00000000} },
  { /* (24,9): */ 14,
  {1,12,66,220,417,792,924,792,495,220,66,12,1}, {7,6,9,11,11,12,12,13,13,13,13,13,13,14},
  {{0,0},{1,0},{2,0},{3,0},{4,0},{4,1},{5,0},{6,0},{7,0},{8,0},{10,0},{11,0},{12,0},{9,0}},
  {0xFE000000,0xF2000000,0xD1000000,0xBE800000,0x81600000,0x7C800000,0x4B000000,0x2E200000,
0x15600000,0x05E80000,0x03D80000,0x03760000,0x03700000,0x00000000} },
  { /* (24,10): */ 15,
  {1,12,66,220,221,792,923,792,495,220,66,12,1}, {7,9,10,11,11,12,12,12,12,12,12,13,13,13,13},
  {{0,0},{1,0},{2,0},{3,0},{4,0},{4,1},{5,0},{6,0},{10,0},{11,0},{12,0},{6,1},{7,0},{8,0},{9,0}},
  {0xFE000000,0xP8000000,0xE7800000,0xCC000000,0xB0660000,0x9F400000,0x6DC00000,0x34100000,
0x2FF00000,0x2F300000,0x2F200000,0x2F160000,0x16580000,0x06E00000,0x00000000} },
  { /* (24,11): */ 14,
  {1,12,23,220,495,792,924,792,495,220,66,12,1}, {8,10,10,11,11,11,11,12,12,12,12,12,12,13},
  {{0,0},{1,0},{2,0},{2,1},{3,0},{11,0},{12,0},{4,0},{5,0},{6,0},{8,0},{9,0},{10,0},{7,0}},
  {0xFF000000,0xFC000000,0xF6400000,0xF0E00000,0xD5600000,0xD3E00000,0xD3C00000,0xB4D00000,
0x83500000,0x49900000,0x2AA00000,0x1CE00000,0x18C00000,0x00000000} },
  { /* (24,12): */ 14,
  {1,12,66,220,495,792,504,792,495,220,66,12,1}, {10,10,10,10,11,11,12,12,12,12,12,12,12,13},
  {{0,0},{1,0},{11,0},{12,0},{2,0},{10,0},{3,0},{4,0},{5,0},{6,0},{7,0},{8,0},{9,0},{6,1}},
  {0xFFC00000,0xFCC00000,0xF9C00000,0xF9800000,0xF1400000,0xE9000000,0xDB400000,0xBC500000,
0xBAD00000,0x6B500000,0x39D00000,0x1AE00000,0x0D200000,0x00000000} },
};
/* encoder tables (computed using decoder's tables): */
static BLADE_ENC enc_t [1+(N/2+1)+(N+1)];
/* initialize encoder: */
void blade_enc_init( )
{
  unsigned int i[N+1], j, k, l, w;
  /* init enc[ ]: */
  for (j=0; j<1+(N/2+1)+(N+1); j++) {
    for (k=0; k<=N; k++) enc_t[j].nk[k] = dec_t[j].nk[k];
    for (k=0; k<=SGS; k++) {
      enc_t[j].eg[dec_t[j].kj[k].k][dec_t[j].kj[k].j] = j;
      enc_t[j].jen[k] = dec_t[j].jen[k];
      enc_t[j].base[k] = dec_t[j].jj_base[k] >> (32−dec_t[j].jen[k]);
    }
  }
  /* init w_ki[ ]: */
  for (j=0; k<=N; k++) i[k] = 0;
  for (w=0; w<(1<<N); w++) {
    for (k=0, j=0; j<N; j++) if (w & (1<<j)) k++;
    w_ki[w].k = k;
    w_ki[w].i = i[k];
```

```
      i[k] ++;
    }
  }
}
/* initialize decoder: */
void blade_dec_init( )
{
  static short b[N+1] = {1,12,66,220,495,792,924,792,495,220,66,12,1};
  unsigned int i[N+1], j, k, w;
  /* init ki_w[ ]: */
  for (j=0,k=0; k<=N; j+=b[k],k++) {ki_w[k] = _w + j; i[k] = 0;}
  for (w=0; w<(1<<N); w++) {
    for (k=0,j=0; j<N; j++) if (w & (1<<j)) k++;
    ki_w[k][i[k]] = w;
    i[k] ++;
  }
}
/* encoder's functions: */
unsigned blade_enc_0 (unsigned w, BITSTREAM *bs)
{
  return blade_enc (w, enc_t + 0, bs);
}
unsigned blade_enc_1 (unsigned w, unsigned cx, BITSTREAM *bs)
{
  unsigned r;
  if (cx > N/2)
    r = N − blade_enc (w ~((1<<N)−1), enc_t + 1 + N − cx, bs);
  else
    r = blade_enc (w, enc_t + 1 + cx, bs);
  return r;
}
unsigned blade_enc_2 (unsigned w, unsigned cx1, unsigned cx2, BITSTREAM *bs)
{
  unsigned cx = cx1 + cx2, r;
  if (cx > N)
    r = N − blade_enc (w ~((1<<N)−1), enc_t + 1 + (N/2 + 1) + 2*N − cx, bs);
  else
    r = blade_enc (w, enc_t + 1 + (N/2 + 1) + cx, bs);
  return r;
}
}
/* main.c - test program and demo: */
#define M      1000     /* max # of blocks in test sequence */
#define Q      1000000 /* # of iterations */
/* test program: */
int main ( )
{
  /* in/out buffers: */
  static unsigned char in_buffer [M*N/8];
  static unsigned char out_buffer [M*N/8 + 1024];
  static BITSTREAM in, out;
  /* vars: */
  unsigned char *pbs; int bit_offset;
  unsigned int w, cx, cx1 = 0, cx2 = 0;
  int i, j, k, m;
  double p, h, c;
/* init BLADE-12 library: */
blade_init ( );
/* scan sources: */
for (p=0.01; p<=0.991; p+=0.01) {
  /* estimate entropy: */
  h = − (p * log(p) + (1.−p) * log(1.−p)) / log(2.);
  printf ("\np=%g, h=%g\n", p, h);
  /* try different # of blocks: */
  for (m=1); m<M; m++)
  {
    c = 0.;
    /* reset generator: */
    srand(1);
    /* make Q runs: */
    for (i=0; i<Q; i++) {
      /* generate test sequence: */
      memset(in_buffer, 0, sizeof in_buffer);
      bitstream_open(&in, in_buffer, 0, 0);
      for (j=0; j<N*m; j++) {
        /* get a next bit from a pseudo-Bernoulli source: */
        k = ((double) rand( ) / (double) RAND_MAX) > (1. − p);
```

```
            /* insert it in bitstream: */
            put_bits(k, 1, &in);
        }
        bitstream_close (&in, &pbs, &bit_offset, 1);
        /* start encoding: */
        memset(out_buffer, 0, sizeof out_buffer);
        bitstream_open(&out, out_buffer, 0, 0);
        bitstream_open(&in, in_buffer, 0, 1);
        /* run the encoder: */
        for (j=0; j<m; j++) {
            /* block to be encoded: */
            w = (unsigned)get_bits (N, &in);
            /* choose context and encode: */
            if (j == 0)
                cx1 = blade_enc_0 (w, &out);           /* no context */
            else if (j == 1)
                cx2 = blade_enc_1 (w, cx1, &out);      /* use cx1 */
            else {
                cx = blade_enc_2 (w, cx1, cx2, &out);  /* use cx1 and cx2 */
                /* scroll contexts: */
                cx1 = cx2;
                cx2 = cx;
            }
        }
        /* close bitstreams: */
        bitstream_close (&in, &pbs, &bit_offset, 0);
        bitstream_close (&out, &pbs, &bit_offset, 1);
/* compute coding cost: */
c += (double)((pbs - out_buffer) * 8 + bit_offset) / (double)(m*N);
/* start decoding: */
bitstream_open (&in, in_buffer, 0, 1);
bitstream_open (&out, out_buffer, 0, 1);
/* run the decoder: */
for (j=0; j<m; j++) {
    /* choose the context and decode: */
    if (j == 0)
        cx1 = blade_dec_0 (&w, &out);          /* no context */
    else if (j == 1)
        cx2 = blade_dec_1 (&w, cx1, &out);     /* use cx1 */
    else {
                cx = blade_dec_2 (&w, cx1, cx2, &out); /* use cx1 and cx2 */
                /* scroll contexts: */
                cx1 = cx2;
                cx2 = cx;
            }
            /* compare with the original block: */
            if (w != get_bits (N, &in)) {
                printf("?%d,", j);
            }
        }
        /* close bitstreams: */
        bitstream_close (&in, &pbs, &bit_offset, 0);
        bitstream_close (&out, &pbs, &bit_offset, 0);
        }
        /* print results: */
        c /= (double)Q;
        printf("[%d,%g], ", m*N, (c-h)/h);
        fflush(stdout);
        }
    }
    return 1;
}
```

Experimental results of evaluation of performance of an adaptive coding process as described herein with block size n=16 will now be described and compared to other well known algorithms. In particular, the adaptive coding process is compared to the Q-coder algorithm described in W. B. Pennebaker, J. L. Mitchell, G. G. Langdon, Jr., R. B. Arps, An overview of the basic principles of the Q-Coder adaptive binary arithmetic coder, IBM J. Res. Dev., 32 (6) (1988) 717, which is used in the JBIG image coding standard, and the CABAC algorithm described in D. Marpe, H. Schwartz, and T. Wiegand, Context-Based Adaptive Binary Arithmetic Coding in the H.264/AVC video compression standard, IEEE Trans. on CSVT, 13(7):620-636, July 2003, which is used in the ITU-T H.264/MPEG AVC standards for video compression.

In order to conduct the tests, computer-generated sequences of bits were used to simulate output from a binary Bernoulli source with probability p. Lengths of such sequences ranged from 16 to 1024 and, for each particular length, Q=1000000 samples of such sequences were generated. Relative redundancy rates were computed as:

$$\text{Rate} = \frac{\left(\begin{array}{c}\text{sum of lengths of all}\\\text{codes produced for } Q \text{ sequences}\end{array}\right)/Q - H(p)}{H(p)}$$

For the adaptive coding process described in this disclosure, the following structure of contexts was used:
1. first 16-bit block is encoded without context (universal code);
2. second block is encoded using first one as its context (code with t=16); and
3 third and all subsequent blocks are encoded using two previous blocks in a sequence as contexts (sample-based code with t=32).

Figure 7A:
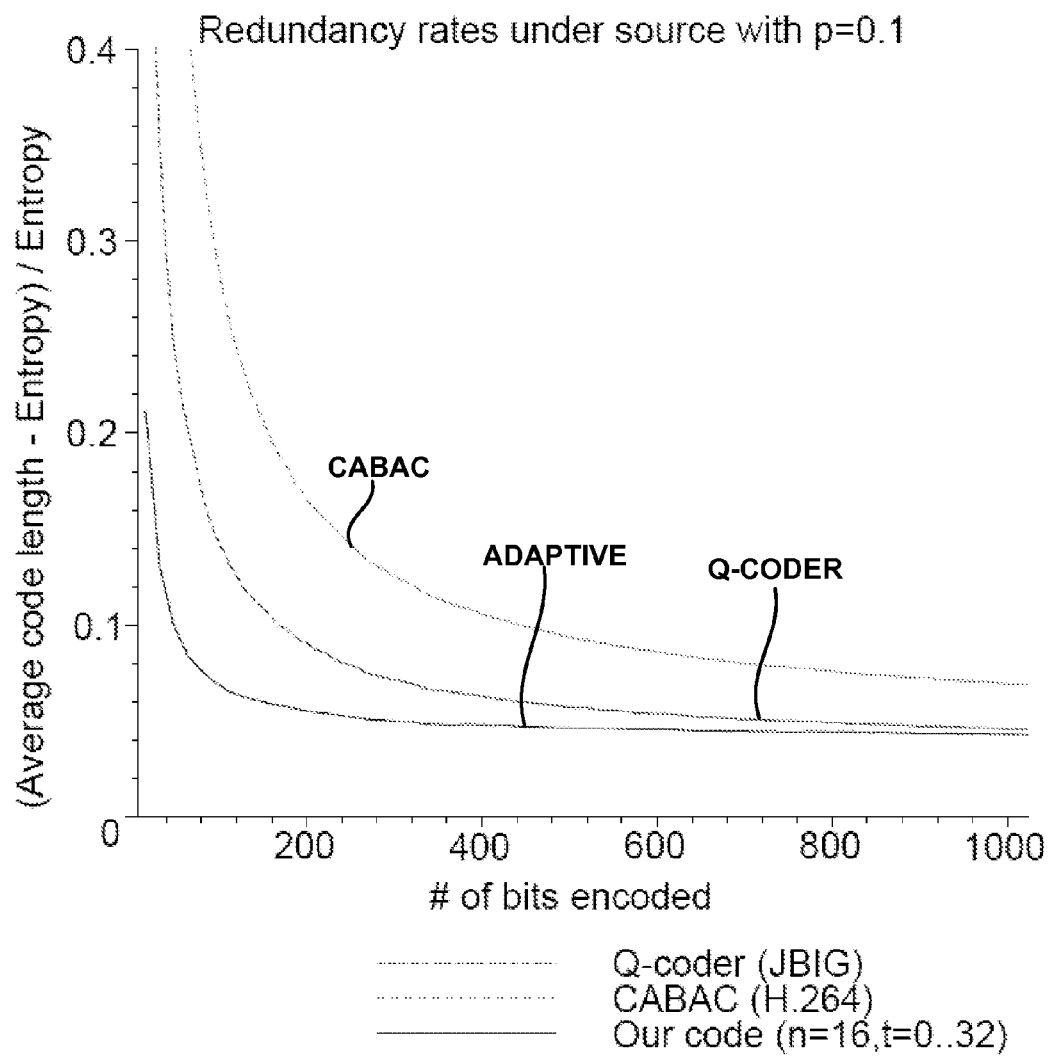
FIGS. 7A and 7B are graphs illustrating comparison of redundancy rates of an adaptive block code with different values of $\rho$.
Figure 7B:
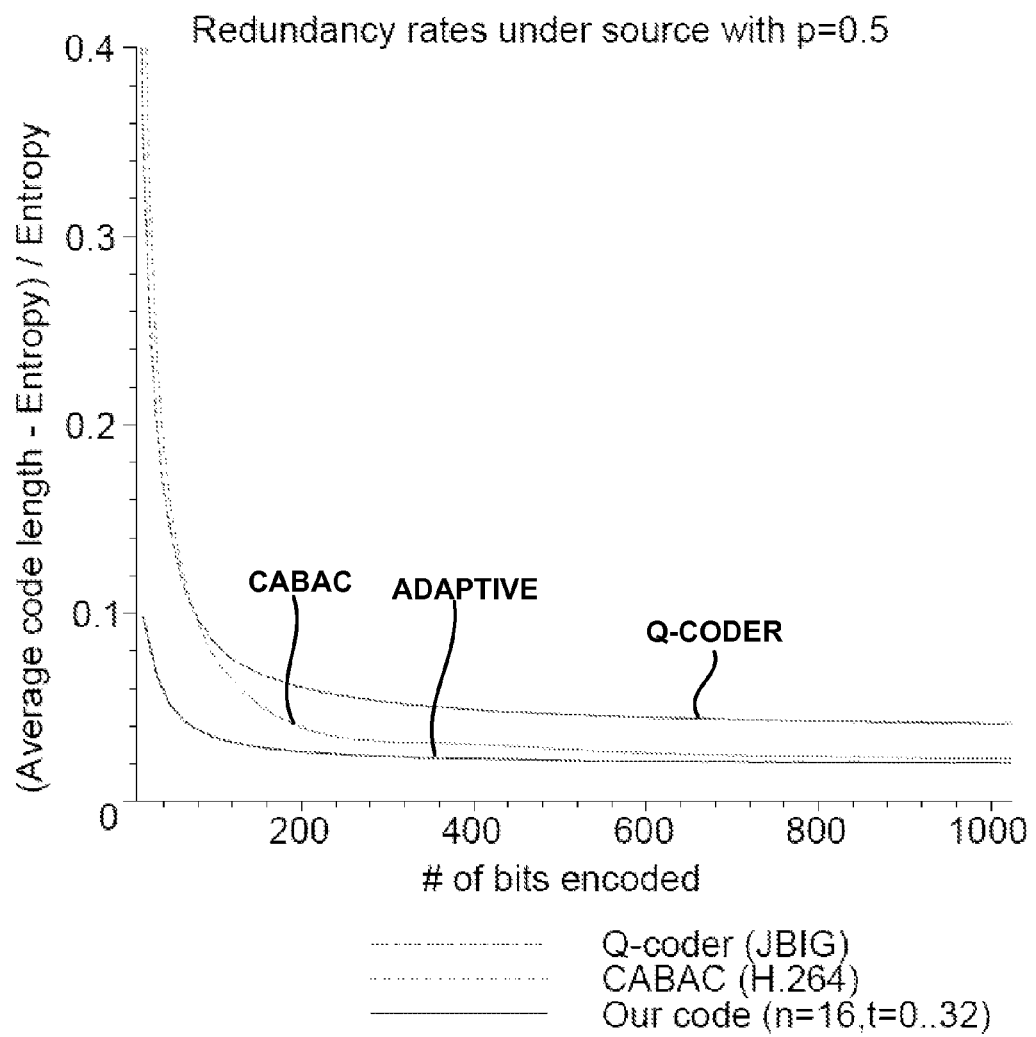
Figure 8:
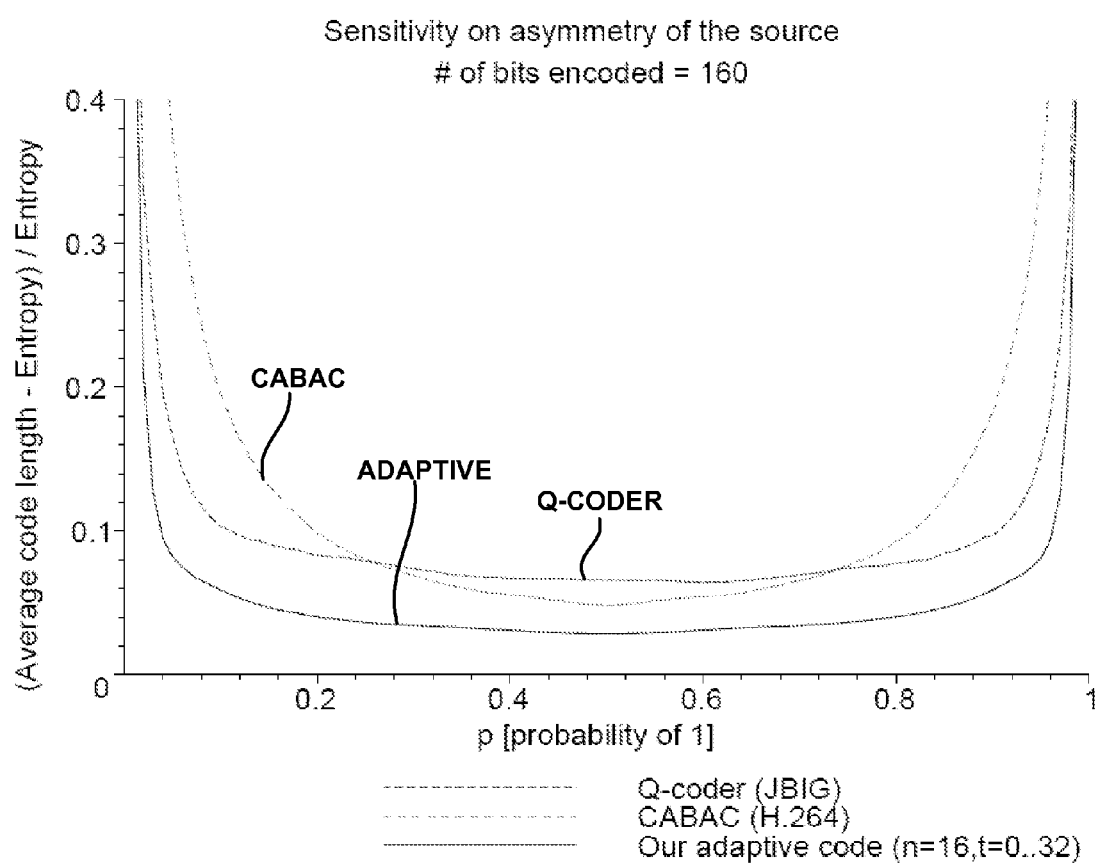
FIG. 8 is a graph illustrating sensitivity of redundancy to asymmetry of source data.

FIGS. 7A and 7B are graphs illustrating comparison of redundancy rates of an adaptive block code to Q-coder and CABAC techniques with different values of p. FIG. 7A shows results for p=0.1 while FIG. 7B shows results for p=0.5. FIG. 8 is a graph illustrating sensitivity of redundancy to asymmetry of source data for the adaptive block code, Q-coder and CABAC techniques. The results of the experimental study are shown in FIGS. 7A, 7B and 8. FIGS. 7A and 7B plot the number of bits encoded on the x-axis versus (average code length–Entropy)/Entropy on the y-axis.

FIG. 8 plots probability on the x-axis versus (average code length–Entropy)/Entropy on the y-axis. Each graph in FIGS. 7A, 7B, and 8 shows plots for Q-coder, CABAC and adaptive coding with corresponding labels. From the experimental results, it can be seen that the adaptive code described in this disclosure may have a much faster rate of convergence than both the Q-coder and CABAC algorithms. The adaptive coding process outperforms the Q-coder and CABAC algorithms for shorter sequences, and becomes comparable to the Q-coder and CABAC algorithms when the total length of encoded bits approaches 1024. As further shown in FIG. 8, after 160 encoded bits (or then 16-bit blocks), the adaptive coding process can deliver lower redundancy compared to the Q-coder and CABAC algorithms. This behavior is consistent with Theorem 1 discussed above.

Figure 9:
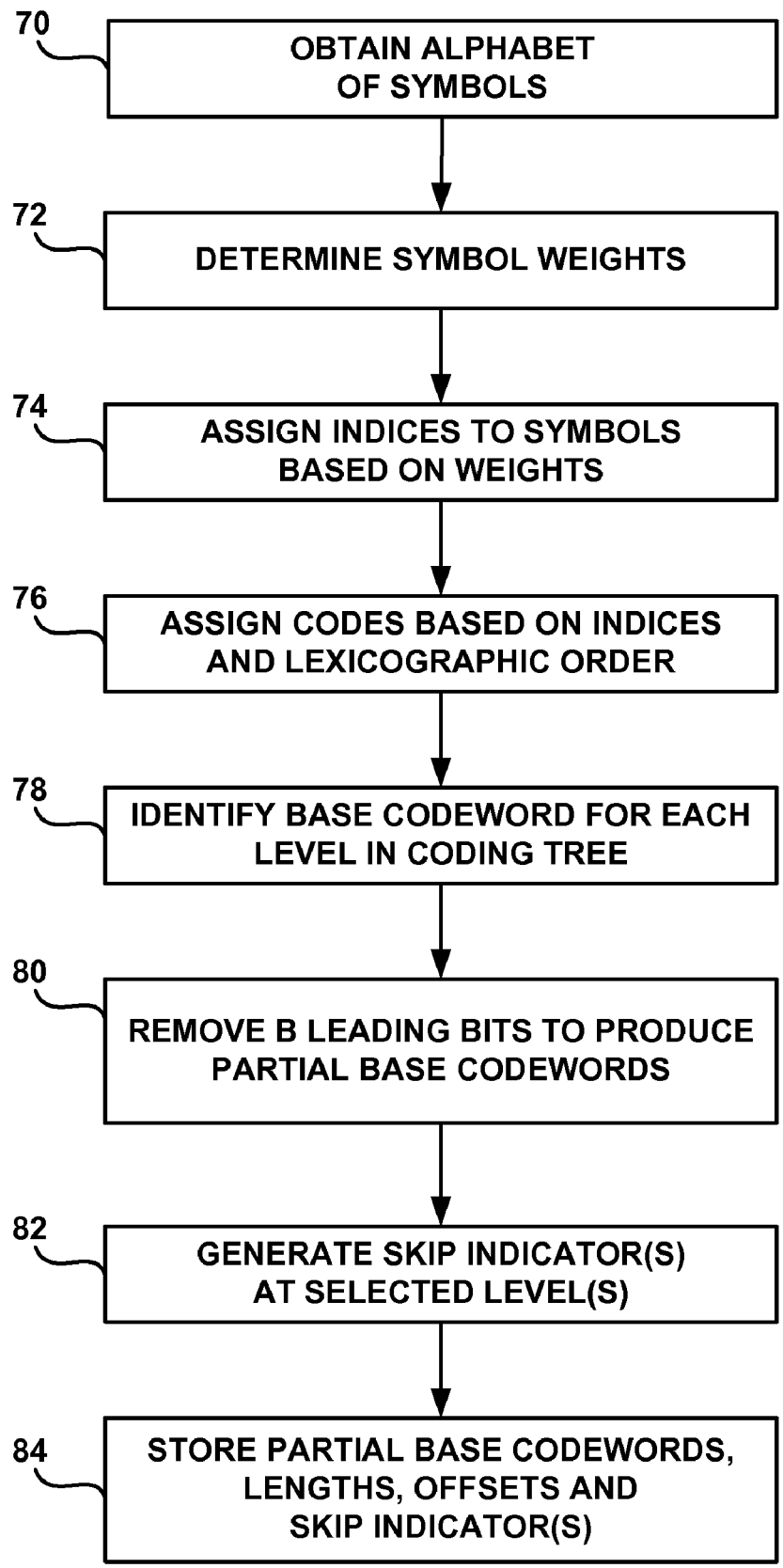
FIG. 9 is a flow diagram illustrating a method for constructing memory efficient variable length coding for monotonic distributions in accordance with an aspect of this disclosure.

FIG. 9 is a flow diagram illustrating a method for constructing memory efficient variable length coding for monotonic distributions in accordance with a first general aspect of this disclosure. The method may be implemented by a processor associated with an encoder, decoder, or another device to construct codes for use by an entropy encoding unit 46 and entropy decoding unit 52, as shown in FIGS. 2 and 3, and may support compression and coding of any of a variety of data, including but not limited to video, image, speech and audio data. Such a processor may be provided, for example, within an encoder or decoder, or within a general purpose computing system, e.g., to prepare a data structure defining code structure attributes useful in variable length coding.

As shown in FIG. 9, the processor obtains an alphabet of input symbols to be coded (70). The symbols have respective weights indicating probability or frequency of presence or usage of the symbols in a given data set or sequence. Upon determining pertinent symbol weights (72), the process assigns indices to the symbols based on their weights (74), and assigns codes to the symbols based on the indices and the lexicographic order of the symbols (76). Hence, symbols having the same weights may be ordered lexicographically to facilitate coding techniques as described in this disclosure.

The codes may be organized according to a code structure represented by a binary coding tree. The processor identifies a base codeword for each level in the coding tree (78). The base codeword is the smallest codeword at a given level in the tree and corresponds to the lexicographically earliest symbol among the symbols at that level in the tree. To provide a compact data structure, the processor removes a fixed number B of the leading bits from the base codewords to produce partial base codewords (80). The base codewords may be formulated as left-justified codewords, and the leading bits may the M leading bits proceeding from right to left in the left-justified codewords. In some implementations, the number of leading bits that are removed may be 8. In other implementations, the number of leading bits that are removed may be less than or greater than 8.

For many levels of the coding tree, the M leading bits will be zeros. At some levels, however, the leading bits may form all or part of the base code for the respective level in the tree. At these selected levels, the processor generates skip indicators (82). The skip indicators provide an instruction for a decoder to scroll the bitstream by B bits so that the base code is not lost upon removal of the leading B bits. The process may store, in a data structure, the resulting partial base codewords, lengths associated with the codewords at respective levels of the coding tree, offsets indicating the indices of respective symbols associated with codewords in the coding tree, and one or more skip indicators that indicate when the bitstream should be scrolled by B bits to prevent loss of a base codeword that falls at least partially within the leading B bits (84). The data structure may be provided to entropy encoding unit 46 and entropy decoding unit 52 to aid in performing entropy encoding and decoding operations with the constructed variable codes. The data structure may take a variety of forms including one or more single- or multi-dimensional lookup tables, link lists, binary trees, radix trees, flat files, or the like.

Figure 10:
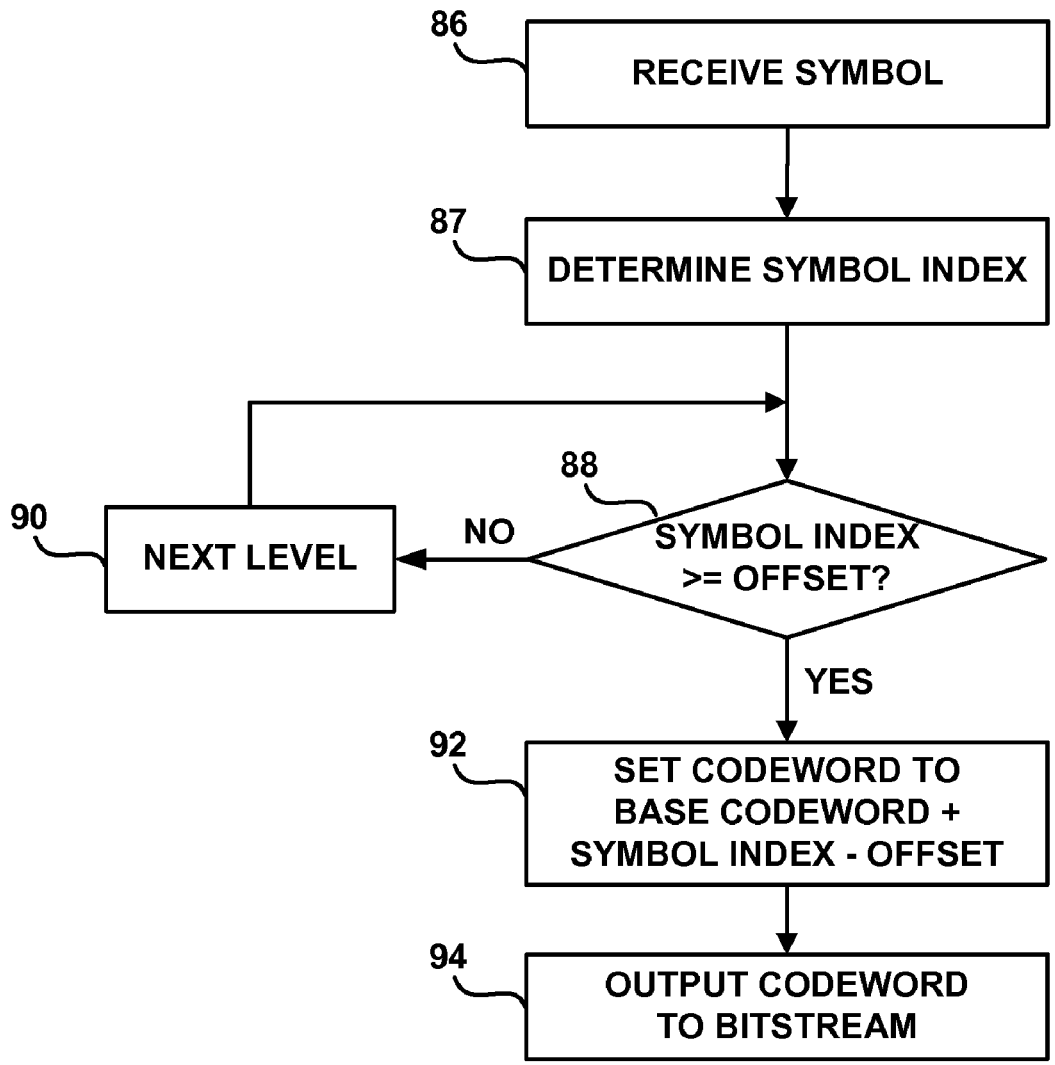
FIG. 10 is a flow diagram illustrating a method for encoding symbols using variable length codes constructed according to the method of FIG. 9.

FIG. 10 is a flow diagram illustrating a method for encoding symbols using variable length codes constructed according to the method of FIG. 9, in accordance with the first general aspect of this disclosure. As shown in FIG. 10, entropy encoding unit 46 receives a symbol (86), determines an index for the symbol (87), and compares the symbol index to an offset table to identify a corresponding level in the coding tree. In particular, entropy encoding unit 46 determines whether the symbol index is greater than or equal to the offset for a given level of the tree (88). The symbol index represents the order of the symbol among the other symbols, ranked in order of weight, with symbols of the same weight being ordered lexicographically consistent with the symbol alphabet. The offset is the difference between the length of the code or codes for the pertinent level of the tree, and the maximum code length. In the tree of FIG. 4, if the maximum code length is 16, for example, and the code length at level 3 of the tree is 3, then the pertinent offset for the base codeword is 12.

If the symbol index does not exceed the offset for the current level of the tree, entropy encoding unit 46 proceeds downward to the next level (90) of the coding tree in a top-down search and repeats the comparison of the symbol index to the offset for that next level (88). When entropy encoding unit 46 determines that the symbol index is greater than or equal to the offset for a particular level of the coding tree (88), the entropy coding unit computes the appropriate codeword for the symbol. In particular, entropy coding unit 46 sets the codeword for the symbol to the sum of the base codeword for the current level of the tree plus the difference between the symbol index and the offset for that level (92).

Using the example tree of FIG. 4, if the symbol index is 14, entropy coding unit 46 determines that the code for the symbol resides at level 3 of the tree because 14 is greater than the offset of 12 assigned to the base codeword for that level. Entropy coding unit 46 then computes the codeword as the base codeword (001)+(the symbol index (14)−the offset (12)), i.e., 001+2=001+010=011. Upon setting the code for the received symbol (92), entropy encoding unit 46 outputs the codeword to the bitstream (94) for transmission, e.g., to a receiving device with entropy decoding unit 52. Entropy coding unit 46 then repeats the process for the next symbol in the pertinent data sequence.

Figure 11:
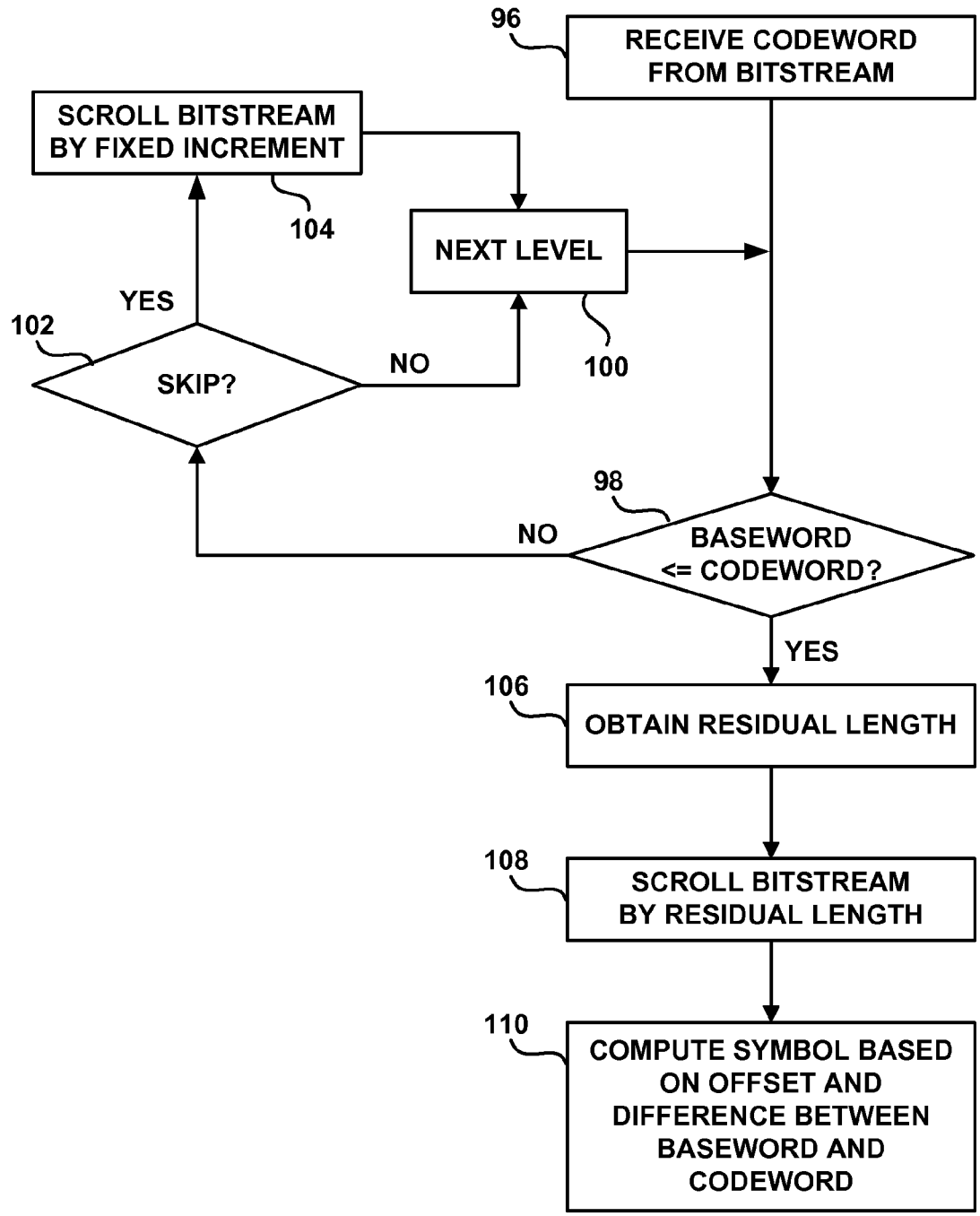
FIG. 11 is a flow diagram illustrating a method for decoding variable length codes constructed according to the method of FIG. 9.

FIG. 11 is a block diagram illustrating a method for decoding variable length codes constructed according to the method of FIG. 9, in accordance with the first general aspect of this disclosure. The method shown in FIG. 11 may be performed using an algorithm identical or similar to that shown in TABLE 5. In an example implementation, the codes may be received by entropy decoding unit 52, and encoded by an entropy coding unit 46 as described with reference to FIG. 10. The method illustrated in FIG. 11 may make use of memory efficient decoding techniques as described in this disclosure, and may take advantage of the compact data structure with which such codes can be constructed. As shown in FIG. 11, entropy decoding unit 52 receives a codeword from an incoming bitstream (96). The codeword may be obtained from a fixed width W of bits retrieved from a bitstream buffer. The codeword may be left justified or converted to a left justified format, and the width W may be reduced by removing B leading bits from the codeword from right to left.

Entropy decoding unit 52 compares the codeword to base codewords for different levels of a coding tree, starting from the top level and proceeding deeper into the tree in a top-down search until an appropriate base codeword is found. In particular, entropy decoding unit 52 may determine whether the base codeword for the current level of the tree is less than or equal to the codeword (98). If not, entropy decoding unit continues downward to the next level of the tree (100) and repeats the comparison (98) for the base codeword associated with the next level. Upon proceeding to the next level (100), however, entropy decoding unit 52 determines whether a skip indication (102) is associated with the current level. If so, entropy decoding unit 52 scrolls the bitstream buffer by a fixed increment (104) before proceeding to the next level (100). In particular, entropy decoding unit 52 may scroll the bitstream buffer by M bits so that the codeword is not lost by dropping the leading M bits. If there is no skip indication (102), entropy decoding unit 52 simply proceeds to the next level (100).

In either case, entropy decoding unit 52 again compares the codeword to the base codeword for the current level (98). When entropy decoding unit 52 finds a level at which the base codeword is less than or equal to the codeword (98), entropy decoding unit 52 determines the residual length of the base codewords at the respective level (106) and scrolls the bitstream by the residual length (108). Entropy decoding unit 52 then computes the symbol associated with the codeword (110) based on the offset for the level, and the difference between the base codeword and the codeword being decoded.

With reference to the tree of FIG. 4, for example, if the codeword is 0110000000000000, then the partial, truncated codeword with 8 leading bits dropped is 01100000. In this case, entropy decoding unit 52 will identify the partial base codeword at level 3 (00100000) as being less than or equal to the codeword, and will identify a residual length of 3. Entropy decoding unit 52 scrolls the bitstream 3 bits ahead to receive the next codeword. In addition, entropy decoding unit 52 computes the symbol for the codeword by adding the offset for level 3 to the difference between the codeword in the bitstream buffer and the base codeword for the level. For example, entropy decoding unit 52 computes the code as offset[3]=12 plus codeword 01100000 minus 00100000, which is equivalent to 12 plus 2=14. In this case, 14 is the index of the symbol represented by the code 011.

The method illustrated in FIG. 11 may take advantage of a very compact data structure and significant memory efficiency, as described elsewhere in this disclosure. As a result, by implementing such a method, entropy decoding unit 52 may present increased efficiency, including reduced processing overhead, reduced memory utilization, and increased processing speed, all of which may be desirable for a video decoding device, or other devices configured for data decompression and decoding.

Figure 12:
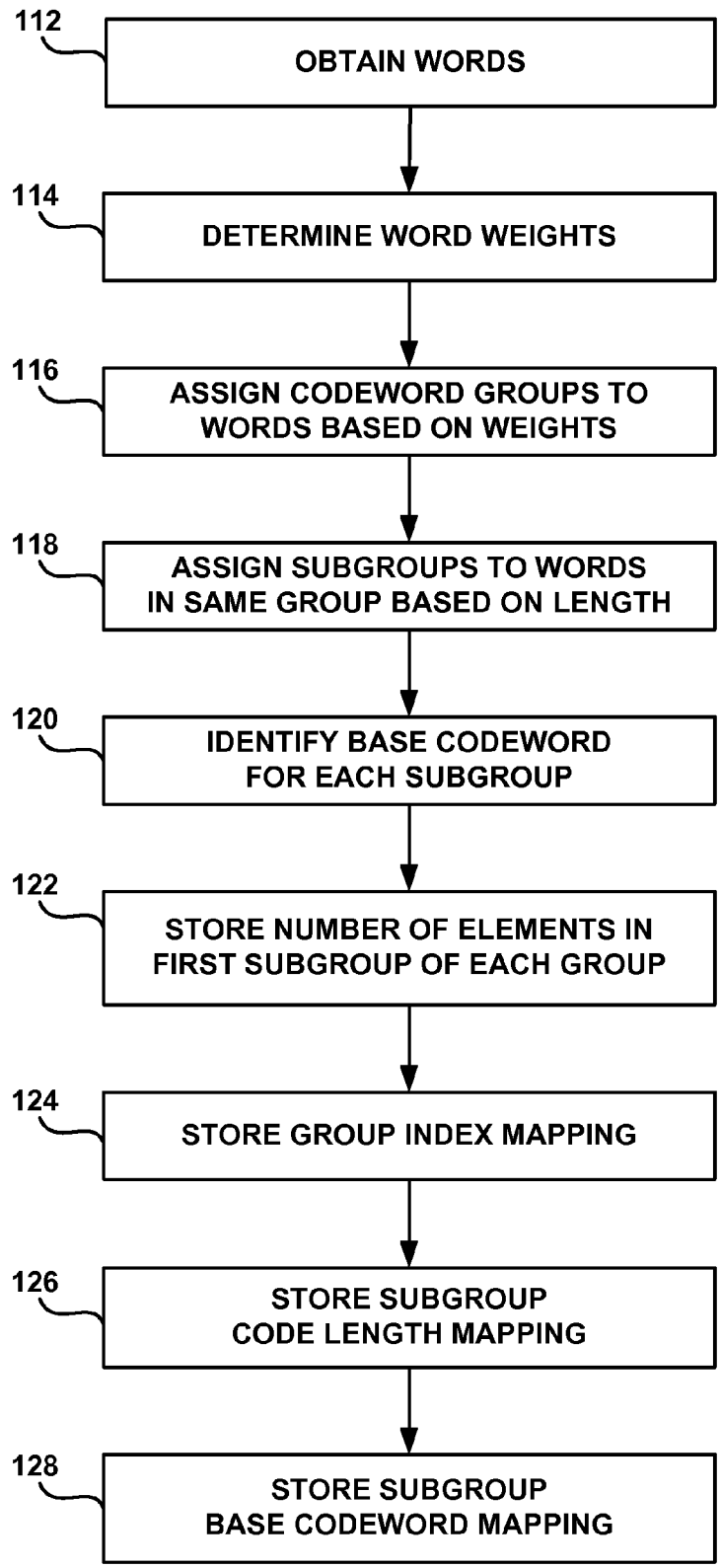
FIG. 12 is a flow diagram illustrating a method for constructing adaptive block codes in accordance with another aspect of this disclosure.

FIG. 12 is a flow diagram illustrating a method for constructing adaptive block codes in accordance with the second general aspect of this disclosure. The method of FIG. 12 may be implemented within a processor within a coding device or a general purpose processor to support efficient, direct construction of adaptive block codes. As shown in FIG. 12, the processor obtains a set of words (112) to be coded. A data structure representing the resulting code structure may be stored in memory within an encoding device, decoding device, or both. The words may be blocks of binary codes. Upon determining weights of the words (114), the processor assigns codeword groups to the words based on the weights (116). The codeword groups include codewords for words of the same weight k and may span two adjacent levels of a coding tree, e.g., as shown in FIG. 6.

As further shown in FIG. 12, the processor assigns subgroups to words in the same groups based on the lengths of the words (118). In particular, a group may include a first subgroup and a second subgroup. The first subgroup contains one or more codewords having the same length and same weight. Likewise, the second subgroup contains one or more codewords having the same length and same weight. However, the length of the codewords in the first subgroup is less than the length of the codewords in the second subgroup. Hence, each subgroup includes codewords of the same weight and at the same level in the coding tree.

The processor identifies a base codeword for each subgroup (120). The base codeword is the smallest codeword in a subgroup. In the example of FIG. 6, the base codeword for subgroup 68A is 001. However, subgroup 68A further includes codewords 010 and 011, in addition to the base codeword of 001. In this example, the codewords in a subgroup are ordered in terms of the lexicographic order of the words they represent, such that codes can be readily and directly computed given a relatively small mount of computation.

The number of elements in the first subgroup of each group may be used to compute the codewords. To that end, the processor stores the number of elements in the first subgroup of each group (122), and also stores a group index mapping (124), a subgroup code length mapping (126) and a subgroup base codeword mapping (128). The group index mapping may identify the position of a codeword for a word in a group in which the codeword resides. The subgroup code length mapping may identify the length of the codes within a particular subgroup. The subgroup base codeword mapping may identify the base codeword associated with each subgroup. In general, a code can be constructed from the base codeword for a particular subgroup given the index of the word within the group. The stored information may be stored in a data structure that can be accessed by an encoder, decoder or both.

Figure 13:
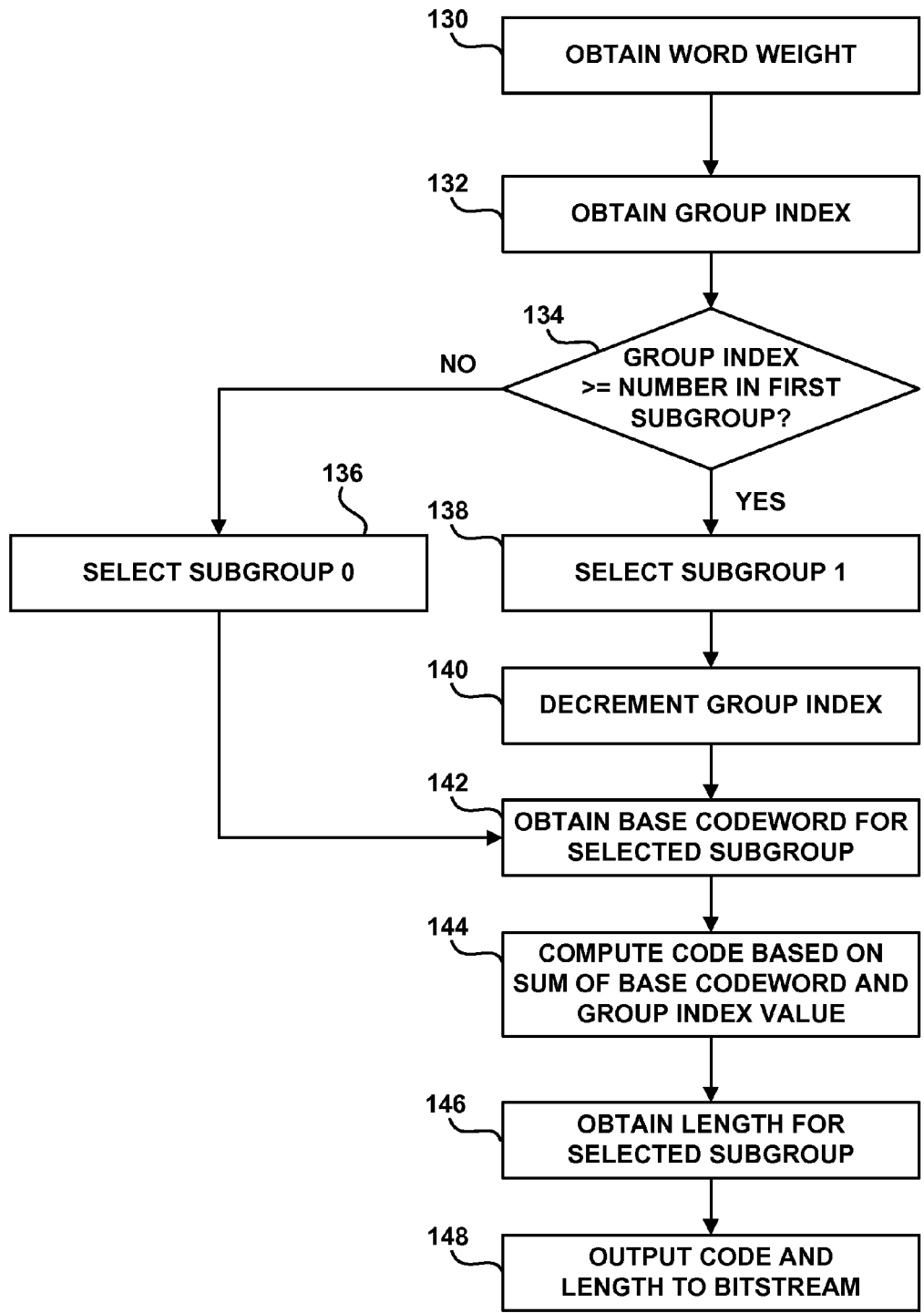
FIG. 13 is a flow diagram illustrating a method for encoding blocks using variable length codes constructed according to the method of FIG. 12.

FIG. 13 is a flow diagram illustrating a method for encoding blocks using variable length codes constructed according to the method of FIG. 12, and in accordance with the second general aspect of this disclosure. The method of FIG. 13 may be implemented, for example, within an entropy encoding unit such as entropy encoding unit 46 of FIG. 2. The method shown in FIG. 13 may be performed using an algorithm identical or similar to that shown in TABLE 7. As shown in FIG. 13, to encode a given word, entropy encoding unit 46 obtains its weight (130) and group index (132). Using the word weight, entropy encoding unit 46 determines the group index for the word (132) within an applicable coding tree. The group index $I_{n,k}(w)$ specifies the index (position) of a word w in a group $W_{n,k}$, which stores words in a lexicographic order.

Entropy encoding unit 46 compares the group index to the number of elements $n_k$ in the first subgroup of the group in which the codeword for the input word resides. In particular, entropy encoding unit 46 determines whether the group index is greater than or equal to the number of elements in the first subgroup (134). If so, entropy encoding unit 46 selects the second subgroup (138), i.e., subgroup 1, in the group, and decrements the group index value (140). In particular, the group index value is decremented by the number of elements in the first subgroup $n_k$. If the group index is not greater than or equal to the number of elements in the first subgroup (134), entropy encoding unit 46 selects the first subgroup (136), i.e., subgroup 0. Each subgroup has its own base codeword. Entropy encoding unit 46 obtains the base codeword for the selected subgroup (142) and computes the codeword based on the sum of the base codeword and the group index value (144).

With reference to the example coding tree of FIG. 6, as an illustration, if it is assumed that the weight of the word to be encoded is 2, the group index value is 2, and the number of elements in the first subgroup is 3, e.g., corresponding to the group at levels 3 and 4 of the coding tree. In this case, entropy encoding unit 46 selects the first subgroup (subgroup 0) because the group index value (2) is less than the number of elements (3) in the first subgroup. As a result, the base codeword is 001. To encode the word, entropy encoding unit 46 adds the group index value of 2 to the base codeword of 001, resulting in a codeword of 011.

For the same group, if the group index value was 3, entropy coding unit 46 would select the second subgroup (subgroup 1). However, entropy coding unit 46 would decrement by the group index value by the number $n_k$ of elements in the first subgroup (subgroup 0). In this case, the group index value of 3 would be reduced by 3 to zero, and the codeword would be computed as the base codeword of 0001 for the second subgroup plus the group index value of 0, resulting in a codeword of 0001.

In addition to computing the codeword for the input word, entropy coding unit 46 may obtain the length of the codes in the selected subgroup (146). In the example above, for subgroup 0 at level 3, the length of the codes would be 3. Entropy encoding unit outputs the computed codeword and the subgroup code length to the bitstream for storage and/or transmission to another device, such as a decoding device including an entropy decoding unit such as entropy decoding unit 52.

Figure 14:
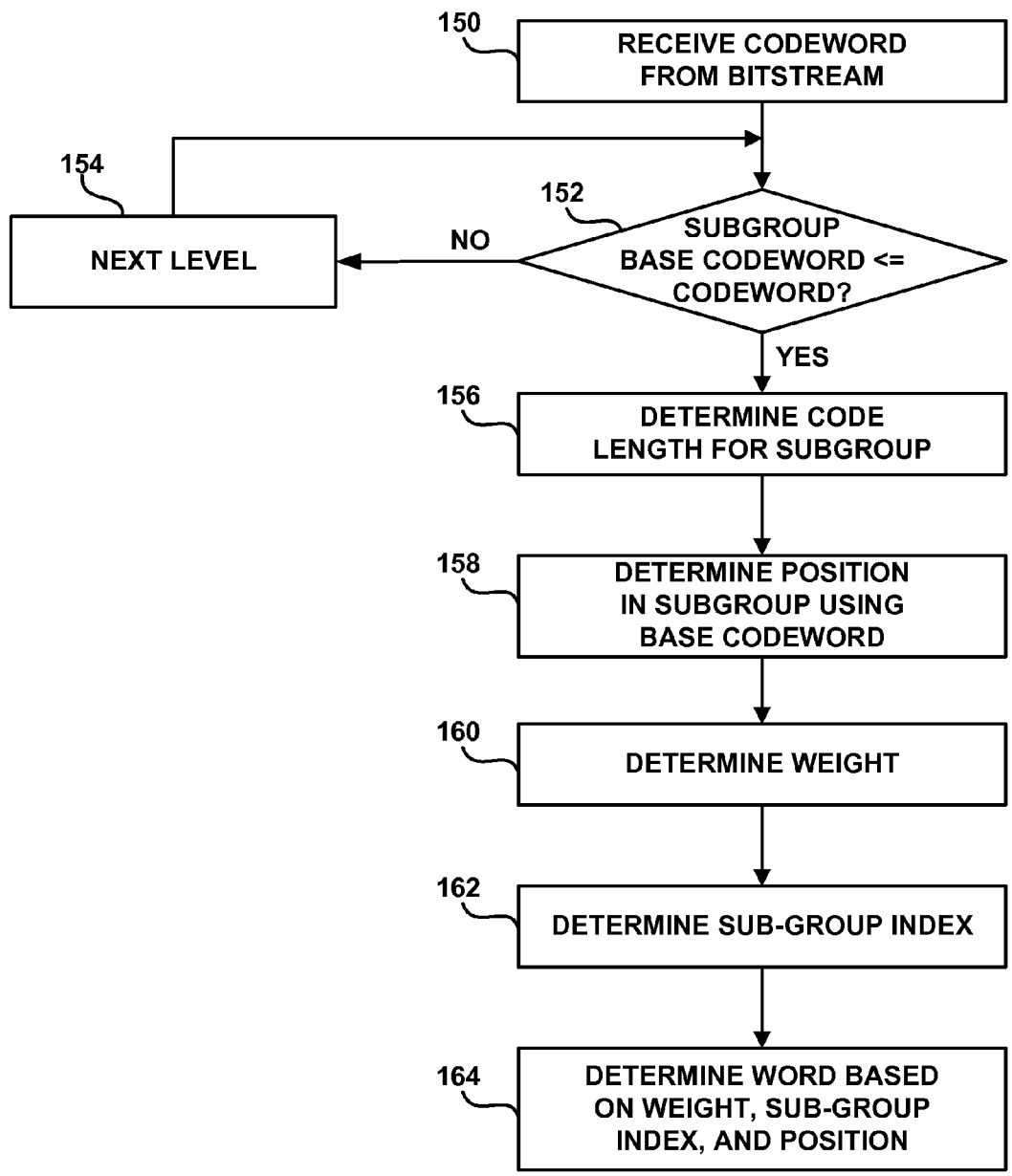
FIG. 14 is a block diagram illustrating a method for decoding variable length codes constructed according to the method of FIG. 12.

FIG. 14 is a block diagram illustrating a method for decoding variable length codes constructed according to the methods of FIG. 12 and FIG. 13, and in accordance with the second general aspect of this disclosure. The method shown in FIG. 14 may be performed using an algorithm identical or similar to that shown in TABLE 8. The variable length codes may be received from an encoding device such as an encoding device including entropy encoding unit 46. The variable length codes may be received and decoded by entropy decoding unit 52. As shown in FIG. 14, entropy decoding unit 52 receives a codeword from the incoming bitstream (150) and compares the codeword to a subgroup base codeword. In particular, entropy decoding unit 52 may search an applicable coding tree to identify a left-justified subgroup base codeword that is less than or equal to the codeword contents obtained from a bitstream buffer (152).

If the subgroup base codeword in a subgroup at a given level in the tree is not less than or equal to the codeword (152), then entropy decoding unit 52 proceeds to the next subgroup at the next level (154) in the tree and repeats the comparison. This process continues on an iterative basis so long as the base codeword remains larger than the codeword received from the bitstream, i.e., until entropy decoding unit 52 reaches a level at which the subgroup base codeword is less than or equal to the codeword. In comparing the codeword and base codewords, entropy decoding unit 52 may use partial, incremental values of base codewords for additional memory reduction in accordance with the first aspect of this disclosure. In particular, a number of leading bits may be dropped to improve memory efficiency as previously described.

When it reaches a level of the coding tree at which a subgroup base codeword is less than or equal to the codeword, entropy decoding unit 52 determines the code length for the subgroup (156) and scrolls the bitstream by that length to skip the decoded bits and isolate the code word. Entropy decoding unit 52 may determine the position of the codeword in the subgroup using the base codeword (158). For example, entropy decoding unit 52 may subtract the bitstream codeword from the base codeword to produce the positional difference between the codeword and the base codeword.

As an example, with reference to the coding tree of FIG. 6, if the incoming codeword is 0110000000000000, entropy decoding unit 52 will identify base codeword 0010000000000000 as the top-most subgroup base codeword that is less than or equal to the codeword. This base codeword is associated with the first subgroup in the group at levels 3 and 4. Upon determining the code length (3) of the subgroup associated with the base codeword, entropy decoding unit 52 may scroll the bitstream to skip the decoded bits. Entropy decoding unit 52 may determine the group index of the codeword by subtracting the base codeword from the codeword from the bitstream. In this example, 011 minus 001 yields 010, which produces a group index value of 2.

Entropy decoding unit 52 also may determine the weight of the codeword (160), e.g., based on the level of the subgroup within the coding tree. In addition, entropy decoding unit 52 may determine the subgroup index (162), i.e., the index of the selected subgroup within the coding tree. Using the weight, position and sub-group index, entropy decoding unit 52 determines the word index (164), thereby decoding the codeword from the bitstream to produce the word represented by the codeword. Again, in some implementations, the decoding method performed by entropy decoding unit 52 may correspond to the process shown in TABLE 8.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The techniques described herein may be implemented in hardware, software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods described above. The computer-readable data storage medium may form part of a computer program product. The computer-readable medium may comprise random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagate signals or waves.

The program code may be executed by one or more processors, such as one or more digital signal processors (DSPs), general purpose microprocessors, an application specific integrated circuits (ASICs), field programmable logic arrays (FPGAs), or other equivalent integrated or discrete logic circuitry. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure or any other structure suitable for implementation of the techniques described herein. In addition, in some aspects, the functionality described herein may be provided within dedicated software modules or hardware modules configured for encoding and decoding, or incorporated in a combined video encoder-decoder (CODEC).

Various embodiments of the disclosure have been described. These and other embodiments are within the scope of the following claims.

The invention claimed is:

1. A method comprising:
performing variable length coding according to a code structure, wherein the code structure defines:
groups of codewords in a coding tree, each of the groups includes codewords representing values having same weights and the codewords in each of the groups are ordered lexicographically with respect to the values represented by the codewords, and
first and second subgroups of codewords within each of the groups, wherein the first subgroup includes codewords having a first length and the second subgroup includes codewords having a second length different form the first length; and
generating a result of the variable length coding for at least one of storage in memory, transmission to a device, or presentation to a user.

2. The method of claim 1, wherein performing variable length coding comprises:
accessing a data structure that specifies base codewords for each of the subgroups, positions of codewords within each of the groups, a number of codewords within each of the first subgroups, and lengths of the codewords within each of the subgroups; and
performing the variable length coding using the data structure.

3. The method of claim 2, wherein the data structure is stored in a memory associated with one of a video encoder, an image encoder, an audio encoder, a speech encoder, a video decoder, an image decoder, and audio decoder, or a speech decoder.

4. The method of claim 2, wherein each of the base codewords is a lexicographically smallest codeword within the respective subgroup.

5. The method of claim 2, wherein performing the variable length coding comprises encoding one of the values using the data structure, wherein encoding comprises:
selecting one of the groups based on the weight of the value to be encoded;
selecting one of the subgroups based on the lexicographic position of the value to be encoded relative to the number of codewords in the first subgroup of the selected group;
selecting one of the codewords in the selected subgroup based on the base codeword for the selected subgroup and the lexicographic position of the value to be encoded; and
encoding the value to be encoded with the selected codeword.

6. The method of claim 5, further comprising transmitting the encoded value to a decoder.

7. The method of claim 1, wherein performing the variable length coding comprises decoding one of the codewords using the data structure, wherein decoding comprises:
in a top-down search of coding tree, selecting a first one of the subgroups with a base codeword that is less than or equal to the codeword to be decoded;
determining the position of the codeword to be decoded within the selected subgroup based on a difference between the codeword to be decoded and the base codeword for the selected subgroup;
determining the weight of the value represented by the codeword to be decoded based on the group in which the selected subgroup resides;
determining the position of the codeword within the group in which the selected subgroup resides based on whether the selected subgroup is the first subgroup or the second subgroup for the group;
selecting one of the values the weight of the value represented by the codeword to be decoded and the position of the codeword within the group in which the selected subgroup resides; and
decoding the codeword to be decoded with the selected value.

8. The method of claim 7, further comprising presenting output to a user based at least in part on the selected value.

9. The method of claim 1, wherein the values represented by the codewords represent at least one of video data, image data, speech data or audio data.

10. A device comprising:
means for performing variable length coding according to a code structure, wherein the code structure defines:
groups of codewords in a coding tree, each of the groups includes codewords representing values having same weights and the codewords in each of the groups are ordered lexicographically with respect to the values represented by the codewords, and
first and second subgroups of codewords within each of the groups, wherein the first subgroup includes codewords having a first length and the second subgroup includes codewords having a second length different form the first length; and
means for generating a result of the variable length coding for at least one of storage in memory, transmission to a device, or presentation to a user.

11. The device of claim 10, wherein the means for performing variable length coding comprises:
means for accessing a data structure that specifies base codewords for each of the subgroups, positions of codewords within each of the groups, a number of codewords within each of the first subgroups, and lengths of the codewords within each of the subgroups; and
means for performing the variable length coding using the data structure.

12. The device of claim 11, further comprising means for storing the data structure in a memory associated with one of a video encoder, an image encoder, an audio encoder, a speech encoder, a video decoder, an image decoder, and audio decoder, or a speech decoder.

13. The device of claim 11, wherein each of the base codewords is a lexicographically smallest codeword within the respective subgroup.

14. The device of claim 11, wherein the means for performing variable length coding comprises means for encoding one of the values using the data structure, the means for encoding comprising:
means for selecting one of the groups based on the weight of the value to be encoded;
means for selecting one of the subgroups based on the lexicographic position of the value to be encoded relative to the number of codewords in the first subgroup of the selected group;
means for selecting one of the codewords in the selected subgroup based on the base codeword for the selected subgroup and the lexicographic position of the value to be encoded; and
means for encoding the value to be encoded with the selected codeword.

15. The device of claim 14, further comprising means for transmitting the encoded value to a decoder.

16. The device of claim 11, wherein the means for performing variable length coding comprises means for decoding one of the codewords using the data structure, the means for decoding comprising:
means for, in a top-down search of coding tree, selecting a first one of the subgroups with a base codeword that is less than or equal to the codeword to be decoded;
means for determining the position of the codeword to be decoded within the selected subgroup based on a difference between the codeword to be decoded and the base codeword for the selected subgroup;
means for determining the weight of the value represented by the codeword to be decoded based on the group in which the selected subgroup resides;
means for determining the position of the codeword within the group in which the selected subgroup resides based on whether the selected subgroup is the first subgroup or the second subgroup for the group;
means for selecting one of the values the weight of the value represented by the codeword to be decoded and the position of the codeword within the group in which the selected subgroup resides; and
means for decoding the codeword to be decoded with the selected value.

17. The device of claim 16, further comprising means for presenting output to a user based at least in part on the selected value.

18. The device of claim 10, wherein the values represented by the codewords represent at least one of video data, image data, speech data or audio data.

19. A tangible computer-readable medium comprising instructions to cause a processor to:
perform variable length coding according to a code structure, wherein the code structure defines:
groups of codewords in a coding tree, each of the groups includes codewords representing values having same weights and the codewords in each of the groups are ordered lexicographically with respect to the values represented by the codewords, and
first and second subgroups of codewords within each of the groups, wherein the first subgroup includes codewords having a first length and the second subgroup includes codewords having a second length different form the first length; and
generate a result of the variable length coding for at least one of storage in memory, transmission to a device, or presentation to a user.

20. The computer-readable medium of claim 19, further comprising instructions to cause the processor to:
access data structure that specifies base codewords for each of the subgroups, positions of codewords within each of the groups, a number of codewords within each of the first subgroups, and lengths of the codewords within each of the subgroups; and
perform the variable length coding using the data structure.

21. The computer-readable medium of claim 20, further comprising instructions to cause the processor to store the data structure in a memory associated with one of a video encoder, an image encoder, an audio encoder, a speech encoder, a video decoder, an image decoder, and audio decoder, or a speech decoder.

22. The computer-readable medium of claim 21, further comprising instructions to cause the processor to encode one of the values using the data structure to perform the variable length coding, wherein the instructions to cause the processor to:
select one of the groups based on the weight of the value to be encoded;
select one of the subgroups based on the lexicographic position of the value to be encoded relative to the number of codewords in the first subgroup of the selected group;
select one of the codewords in the selected subgroup based on the base codeword for the selected subgroup and the lexicographic position of the value to be encoded; and
encode the value to be encoded with the selected codeword.

23. The computer-readable medium of claim 22, further comprising instructions to cause the processor to control a transmitter to transmit the encoded value to a decoder.

24. The computer-readable medium of claim 21, further comprising instructions to cause the processor to decode one of the codewords using the data structure to perform the variable length coding, wherein the instructions to cause the processor to:
- in a top-down search of coding tree, select a first one of the subgroups with a base codeword that is less than or equal to the codeword to be decoded;
- determine the position of the codeword to be decoded within the selected subgroup based on a difference between the codeword to be decoded and the base codeword for the selected subgroup;
- determine the weight of the value represented by the codeword to be decoded based on the group in which the selected subgroup resides;
- determine the position of the codeword within the group in which the selected subgroup resides based on whether the selected subgroup is the first subgroup or the second subgroup for the group;
- select one of the values the weight of the value represented by the codeword to be decoded and the position of the codeword within the group in which the selected subgroup resides; and
- decode the codeword to be decoded with the selected value.

25. The computer-readable medium of claim 24, further comprising instructions to cause the processor to control an output device to present output to a user based at least in part on the selected value.

26. The computer-readable medium of claim 20, wherein each of the base codewords is a lexicographically smallest codeword within the respective subgroup.

27. The computer-readable medium of claim 19, wherein the values represented by the codewords represent at least one of video data, image data, speech data or audio data.

28. A device comprising:
- a processor configured to perform variable length coding according to a code structure, wherein the code structure defines:
  - groups of codewords in a coding tree, each of the groups includes codewords representing values having same weights and the codewords in each of the groups are ordered lexicographically with respect to the values represented by the codewords, and
  - first and second subgroups of codewords within each of the groups, wherein the first subgroup includes codewords having a first length and the second subgroup includes codewords having a second length different form the first length, and
- wherein the processor is configured to generate a result of the variable length coding for at least one of storage in memory, transmission to a device, or presentation to a user.

29. The device of claim 28, wherein the processor accesses a data structure that specifies base codewords for each of the subgroups, positions of codewords within each of the groups, a number of codewords within each of the first subgroups, and lengths of the codewords within each of the subgroups, and performs the variable length coding using the data structure.

30. The device of claim 29, wherein the data structure is stored in a memory associated with one of a video encoder, an image encoder, an audio encoder, a speech encoder, a video decoder, an image decoder, and audio decoder, or a speech decoder.

31. The device of claim 29, wherein each of the base codewords is a lexicographically smallest codeword within the respective subgroup.

32. The device of claim 29, wherein the processor encodes one of the values using the data structure to perform the variable length coding, and wherein the processor selects one of the groups based on the weight of the value to be encoded, selects one of the subgroups based on the lexicographic position of the value to be encoded relative to the number of codewords in the first subgroup of the selected group, selects one of the codewords in the selected subgroup based on the base codeword for the selected subgroup and the lexicographic position of the value to be encoded, and encodes the value to be encoded with the selected codeword.

33. The device of claim 32, further comprising a transmitter that transmits the encoded value to a decoder.

34. The device of claim 29, wherein the processor decodes one of the codewords using the data structure to perform the variable length coding, and wherein the processor, in a top-down search of coding tree, selects a first one of the subgroups with a base codeword that is less than or equal to the codeword to be decoded, determines the position of the codeword to be decoded within the selected subgroup based on a difference between the codeword to be decoded and the base codeword for the selected subgroup, determines the weight of the value represented by the codeword to be decoded based on the group in which the selected subgroup resides, determines the position of the codeword within the group in which the selected subgroup resides based on whether the selected subgroup is the first subgroup or the second subgroup for the group, selects one of the values the weight of the value represented by the codeword to be decoded and the position of the codeword within the group in which the selected subgroup resides, and decodes the codeword to be decoded with the selected value.

35. The device of claim 34, further comprising an output device that presents output to a user based at least in part on the selected value.

36. The device of claim 28, wherein the values represented by the codewords represent at least one of video data, image data, speech data or audio data.

37. A method comprising:
- for a code structure defining:
  - groups of codewords in a coding tree specifying variable length codewords, wherein each of the groups includes codewords representing values having same weights and the codewords in each of the groups are ordered lexicographically with respect to the values represented by the codewords, and
  - first and second subgroups of codewords within each of the groups, wherein the first subgroup includes codewords having a first length and the second subgroup includes codewords having a second length different form the first length,
- performing variable length coding using base codewords for each of the subgroups, positions of codewords within each of the groups, a number of codewords within each of the first subgroups, and lengths of the codewords within each of the subgroups; and
- generating a result of the variable length coding for at least one of storage in memory, transmission to a device, or presentation to a user.

38. The method of claim 37, wherein performing variable length coding comprises encoding at least some of the values, and the result of the variable length coding is one or more codewords.

39. The method of claim 38, wherein encoding comprises:
- selecting one of the groups based on the weight of the value to be encoded;

selecting one of the subgroups based on the lexicographic position of the value to be encoded relative to the number of codewords in the first subgroup of the selected group;

selecting one of the codewords in the selected subgroup based on the base codeword for the selected subgroup and the lexicographic position of the value to be encoded; and encoding the value to be encoded with the selected codeword.

40. The method of claim 37, wherein performing variable length coding comprises decoding at least some of the codewords, and the result of the variable length coding is one or more values.

41. The method of claim 40, wherein decoding comprises:

in a top-down search of coding tree, selecting a first one of the subgroups with a base codeword that is less than or equal to the codeword to be decoded;

determining the position of the codeword to be decoded within the selected subgroup based on a difference between the codeword to be decoded and the base codeword for the selected subgroup;

determining the weight of the value represented by the codeword to be decoded based on the group in which the selected subgroup resides;

determining the position of the codeword within the group in which the selected subgroup resides based on whether the selected subgroup is the first subgroup or the second subgroup for the group;

selecting one of the values the weight of the value represented by the codeword to be decoded and the position of the codeword within the group in which the selected subgroup resides; and decoding the codeword to be decoded with the selected value.

42. The method of claim 37, wherein each of the base codewords is a lexicographically smallest codeword within the respective subgroup.

43. The method of claim 37, wherein the values represented by the codewords represent at least one of video data, image data, speech data or audio data.

44. A device comprising:

for a code structure, means for defining:

groups of codewords in a coding tree specifying variable length codewords, wherein each of the groups includes codewords representing values having same weights and the codewords in each of the groups are ordered lexicographically with respect to the values represented by the codewords, and first and second subgroups of codewords within each of the groups, wherein the first subgroup includes codewords having a first length and the second subgroup includes codewords having a second length different form the first length;

means for performing variable length coding using base codewords for each of the subgroups, positions of codewords within each of the groups, a number of codewords within each of the first subgroups, and lengths of the codewords within each of the subgroups; and means for generating a result of the variable length coding for at least one of storage in memory, transmission to a device, or presentation to a user.

45. The device of claim 44, wherein the means for performing variable length coding comprises means for encoding at least some of the values, and the result of the variable length coding is one or more codewords.

46. The device of claim 45, wherein the means for encoding comprises:

means for selecting one of the groups based on the weight of the value to be encoded;

means for selecting one of the subgroups based on the lexicographic position of the value to be encoded relative to the number of codewords in the first subgroup of the selected group;

means for selecting one of the codewords in the selected subgroup based on the base codeword for the selected subgroup and the lexicographic position of the value to be encoded; and means for encoding the value to be encoded with the selected codeword.

47. The device of claim 44, wherein the means for performing variable length coding comprises means for decoding at least some of the codewords, and the result of the variable length coding is one or more values.

48. The device of claim 47, wherein the means for decoding comprises:

means for, in a top-down search of coding tree, selecting a first one of the subgroups with a base codeword that is less than or equal to the codeword to be decoded;

means for determining the position of the codeword to be decoded within the selected subgroup based on a difference between the codeword to be decoded and the base codeword for the selected subgroup;

means for determining the weight of the value represented by the codeword to be decoded based on the group in which the selected subgroup resides;

means for determining the position of the codeword within the group in which the selected subgroup resides based on whether the selected subgroup is the first subgroup or the second subgroup for the group;

means for selecting one of the values the weight of the value represented by the codeword to be decoded and the position of the codeword within the group in which the selected subgroup resides; and means for decoding the codeword to be decoded with the selected value.

49. The device of claim 44, wherein each of the base codewords is a lexicographically smallest codeword within the respective subgroup.

50. The device of claim 44, wherein the values represented by the codewords represent at least one of video data, image data, speech data or audio data.

51. A tangible computer-readable medium comprising instructions to cause a processor to:

for a code structure, define:

groups of codewords in a coding tree specifying variable length codewords, wherein each of the groups includes codewords representing values having same weights and the codewords in each of the groups are ordered lexicographically with respect to the values represented by the codewords, and first and second subgroups of codewords within each of the groups, wherein the first subgroup includes codewords having a first length and the second subgroup includes codewords having a second length different form the first length;

perform variable length coding using base codewords for each of the subgroups, positions of codewords within each of the groups, a number of codewords within each of the first subgroups, and lengths of the codewords within each of the subgroups; and generating a result of the variable length coding for at least one of storage in memory, transmission to a device, or presentation to a user.

52. The computer-readable medium of claim 51, wherein the instructions cause the processor to encode at least some of the values, and the result of the variable length coding is one or more codewords.

53. The computer-readable medium of claim 52, wherein the instructions cause the processor to:
- select one of the groups based on the weight of the value to be encoded;
- select one of the subgroups based on the lexicographic position of the value to be encoded relative to the number of codewords in the first subgroup of the selected group;
- select one of the codewords in the selected subgroup based on the base codeword for the selected subgroup and the lexicographic position of the value to be encoded; and
- encode the value to be encoded with the selected codeword.

54. The computer-readable medium of claim 51, wherein the instructions cause the processor to decode at least some of the codewords, and the result of the variable length coding is one or more values.

55. The computer-readable medium of claim 54, wherein the instructions cause the processor to:
- in a top-down search of coding tree, select a first one of the subgroups with a base codeword that is less than or equal to the codeword to be decoded;
- determine the position of the codeword to be decoded within the selected subgroup based on a difference between the codeword to be decoded and the base codeword for the selected subgroup;
- determine the weight of the value represented by the codeword to be decoded based on the group in which the selected subgroup resides;
- determine the position of the codeword within the group in which the selected subgroup resides based on whether the selected subgroup is the first subgroup or the second subgroup for the group;
- select one of the values the weight of the value represented by the codeword to be decoded and the position of the codeword within the group in which the selected subgroup resides; and
- decode the codeword to be decoded with the selected value.

56. The computer-readable medium of claim 51, wherein each of the base codewords is a lexicographically smallest codeword within the respective subgroup.

57. The computer-readable medium of claim 51, wherein the values represented by the codewords represent at least one of video data, image data, speech data or audio data.

58. A device comprising:
- for a code structure defining:
  - groups of codewords in a coding tree specifying variable length codewords, wherein each of the groups includes codewords representing values having same weights and the codewords in each of the groups are ordered lexicographically with respect to the values represented by the codewords, and
  - first and second subgroups of codewords within each of the groups, wherein the first subgroup includes codewords having a first length and the second subgroup includes codewords having a second length different form the first length;
- a processor configured to perform variable length coding using base codewords for each of the subgroups, positions of codewords within each of the groups, a number of codewords within each of the first subgroups, and lengths of the codewords within each of the subgroups, and generate a result of the variable length coding for at least one of storage in memory, transmission to a device, or presentation to a user.

59. The device of claim 58, wherein the processor encodes at least some of the values, and the result of the variable length coding is one or more codewords.

60. The device of claim 59, wherein the processor selects one of the groups based on the weight of the value to be encoded, selects one of the subgroups based on the lexicographic position of the value to be encoded relative to the number of codewords in the first subgroup of the selected group, selects one of the codewords in the selected subgroup based on the base codeword for the selected subgroup and the lexicographic position of the value to be encoded, and encodes the value to be encoded with the selected codeword.

61. The device of claim 58, wherein the processor decodes at least some of the codewords, and the result of the variable length coding is one or more values.

62. The device of claim 61, wherein the processor, in a top-down search of coding tree, selects a first one of the subgroups with a base codeword that is less than or equal to the codeword to be decoded, determines the position of the codeword to be decoded within the selected subgroup based on a difference between the codeword to be decoded and the base codeword for the selected subgroup, determines the weight of the value represented by the codeword to be decoded based on the group in which the selected subgroup resides, determines the position of the codeword within the group in which the selected subgroup resides based on whether the selected subgroup is the first subgroup or the second subgroup for the group, selects one of the values the weight of the value represented by the codeword to be decoded and the position of the codeword within the group in which the selected subgroup resides, and decodes the codeword to be decoded with the selected value.

63. The device of claim 58, wherein each of the base codewords is a lexicographically smallest codeword within the respective subgroup.

64. The device of claim 58, wherein the values represented by the codewords represent at least one of video data, image data, speech data or audio data.

65. A tangible computer-readable medium comprising a data structure for variable length coding using a variable length code structure that defines:
- groups of codewords in a coding tree, each of the groups includes codewords representing values having same weights and the codewords in each of the groups are ordered lexicographically with respect to the values represented by the codewords, and
- first and second subgroups of codewords within each of the groups, wherein the first subgroup includes codewords having a first length and the second subgroup includes codewords having a second length different form the first length.

66. The computer-readable medium of claim 65, wherein the data structure specifies base codewords for each of the subgroups, positions of codewords within each of the groups, a number of codewords within each of the first subgroups, and lengths of the codewords within each of the subgroups.

67. A wireless communication device handset comprising:
- a processor configured to perform variable length coding according to a code structure, wherein the code structure defines:
  - groups of codewords in a coding tree, each of the groups includes codewords representing values having same weights and the codewords in each of the groups are ordered lexicographically with respect to the values represented by the codewords, and
  - first and second subgroups of codewords within each of the groups, wherein the first subgroup includes codewords having a first length and the second subgroup includes codewords having a second length different form the first length, and wherein the processor is configured to generate a result of the variable length coding for at least one of storage in memory, transmission to a device, or presentation to a user.

68. The handset of claim 67, wherein the processor accesses a data structure that specifies base codewords for each of the subgroups, positions of codewords within each of the groups, a number of codewords within each of the first subgroups, and lengths of the codewords within each of the subgroups, and performs the variable length coding using the data structure.

69. The handset of claim 68, further comprising a memory, wherein the data structure is stored in the memory, and the memory is associated with one of a video encoder, an image encoder, an audio encoder, a speech encoder, a video decoder, an image decoder, and audio decoder, or a speech decoder in the handset.

70. The handset of claim 68, wherein each of the base codewords is a lexicographically smallest codeword within the respective subgroup.

71. The handset of claim 68, wherein the processor encodes one of the values using the data structure to perform the variable length coding, and wherein the processor selects one of the groups based on the weight of the value to be encoded, selects one of the subgroups based on the lexicographic position of the value to be encoded relative to the number of codewords in the first subgroup of the selected group, selects one of the codewords in the selected subgroup based on the base codeword for the selected subgroup and the lexicographic position of the value to be encoded, and encodes the value to be encoded with the selected codeword.

72. The handset of claim 71, further comprising a wireless transmitter that transmits the encoded value to a decoder.

73. The handset of claim 68, wherein the processor decodes one of the codewords using the data structure to perform the variable length coding, and wherein the processor, in a top-down search of coding tree, selects a first one of the subgroups with a base codeword that is less than or equal to the codeword to be decoded, determines the position of the codeword to be decoded within the selected subgroup based on a difference between the codeword to be decoded and the base codeword for the selected subgroup, determines the weight of the value represented by the codeword to be decoded based on the group in which the selected subgroup resides, determines the position of the codeword within the group in which the selected subgroup resides based on whether the selected subgroup is the first subgroup or the second subgroup for the group, selects one of the values the weight of the value represented by the codeword to be decoded and the position of the codeword within the group in which the selected subgroup resides, and decodes the codeword to be decoded with the selected value.

74. The handset of claim 73, further comprising an output device that presents output to a user based at least in part on the selected value.

75. The handset of claim 67, wherein the values represented by the codewords represent at least one of video data, image data, speech data or audio data.

76. An integrated circuit device comprising:
a processor configured to perform variable length coding according to a code structure, wherein the code structure defines:

groups of codewords in a coding tree, each of the groups includes codewords representing values having same weights and the codewords in each of the groups are ordered lexicographically with respect to the values represented by the codewords, and first and second subgroups of codewords within each of the groups, wherein the first subgroup includes codewords having a first length and the second subgroup includes codewords having a second length different form the first length, and wherein the processor is configured to generate a result of the variable length coding for at least one of storage in memory, transmission to a device, or presentation to a user.

77. The device of claim 76, wherein the processor accesses a data structure that specifies base codewords for each of the subgroups, positions of codewords within each of the groups, a number of codewords within each of the first subgroups, and lengths of the codewords within each of the subgroups, and performs the variable length coding using the data structure.

78. The device of claim 77, further comprising a memory, wherein the data structure is stored in the memory, and the memory is associated with one of a video encoder, an image encoder, an audio encoder, a speech encoder, a video decoder, an image decoder, and audio decoder, or a speech decoder in the handset.

79. The device of claim 77, wherein each of the base codewords is a lexicographically smallest codeword within the respective subgroup.

80. The device of claim 77, wherein the processor encodes one of the values using the data structure to perform the variable length coding, and wherein the processor selects one of the groups based on the weight of the value to be encoded, selects one of the subgroups based on the lexicographic position of the value to be encoded relative to the number of codewords in the first subgroup of the selected group, selects one of the codewords in the selected subgroup based on the base codeword for the selected subgroup and the lexicographic position of the value to be encoded, and encodes the value to be encoded with the selected codeword.

81. The device of claim 77, wherein the processor decodes one of the codewords using the data structure to perform the variable length coding, and wherein the processor, in a top-down search of coding tree, selects a first one of the subgroups with a base codeword that is less than or equal to the codeword to be decoded, determines the position of the codeword to be decoded within the selected subgroup based on a difference between the codeword to be decoded and the base codeword for the selected subgroup, determines the weight of the value represented by the codeword to be decoded based on the group in which the selected subgroup resides, determines the position of the codeword within the group in which the selected subgroup resides based on whether the selected subgroup is the first subgroup or the second subgroup for the group, selects one of the values the weight of the value represented by the codeword to be decoded and the position of the codeword within the group in which the selected subgroup resides, and decodes the codeword to be decoded with the selected value.

82. The device of claim 76, wherein the values represented by the codewords represent at least one of video data, image data, speech data or audio data.

* * * * *

UNITED STATES PATENT AND TRADEMARK OFFICE
CERTIFICATE OF CORRECTION

PATENT NO.         : 7,573,407 B2
APPLICATION NO.    : 11/840406
DATED              : August 11, 2009
INVENTOR(S)        : Reznik Page 1 of 1

It is certified that error appears in the above-identified patent and that said Letters Patent is hereby corrected as shown below:

Column 52, line 8, claim 1: "different form" to read as --different from--

Column 52, line 24, claim 3: "and audio" to read as --an audio--

Column 53, line 18, claim 10: "different form" to read as --different from--

Column 53, line 34, claim 12: "and audio" to read as --an audio--

Column 54, line 33, claim 19: "different form" to read as --different from--

Column 54, line 49, claim 21: "and audio" to read as --an audio--

Column 55, line 48, claim 28: "different form" to read as --different from--

Column 55, line 62, claim 29: "and audio" to read as --an audio--

Column 56, line 51, claim 37: "different form" to read as --different from--

Column 57, line 53, claim 44: "different form" to read as --different from--

Column 58, line 59, claim 51: "different form" to read as --different from--

Column 59, line 59, claim 58: "different form" to read as --different from--

Column 60, line 50, claim 65: "different form" to read as --different from--

Column 61, line 3, claim 67: "different form" to read as --different from--

Column 61, line 19, claim 69: "and audio" to read as --an audio--

Column 62, line 10, claim 78: "different form" to read as --different from--

Column 62, line 25, claim 78: "and audio" to read as --an audio--

Signed and Sealed this
Twelfth Day of July, 2011

David J. Kappos
*Director of the United States Patent and Trademark Office*